(12) United States Patent
Kudo et al.

(10) Patent No.: US 7,863,753 B2
(45) Date of Patent: Jan. 4, 2011

(54) SEMICONDUCTOR DEVICE AND MANUFACTURING METHOD THEREOF

(75) Inventors: Chiaki Kudo, Hyogo (JP); Hisashi Ogawa, Osaka (JP)

(73) Assignee: Panasonic Corporation, Osaka (JP)

( * ) Notice: Subject to any disclaimer, the term of this patent is extended or adjusted under 35 U.S.C. 154(b) by 16 days.

(21) Appl. No.: 11/896,997

(22) Filed: Sep. 7, 2007

(65) Prior Publication Data
US 2008/0067611 A1    Mar. 20, 2008

(30) Foreign Application Priority Data
Sep. 20, 2006   (JP)   ............... 2006-254239

(51) Int. Cl.
*H01L 29/41*   (2006.01)
(52) U.S. Cl. ............. 257/775; 257/202; 257/288; 257/773; 257/E27.062
(58) Field of Classification Search ............... 257/374, 257/E27.062, 202, 288, 773, 775
See application file for complete search history.

(56) References Cited

U.S. PATENT DOCUMENTS

| | | | |
|---|---|---|---|
| 5,911,111 | A | 6/1999 | Bohr et al. |
| 2003/0036236 | A1 | 2/2003 | Benedetto et al. |
| 2003/0075766 | A1* | 4/2003 | Lin et al. ............... 257/407 |
| 2004/0042272 | A1* | 3/2004 | Kurata ............... 365/185.33 |
| 2004/0048483 | A1 | 3/2004 | Lee et al. |
| 2004/0159949 | A1 | 8/2004 | Nii |
| 2006/0202301 | A1* | 9/2006 | Ohta et al. ............... 257/510 |
| 2007/0069312 | A1* | 3/2007 | Satou et al. ............... 257/412 |

FOREIGN PATENT DOCUMENTS

| | | |
|---|---|---|
| FR | 2839203 | 10/2003 |
| JP | 2004-93705 | 3/2004 |
| JP | 2005-114843 | 4/2005 |
| WO | WO 01/99174 A2 | 12/2001 |

OTHER PUBLICATIONS

Extended European Search Report issued in European Patent Application No. EP 07116351.3-1235/1903611, dated Mar. 26, 2009.
Shuo-Yen Chou et al., "Study of Mask Corner Rounding Effects on Lithographic Patterning for 90-nm Technology Node and Beyond," Proceedings of SPIE vol. 5446, 2004, pp. 508-515.

* cited by examiner

*Primary Examiner*—Davienne Monbleau
*Assistant Examiner*—Eduardo A Rodela
(74) *Attorney, Agent, or Firm*—McDermott Will & Emery LLP

(57) ABSTRACT

A semiconductor device includes: an isolation region formed in a semiconductor substrate; an active region surrounded by the isolation region; and a first gate electrode formed on the isolation region and the active region and including a first region on the isolation region. The first region has a pattern width in a gate length direction larger than a pattern width of the first gate electrode on the active region. The first region includes a part having a film thickness different from a film thickness of the first gate electrode on the active region.

20 Claims, 36 Drawing Sheets

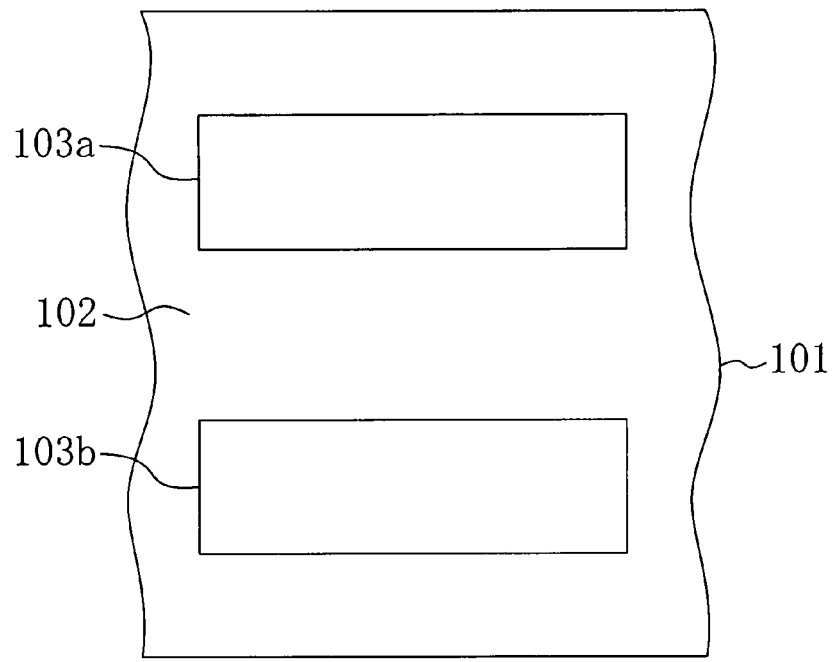
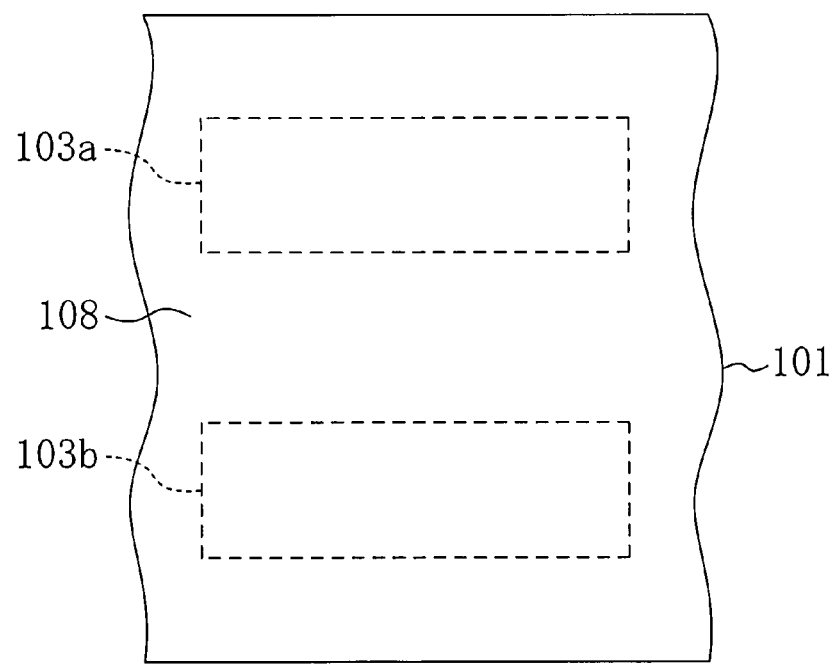

SEMICONDUCTOR DEVICE AND MANUFACTURING METHOD THEREOF

BACKGROUND OF THE INVENTION

1. Field of the Invention

The present invention relates to semiconductor devices and manufacturing methods thereof.

2. Background Art

In transistors having a MIS (Metal Insulator Semiconductor) structure, miniaturization of gate electrodes has been progressing. In contrast, in order to prevent an increase in contact resistance which is accompanied by reduction in contact area caused in association with misalignment between the gate electrodes and the contact holes, gate contact regions of the gate electrodes in which contacts for the gate electrodes are formed should be formed larger than regions of the gate electrodes which are located on the active region.

FIG. 35 shows a part of a general transistor layout.

As shown in FIG. 35, an isolation region 12 and active regions 13 surrounded by the isolation region 12 are formed in a semiconductor substrate 11, wherein source/drain regions 14 are formed in the upper parts of each active region 13 in general. Gate electrodes 15 are formed across the isolation region 12 and the active regions 13 and include a gate contact region 17 or a wiring region 18. A contact 16 passing through an interlayer insulating film (not shown) is formed in each predetermined region of the source/drain regions 14 and the gate electrodes 15. The line width of the gate electrodes 15 is larger in the gate contact region 17 and the wiring region 18 than on the active region 14. In other words, as shown in FIG. 35, the gate electrodes 15 have forms having line widths changing so as to form rectangular parts in the vicinity of the active regions 13 on the isolation region 12.

Description will be given below to a corner rounding phenomenon caused due to the aforementioned change in line width of the gate electrodes 15 and problems involved by this phenomenon.

In general, the gate electrodes are formed in such a manner that coherent light is irradiated to a photosensitive material called a resist above a semiconductor substrate through a photomask made of a mask-patterned shielding material on a glass substrate so that diffracted light passing through the photomask is one-to-one projected or reduction-projected through a projection lens.

Since transfer of the mask pattern to the resist utilizes optical characteristics of the projected light, the resultant resist pattern deforms and the optical image curves in the vicinity of a part where the line width changes in the presence of interference of the projected diffracted light, as shown in FIG. 36A. Thus, a generally called corner rounding phenomenon occurs in which the rectangle shape of the resist pattern contour 20 is degraded at parts of the mask pattern which correspond to the rectangular parts of the gate electrodes 15 in the vicinity of the active regions 13. The resist pattern contour 20 forms a line width L2 of a part in the vicinity of the boundary between the active region 13 and the gate contact region 17 which is larger than a line width L1 of the other part on the active region 13, as shown in FIG. 36A. As well, the resist pattern contour 20 forms a line width L4 of a part in the vicinity of the boundary between the active region 13 and the wiring region 18 which is larger than a line width L3 of the other part on the active region 13. Accordingly, the gate electrodes 15 formed along the resist pattern contour 20 have line widths (L2 and L4) in the vicinities of the gate contact region 17 and the wiring region 18 on the active regions 13 and line widths (L1 and L3), which are smaller than the line widths (L2, L4), in the other part of the gate electrodes 15 on the active regions 13. This degrades the transistor characteristics to lower the driving power, thereby causing deficiency in circuit operation.

Further, as shown in FIG. 36B, in the case where gate electrodes 5 having the gate contact regions 17, for example, are adjacent to each other, interference of the projected diffracted light lowers the light intensity to cause shortage of resist resolution, so that the adjacent gate electrodes 15 formed are in contact with each other to be short-circuited.

In order to solve the above problems, various methods may be considered, such as a method in which the rectangular parts of the gate contact region and the like or a region having a line width different from the active regions 13 are arranged far away from the active regions 13, a method in which adjacent gate contact regions 17 are arranged apart from each other, and the like. These methods, however, invite an increase in chip area, and therefore, another method called OPC (Optical Proximity Effect Correction) has been proposed in which the mask pattern is corrected. Specifically, light interference is estimated in advance, and the mask pattern is corrected by adding or subtracting a part of the transferred optical image where the interference deforms to or from the mask pattern for the purpose of increasing transfer proximity of the mask pattern (see Japanese Patent Application Laid Open Publication No. 2004-93705 and Japanese Patent Application Laid Open Publication No. 2005-114843, for example).

The conventional OPC, however, makes the mask pattern to be complicated, thereby inviting an increase in calculation time period and difficulty in testing the mask pattern. Also, the conventional OPC requires an additional pattern called serif to the mask pattern for the gate contact region and the wiring region for the purpose of obtaining sharp rectangle shapes at the rectangular parts while at the same time requiring decrease in area of the mask pattern for the gate contact region and the wiring region for the purpose of sufficient separation of the gate contact region and the wiring region. It is difficult to satisfy both the requirements.

SUMMARY OF THE INVENTION

In view of the foregoing, the present invention has its object of providing a semiconductor device having a structure capable of suppressing the corner rounding phenomenon of gate electrodes without employing the conventional OPC and a manufacturing method thereof.

A semiconductor device in accordance with one aspect of the present invention includes: an isolation region formed in a semiconductor substrate; an active region surrounded by the isolation region; and a first gate electrode formed on the isolation region and the active region and including a first region on the isolation region, the first region having a pattern width in a gate length direction larger than a pattern width of the first gate electrode on the active region, and the first region including a part having a film thickness different from a film thickness of the first gate electrode on the active region.

In the semiconductor device in accordance with the above aspect of the present invention, the first region of the first gate electrode may be a gate contact region or a wiring region.

In the semiconductor device in accordance with the above aspect of the present invention, the first region of the first gate electrode may include a rectangular part having a rectangular shape in plane in the vicinity of the active region.

In the semiconductor device in accordance with the above aspect of the present invention, the first region of the first gate electrode may include a part having a film thickness smaller than the film thickness of the first gate electrode on the active region.

In the semiconductor device in accordance with the above aspect of the present invention, the first region of the first gate electrode may include a part having a film thickness larger than the film thickness of the first gate electrode on the active region.

The semiconductor device in accordance with the above aspect of the present invention may further include: a second gate electrode formed beside the first gate electrode on the isolation region and the active region and including a second region on the isolation region, the second region having a pattern width in the gate length direction larger than a pattern width of the second gate electrode on the active region, wherein the first gate electrode on the active region has a film thickness different from the second gate electrode on the active region.

In the semiconductor device in accordance with the above aspect of the present invention, the second region of the second electrode may include, in the vicinity of the active region, a rectangular part in a rectangular shape in plane.

In the semiconductor device in accordance with the above aspect of the present invention, the first region of the first gate electrode may include a part having a film thickness smaller than the film thickness of the first gate electrode on the active region, and the second region of the second gate electrode may include a part having a film thickness larger than the film thickness of the second gate electrode on the active region.

In the semiconductor device in accordance with the above aspect of the present invention, the second region of the second electrode may include a rectangular part having a rectangular shape in plane in the vicinity of the active region.

In the semiconductor device in accordance with the above aspect of the present invention may further include: a gate insulating film formed between the first gate electrode on the active region and the active region; and first source/drain regions formed on respective sides of the first gate electrode in the active region.

In the semiconductor device in accordance with the above aspect of the present invention may further include: a sidewall formed on each side face of the first gate electrode; and second source/drain regions formed on an outer side of the sidewall in the active region.

A semiconductor device manufacturing method in accordance with one aspect of the present invention includes the steps of: (a) forming, in a semiconductor substrate, an isolation region and an active region surrounded by the isolation region; (b) forming a gate electrode formation film on the isolation region and the active region; (c) forming a first mask part having a substantially linear contour across the isolation region and the active region on the gate electrode formation film; (d) forming a second mask part on the gate electrode formation region on the isolation region; and (e) forming, after the step (c) and the step (d), a first gate electrode including, on the isolation region, a first region having a pattern width in a gate length direction larger than a pattern width of the first gate electrode on the active region by etching the gate electrode formation film with the use of the first mask part and the second mask part, wherein the first mask part has a pattern different from the second mask part, and the first mask part and the second mask part are overlapped with each other partially.

In the semiconductor device manufacturing method in accordance with the above aspect of the present invention, the step (c) may include steps of: (c1) forming a mask film on the gate electrode formation film; (c2) forming, on the mask film, a substantially linear first resist pattern across the isolation region and the active region; (c3) etching at least the mask film with the use of the first resist pattern as a mask to form the first mask part including the thus patterned mask film; and (c4) removing the first resist pattern after the step (c3), wherein the step (d) is performed after the step (c) and includes a step of forming the second mask part on the gate electrode formation film on the isolation region, the second mask part being formed of a second resist pattern that covers the first region and at least a part of the first mask part, and in the step (e), the first gate electrode is formed by etching the gate electrode formation film with the use of the first mask part including the mask film and the second mask part formed of the second resist pattern as a mask.

In the semiconductor device manufacturing method in accordance with the above aspect of the present invention, the step (c) may include steps of: (c5) forming, on the gate electrode formation film, a substantially linear first resist pattern across the isolation region and the active region; (c6) forming the first mask part formed of the gate electrode formation film by etching an upper part of the gate electrode formation film with the use of the first resist pattern as a mask; and (c7) removing the first resist pattern after the step (c6), wherein the step (d) is performed after the step (c) and includes a step of forming the second mask part on the gate electrode formation film on the isolation region, the second mask part being formed of at least a part of the first mask part and a second resist pattern that covers the first region, and in the step (e), the first gate electrode is formed by etching the gate electrode formation film with the use of the first mask part formed of the gate electrode formation film and the second mask part formed of the second resist pattern as a mask.

In the semiconductor device manufacturing method in accordance with the above aspect of the present invention, the step (d) may include steps of: (d1) forming a mask on the gate electrode formation film; (d2) forming, on the mask film on the isolation region, a first resist pattern that covers the first region; (d3) etching at least the mask film with the use of the first resist pattern as a mask to form the second mask part including the thus patterned mask film; and (d4) removing the first resist pattern after the step (d3), wherein the step (c) is performed after the step (d) and includes a step of forming the first mask part on the gate electrode formation film, the first mask part covering a part of the second mask part and being formed of a substantially linear second resist pattern across the isolation region and the active region, and in the step (e), the first gate electrode is formed by etching the gate electrode formation film with the use of the first mask part formed of the second resist pattern and the second mask part including the mask film.

In the semiconductor device manufacturing method in accordance with the above aspect of the present invention, the step (d) may include steps of: (d5) forming, on the gate electrode formation region on the isolation region, a first resist pattern that covers the first region; (d6) forming the second mask part formed of the gate electrode formation film by etching at least an upper part of the gate electrode formation film with the use of the first resist pattern as a mask; and (d7) removing the first resist pattern after the step (d6), wherein the step (c) is performed after the step (d) and includes a step of forming the first mask part on the gate electrode formation film, the first mask part covering a part of the second mask part and being formed of a substantially linear second resist pattern across the isolation region and the active region, and in the step (e), the first gate electrode is formed by etching the gate electrode formation film with the use of the first mask part formed of the second resist pattern and the second mask part formed of the gate electrode formation film.

In the semiconductor device manufacturing method in accordance with the above aspect of the present invention, the step (c) may include a step of forming, together with the first mask part, a third mask part of the gate electrode formation film on the isolation region, wherein the step (d) includes a step of forming, together with the second mask part, a substantially linear fourth mask part across the isolation region and the active region on the gate electrode formation film, the step (e) includes a step of forming, together with the first gate electrode, a second gate electrode on the isolation region by etching the gate electrode formation film with the use of the third mask part and the fourth mask part as a mask, the second gate electrode includes a second region of which pattern width in the gate length direction is larger than a pattern width of the second electrode on the active region, the third mask has a mask pattern different from the fourth mask part, and the third mask part and the fourth mask part are overlapped with each other partially.

In the semiconductor device manufacturing method in accordance with the above aspect of the present invention, the step (c) may include steps of: (c8) forming a first mask film and a second mask film sequentially on the gate electrode formation film; (c9) forming a substantially linear first resist pattern across the isolation region and the active region on the second mask film; (c10) etching at least the second mask with the use of the first resist pattern as a mask to form the first mask part including the thus patterned second mask film; and (c11) removing the first resist pattern after step (c11), wherein the step (d) is performed after the step (c) and includes the steps of: (d8) forming a second resist pattern on the first mask film on the isolation region so as to cover the first region and at least a part of the first mask part; (d9) etching the first mask film with the use of the second resist pattern and the second mask film formed of the first mask part as a mask to form the second mask part formed of the thus patterned first mask film; and (d10) removing the second resist pattern after the step (d9), and in the step (e), the first gate electrode is formed by etching the gate electrode formation film with the use of the first mask part including the second mask film and the second mask part formed of the first mask film as a mask.

In the semiconductor device manufacturing method in accordance with the above aspect of the present invention, the step (d) may include steps of: (d11) forming a first mask film and a second mask film sequentially on the gate electrode formation film; (d12) forming a first resist pattern on the second mask film on the isolation region so as to cover the first region; (d13) etching at least the second mask film with the use of the first resist pattern as a mask to form the second mask part including the thus patterned second mask film; and (d14) removing the first resist pattern after the step (d13), wherein the step (c) is performed after the step (d) and includes steps of: (c12) forming a substantially linear second resist pattern across the isolation region and the active region on the first mask film so as to cover a part of the second mask part; (c13) etching the first mask film with the use of the second resist pattern and the second mask film formed of the second mask part as a mask to form the first mask part formed of the thus patterned first mask film; and (c14) removing the second resist pattern after the step (c13), and in the step (e), the first gate electrode is formed by etching the gate electrode formation film with the use of the first mask part formed of the first mask film and the second mask part including the second mask film.

As described above, according to the respective aspects of the present invention, semiconductor devices and semiconductor device manufacturing methods can be attained in which the corner rounding phenomenon, which is caused due to change in line width of a mask pattern, can be suppressed and increases in contact resistance and in wiring resistance can be also suppressed.

Further, in the semiconductor devices and the semiconductor device manufacturing methods in accordance with the present invention, substantially linear patterns are layouted for forming the gate electrodes on the active region and the isolation region, thereby suppressing the corner rounding phenomenon of the resist pattern used for patterning the gate electrodes. Hence, the gate contact region and the wiring region can be arranged close to the active region.

BRIEF DESCRIPTION OF THE DRAWINGS

FIG. 3B is a sectional view taken along the line IIIb-IIIb in FIG. 3A.

FIG. 21A and FIG. 21B are plan views showing a semiconductor device manufacturing method in accordance with Embodiment 3 of the present invention.

DESCRIPTION OF THE PREFERRED EMBODIMENTS

Embodiment 1

A semiconductor device in accordance with Embodiment 1 of the present invention will be described below with reference to the accompanying drawings.

Figure 1A:
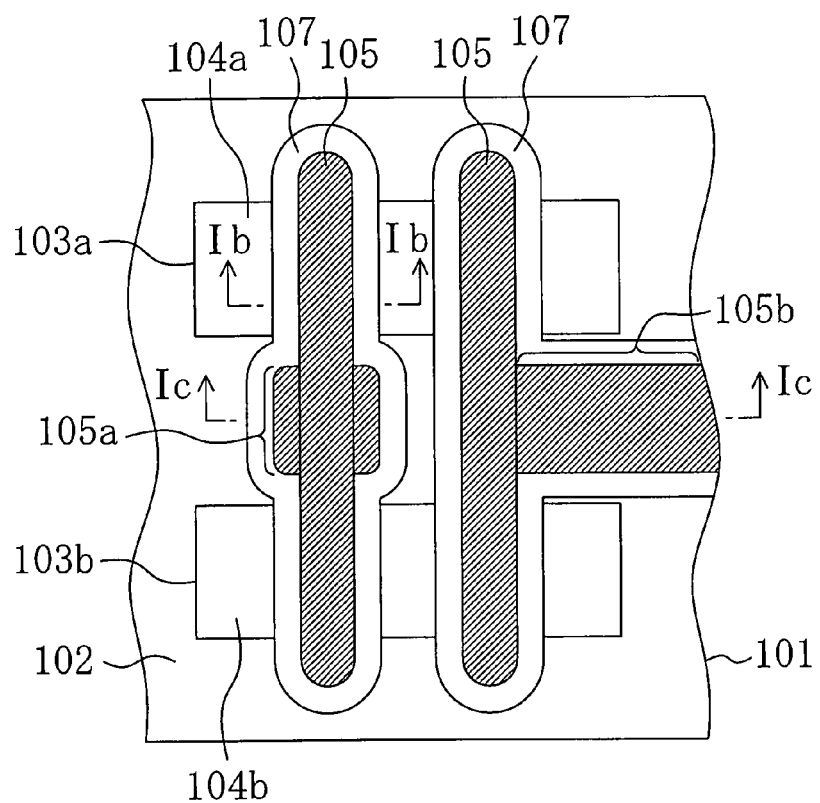
FIG. 1A is a plan view showing a structure of a semiconductor device in accordance with Embodiment 1 of the present invention.
Figure 1B:
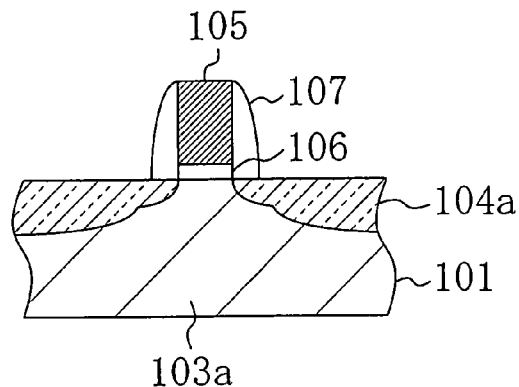
FIG. 1B is a sectional view taken along the line Ib-Ib in FIG. 1A.
Figure 1C:
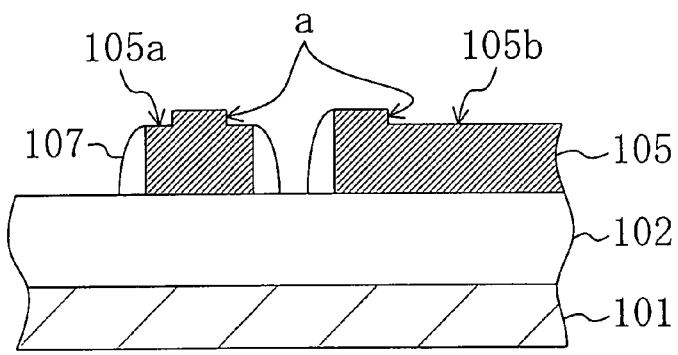
FIG. 1C is a sectional view taken along the line Ic-Ic in FIG. 1A.

FIG. 1A to FIG. 1C show a structure of the semiconductor device in accordance with Embodiment 1 of the present invention, wherein FIG. 1A is a plan view, FIG. 1B is a sectional view taken along the line Ib-Ib in FIG. 1A, and FIG. 1C is a sectional view taken along the line Ic-Ic in FIG. 1A. The present embodiment describes the case where an n-type MIS transistor is formed in an active region 103a while a p-type MIS transistor is formed in an active region 103b.

In a semiconductor substrate 101 made of, for example, silicon, as shown in FIG. 1A, there are formed an isolation region 102, the active region 103a including a p well (not shown) and surrounded by the isolation region 102, and the active region 103b including an n well (not shown) and surrounded by the isolation region 102. Further, n-type source/drain regions 104a are formed in the upper parts of the active region 103a while p-type source/drain regions 104b are formed in the upper parts of the active region 103b. Gate electrodes 105 are formed across the active region 103a and the active region 103b in the gate width direction with the isolation region 102 interposed on the semiconductor substrate 101. Each gate electrode 105 is formed of a layered film of polysilicon or metal silicide and polysilicon, a silicide film, a metal film, or the like, for example. The gate electrodes 105 include a gate contact region 105a to serve as a lead part or a wiring region 105b to serve as a lead part. A sidewall 107 made of, for example, a silicon nitride film is continuously formed on each side face of each gate electrode 105. Each n-type source/drain region 104a is composed of an n-type source/drain diffusion layer (an n-type extension region or an n-type LDD region) having a comparatively shallow junction and formed on each side of each gate electrode 105 in the active region 103a and an n-type source/drain diffusion region having a comparatively deep junction and formed on the outer side of each sidewall 107 in the active region 103a. As well, each p-type source/drain region 104b is composed of a p-type source/drain diffusion layer (a p-type extension region or a p-type LDD region) having a comparatively shallow junction and formed on each side of each gate electrode 105 in the active region 103b and a p-type source/drain diffusion region having a comparatively deep junction and formed on the outer side of each sidewall 107 in the active region 103b. The sidewall 107 may be formed of a layered film of, for example, a silicon oxide film and a silicon nitride film.

As shown in FIG. 1B, the gate electrodes 105 are formed on the active region 103a formed in the semiconductor substrate 101 with a gate insulating film 106 made of, for example, SiON interposed, and the sidewall 107 is formed on each side face of the gate electrodes 105. In the upper parts of the active region 103a, there are formed the n-type source/drain regions 104a composed of the n-type source/drain diffusion regions having the comparatively shallow junctions and the n-type source/drain diffusion regions having the comparatively deep junctions. Though the sectional structure of the active region 103b is not shown herein, there are formed therein the gate insulating film 106 the gate electrodes 105 and the p-type source/drain regions 104b composed of the p-type source/drain diffusion regions having the comparatively shallow junctions and the p-type source/drain diffusion regions having the comparatively deep junctions, similarly to FIG. 1B.

Referring to FIG. 1C, the isolation region 102 is formed in the upper part of the semiconductor substrate 101. On the isolation region 102, the gate electrodes 105 including the gate contact region 105a or the wiring region 105b are formed with the sidewall 107 formed on each side face thereof.

Each gate electrode 105 in the present embodiment includes a step part a above the isolation region 102. Specifically, each of the gate contact region 105a and the wiring region 105b of the gate electrodes 105 has a part having a thickness smaller than that of the gate electrodes 105 on the active regions 103a, 103b.

With the gate electrodes 105 having the above described structures, the corner rounding phenomenon of the gate electrodes 105 can be suppressed. This allows the gate contact region 105a and the wiring region 105b to be arranged close to the active regions 103a, 103b with variation in transistor characteristics prevented and allows adjacent gate electrodes to be arranged close to each other with short-circuit of the gate electrodes 105, which is caused due to increased width of the gate contact region 105a, suppressed. Hence, higher integration is enabled.

A method for manufacturing the semiconductor device in accordance with Embodiment 1 of the present invention will be described below.

FIG. 2A, FIG. 2B, FIG. 3A to FIG. 3C, FIG. 4A to FIG. 4C, FIG. 5, and FIG. 6A to FIG. 6C are views for explaining the semiconductor device manufacturing method in accordance with Embodiment 1 of the present invention, wherein FIG. 2A, FIG. 2B, FIG. 3A, FIG. 4A, FIG. 5 and FIG. 6A are plan views while FIG. 3B, FIG. 3C, FIG. 4B, FIG. 4C, FIG. 6B, and FIG. 6C are sectional views.

Figure 2A:
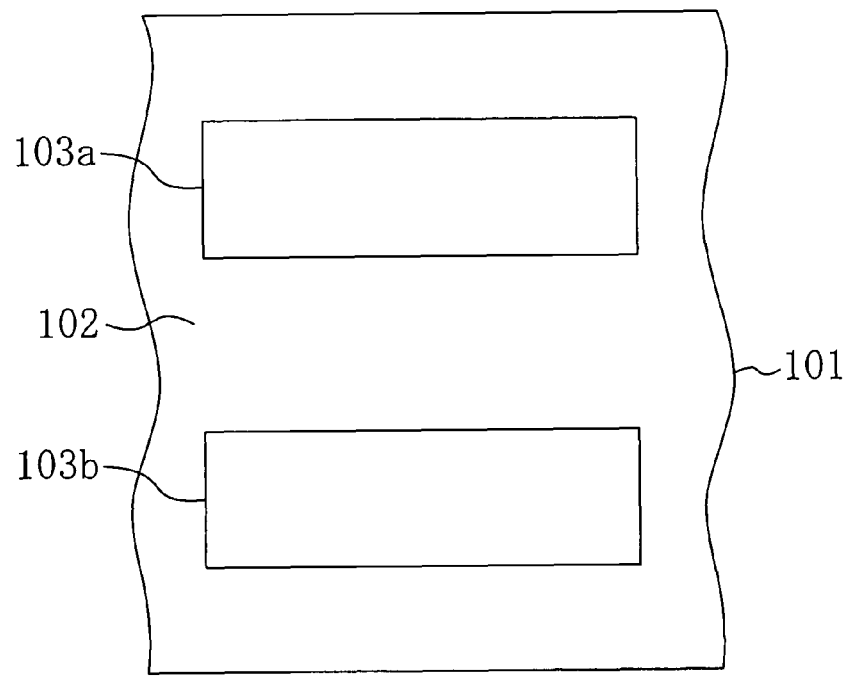
FIG. 2A and FIG. 2B are plan views showing a semiconductor device manufacturing method in accordance with Embodiment 1 of the present invention.

First, as shown in FIG. 2A, the isolation region 102 is selectively formed in the semiconductor substrate 101 made of, for example, silicon by STI (Shallow Trench Isolation) or the like. Then, ion implantation is performed to form the p well (not shown) and the n well (not shown) in the semiconductor substrate 101. This forms the active region 103a including the p well and the active region 103b including the n well which are surrounded by the isolation region 102.

Figure 2B:
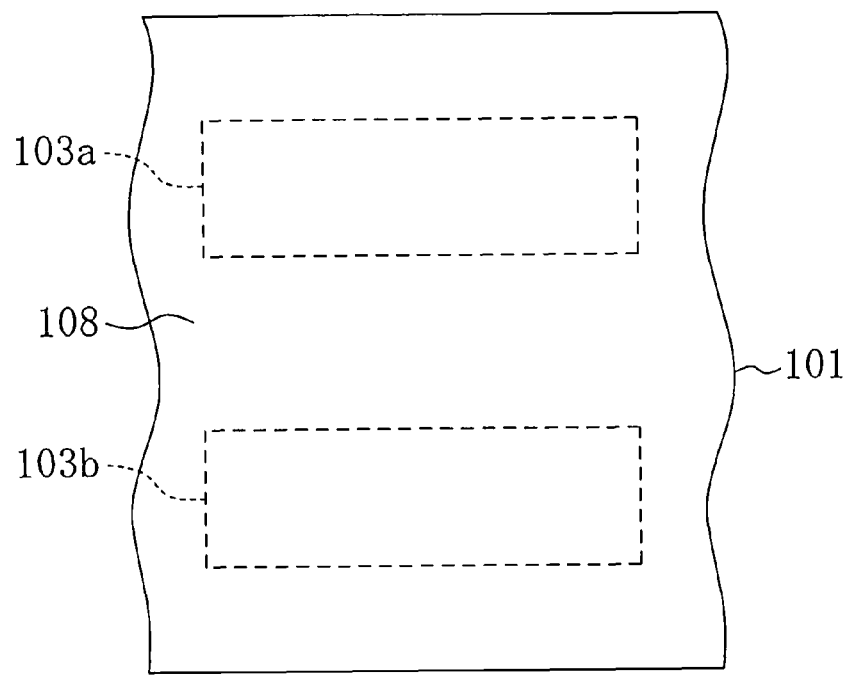

Next, as shown in FIG. 2B, a gate insulting film formation film (not shown) made of, for example, SiON is formed on each active region 103a, 103b, and then, a gate electrode formation film 105A made of, for example, polysilicon and having a film thickness of 150 nm and a mask film 108 formed of, for example, an oxide film and having a film thickness of 50 nm are formed in this order on the isolation region 102 and the gate insulating film formation film by CVD (Chemical Vapor Deposition) or the like. In general, though not shown herein, polysilicon of the gate electrode formation film 105A is subjected to ion implantation and thermal treatment for activation. The mask film 108 may be formed of a film made of any suitable material having selectivity in etching the gate electrode formation film 105A, other than the oxide film, such as a nitride film, an organic film, or the like.

Figure 3A:
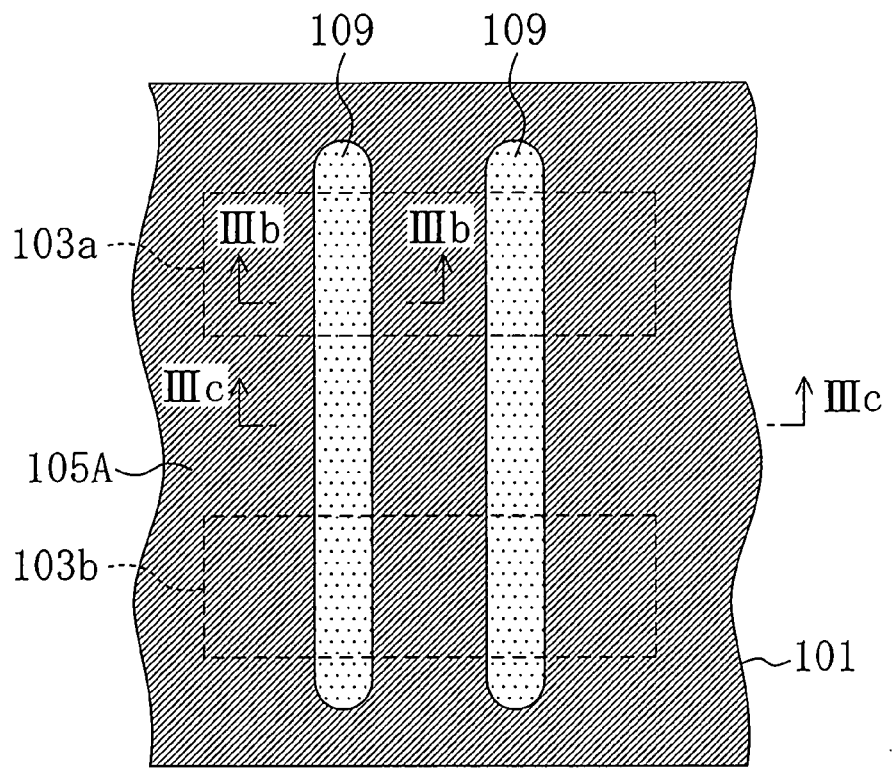
FIG. 3B is a plan view showing the semiconductor device manufacturing method in accordance with Embodiment 1 of the present invention.
FIG. 3C is a sectional view taken along the line IIIc-IIIc in FIG. 3A.
Figure 3B:
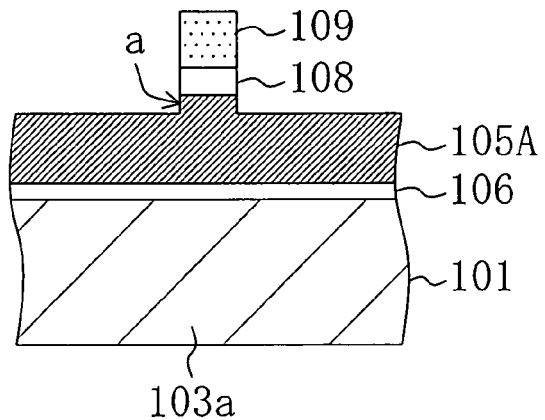
Figure 3C:
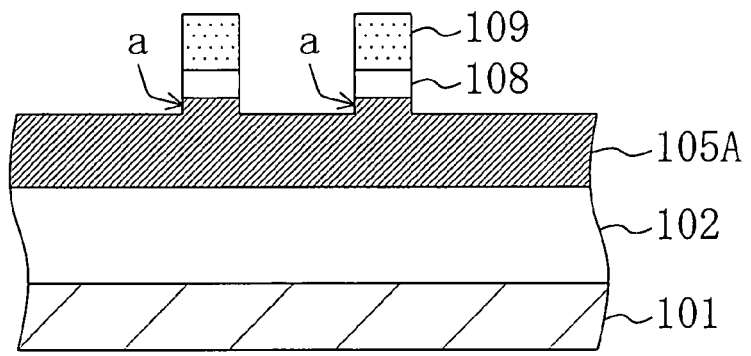

Subsequently, as shown in FIG. 3A, a resist pattern 109 across the active regions 103a, 103b and the isolation region 102 (a part of the isolation region which is located between the active regions 103a and 103b) is formed by photolithography, and then, the mask film 108 is etched with the use of the thus formed resist pattern 109 as a mask. In etching in this point, as shown in FIG. 3B (a sectional view taken along the line IIIb-IIIb in FIG. 3A) and FIG. 3C (a sectional view taken along the line IIIc-IIIc in FIG. 3A), the surface portion of the gate electrode formation film 105A is slightly etched to form a step part a. Preferably, the pattern for forming the resist pattern 109 has a linear contour. The linear contour causes no corner rounding phenomenon. Of course, the contour is not necessarily linear if variation in dimension involves no influence of the corner rounding phenomenon on the active regions. Optimization of the conditions for etching the mask film 108 eliminates the need for formation of the step part a in the surface portion of the gate electrode formation film 105A.

Figure 4A:
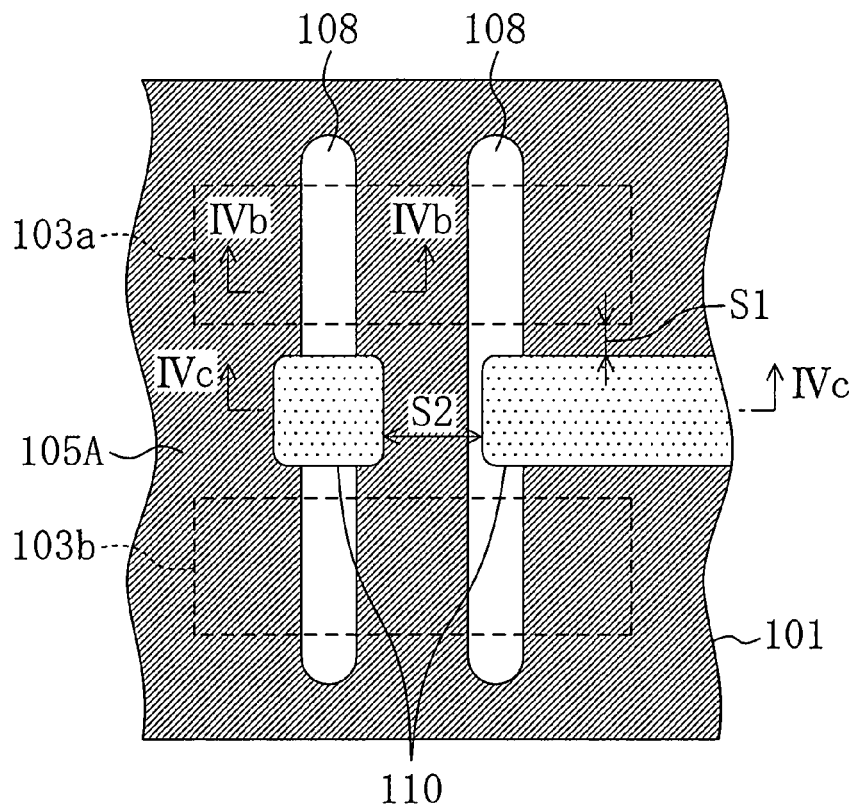
FIG. 4A is a plan view showing the semiconductor device manufacturing method in accordance with Embodiment 1 of the present invention.
Figure 4B:
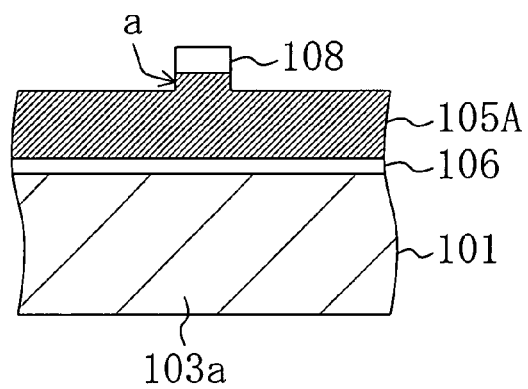
FIG. 4B is a sectional view taken along the line IVb-IVb in FIG. 4A.
Figure 4C:
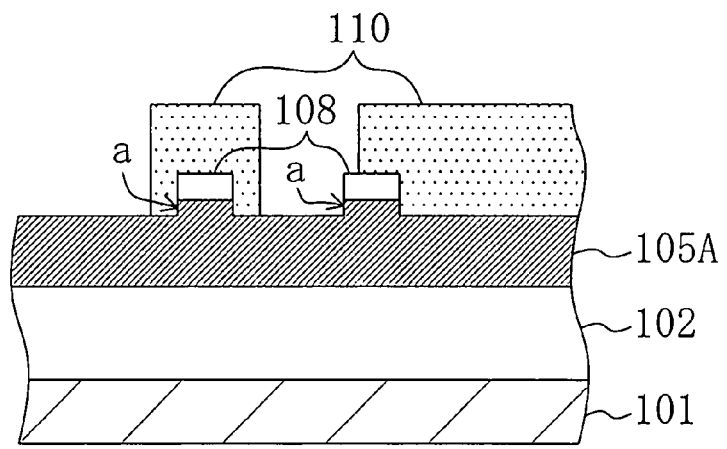
FIG. 4C is a sectional view taken along the line IVc-IVc in FIG. 4A.

Thereafter, as shown in FIG. 4A, following removal of the resist pattern 109, a resist pattern 110 for forming the gate contact region 105a and the wiring region 105b is formed on a part of the gate electrode formation film 105A which is located on the isolation region 102. The resist pattern 110 is formed so as to overlap with a part of the mask film 108 so that a combination of the resist pattern 110 and the mask film 108 forms a desired gate electrode pattern. In detail, the resist pattern 110 is not formed on the active regions 103a, 103b, as shown in FIG. 4A and FIG. 4B (a sectional view taken along the line IVb-IVb in FIG. 4A), but is formed on the gate electrode formation film 105A including the step part a and the mask film 108 on the isolation region 102, as shown in FIG. 4A and FIG. 4C (a sectional view taken along the line IVc-IVc in FIG. 4A). This permits patterning of the resist pattern 110 without taking into consideration the region on the active regions 103a, 103b where the gate electrodes 105 are formed, and accordingly, the distance S1 between each edge of the active regions 103a, 103b and each opposed edge of the resist pattern 110 may be 0 or larger. Actually, it can be approximated to a root-mean-square of dimensional variation and alignment variation of the active regions 103a, 103b and the resist pattern 110. The pattern interval S2 of the resist pattern 110 can be set smaller up to the limit of resolution in the photolithography process for forming the resist pattern 110.

Figure 5:
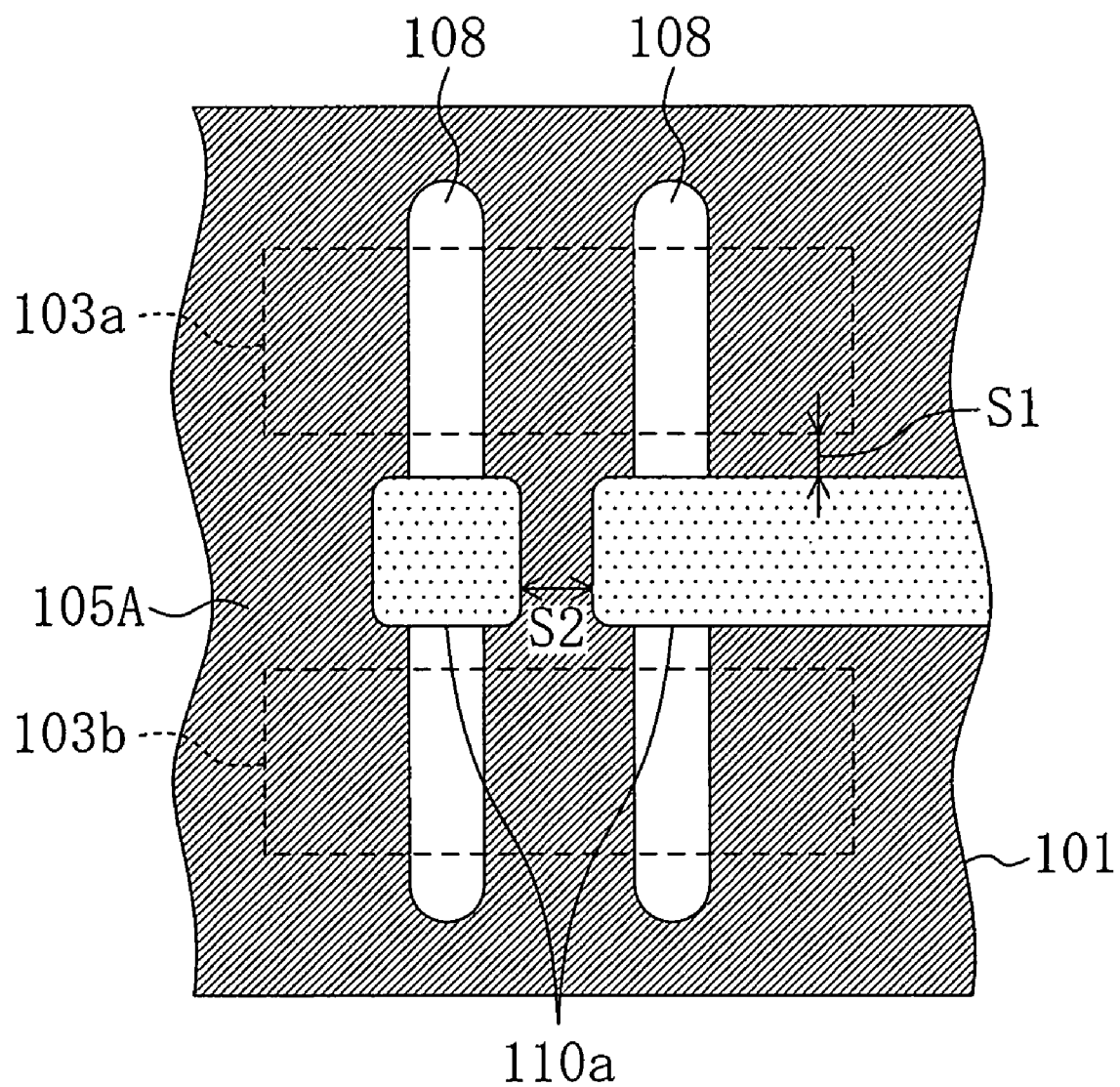
FIG. 5 is a plan view showing another semiconductor device manufacturing method in accordance with Embodiment 1 of the present invention as a modified example corresponding to FIG. 4A.

In FIG. 4A and FIG. 4C, the resist pattern 110 formed on the region to be the wiring region 105b is patterned so as to expose a part of the mask film 108, but may be patterned so as to extend beyond the mask film 108 as a resist pattern 110a for forming the wiring region 105b, as shown in FIG. 5.

Figure 6A:
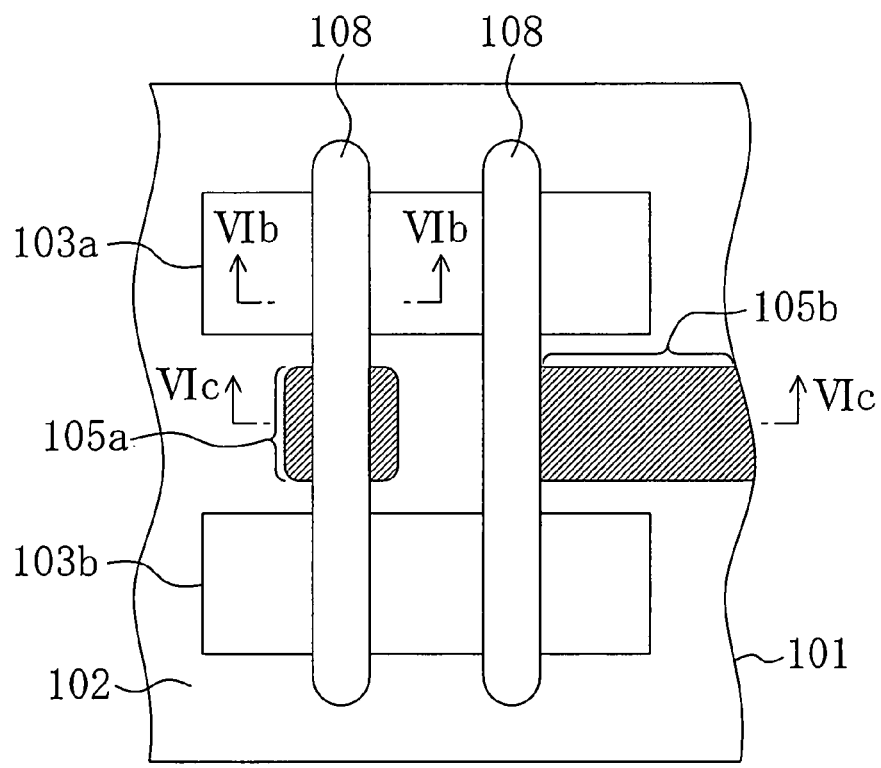
FIG. 6A is a plan view showing the semiconductor device manufacturing method in accordance with Embodiment 1 of the present invention.
Figure 6B:
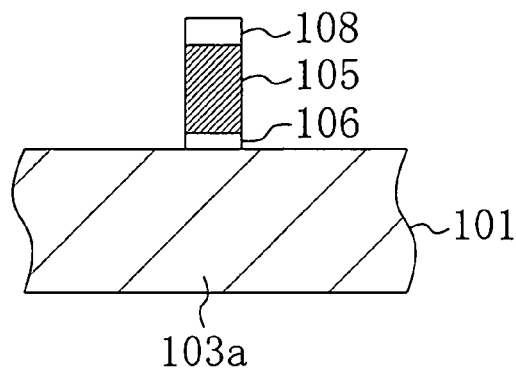
FIG. 6B is a sectional view taken along the line VIb-VIb in FIG. 6A.
Figure 6C:
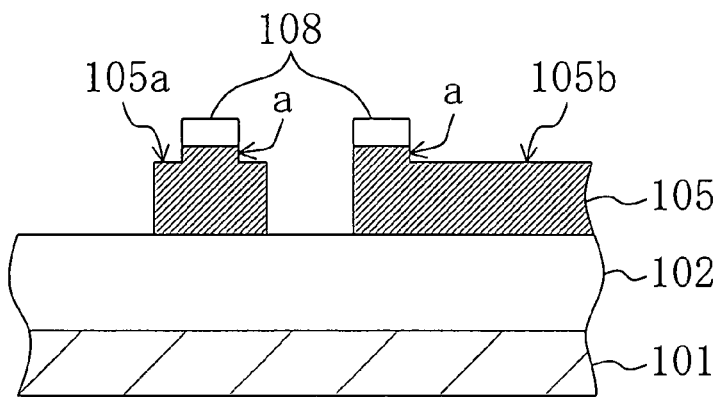
FIG. 6C is a sectional view taken along the line VIc-VIc in FIG. 6A.

Next, the gate electrode formation film 105A is etched with the use of the mask film 108 on the step part a of the gate electrode formation film 105A and the resist pattern 110 as a mask (a mask part), and then, the resist pattern 110 is removed. This forms the gate electrode 105 integrally including the gate contact region 105a and the gate electrode 105 integrally including the wiring region 105b, as shown in FIG. 6A. Specifically, the gate electrode 105 on which the mask film 108 is formed is formed on the active regions 103a, 103b with the gate insulating film 106 interposed, as shown in FIG. 6A and FIG. 6B (a sectional view taken along the line VIb-VIb in FIG. 6A), and the gate contact region 105a and the wiring region 105b of the gate electrodes 105 each including the step part a and having a mask film 108 thereon are formed on the isolation region 102, as shown in FIG. 6A and FIG. 6C (a sectional view taken along the line VIb-VIb in FIG. 6A).

The mask film 108 formed of an oxide film is used as a mask herein. With the use of the mask film 108 formed of an oxide film or a nitride film, impurity generation from a resist material in etching can be suppressed when compared with the case using a photoresist made of an organic material as a mask to thus increase dimension controllability.

Subsequently, following removal of the mask film 108, the sidewall 107 is formed on each side face of the gate electrodes 105 including the gate contact region 105a or the wiring region 105b by a known method, and the n-type source/drain regions 104a and the p-type source/drain regions 104b are formed by a known method, thereby obtaining the semiconductor device shown in FIG. 1A to FIG. 1C. Then, an interlayer insulating film, a contact (not shown) in the gate contact region 105a and the like are formed in general. Specifically, after formation of the gate electrodes 105, the n-type source/drain diffusion layer (the n-type extension region or the n-type LDD region) having a shallow junction is formed in each region on each side of each gate electrode 105 in the active region 103a by implanting an n-type impurity ion to the active region 103a with the use of the gate electrodes 105 as a mask. As well, the p-type source/drain diffusion layer (the p-type extension region or the p-type LDD region) having a shallow junction is formed in each region on each side of each gate electrode 105 in the active region 103b by implanting a p-type impurity ion to the active region 103b with the use of the gate electrodes 105 as a mask.

Thereafter, CVD or the like is performed for depositing a silicon nitride film on the entirety of the semiconductor substrate 101, and anisotropic etching is performed to form the sidewall 107 on each side face of each gate electrode 105. The sidewall 107 may be formed of a layered film of a silicon oxide film and a silicon nitride film, for example. Then, with the use of the sidewall 107 as a mask, implantation of an n-type impurity ion and implantation of a p-type impurity ion are performed on the active region 103a and the active region 103b, respectively. Then, thermal treatment is performed on the semiconductor substrate 101, with a result that the n-type source/drain diffusion layer having a comparatively deep junction is formed in each region on the outer side of each sidewall 107 in the active region 103a while the p-type source/drain diffusion layer having a comparatively deep junction is formed in each region on the outer side of each sidewall 107 in the active region 103b. In this way, the n-type source/drain regions 104a composed of the n-type source/drain diffusion layers having comparatively shallow junctions and the n-type source/drain diffusion layers having comparatively deep junctions are formed in the active region 103a while the p-type source/drain diffusion regions 104b composed of the p-type source/drain diffusion layers having comparatively shallow junctions and the p-type source/drain diffusion layers having comparatively deep junctions are formed in the active region 103b. Then, CVD or the like is performed on the entirety of the semiconductor substrate 101 to form an interlayer insulating film formed of, for example, a silicon oxide film, and a contact plug is formed, for example, in such a manner that tungsten is filled in a contact hole formed by, for example, etching and CMP (Chemical Mechanical Polishing) or the like is performed. Then, formation of metal wirings and the like is performed. It is noted that a step of siliciding each surface of the n-type source/drain regions 104a, the p-type source/drain regions 104b, and the gate electrodes 105 and/or a step of fully siliciding the gate electrodes 105 may be performed.

The mask film 108 is removed by overetching at formation of the sidewall 107 some cases. This reduces the film thickness of a region where no mask film 108 is formed, that is, the wiring region 105a and the like of the gate electrodes 105 in the present embodiment to invite variation in element characteristics. In the present embodiment, however, the film thickness of the gate electrodes 105 on the active regions 103a, 103b does not vary, thereby achieving stable transistor characteristics. On the other hand, the gate contact region 105a and the wiring region 105b reduce in film thickness or increase variation therein, which involves less or no influence on the contact resistance and the wiring resistance.

Modified Example of Embodiment 1

A method for manufacturing the semiconductor device in accordance with a modified example of Embodiment 1 of the present invention will be described below. One of significant features of the modified example lies in that no mask film is used unlike the semiconductor device manufacturing method in Embodiment 1.

FIG. 7A, FIG. 7B, FIG. 8A to FIG. 8C, FIG. 9A to FIG. 9C, FIG. 10A to FIG. 10C, and FIG. 11A to FIG. 11C are views for explaining the semiconductor device manufacturing method in accordance with the modified example of Embodiment 1 of the present invention. In the present modified example, an n-type MIS transistor is formed unlike the active region 103a while a p-type MIS transistor is formed in the active region 103b.

Figure 7A:
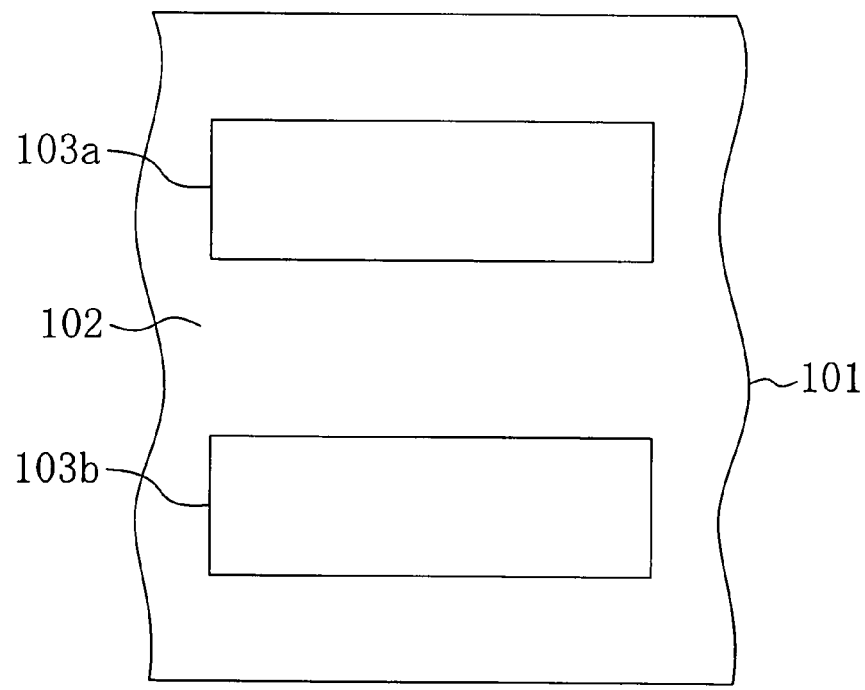
FIG. 7A and FIG. 7B are plan views showing a semiconductor device manufacturing method in accordance with a modified example of Embodiment 1 of the present invention.

First, as shown in FIG. 7A, the isolation region 102 is selectively formed in the semiconductor substrate 101 made of, for example, silicon by STI (Shallow Trench Isolation) or the like. Then, ion implantation is performed to form the p well (not shown) and the n well (not shown) in the semiconductor substrate 101. This forms the active region 103a including the p well and the active region 103b including the n well which are surrounded by the isolation region 102.

Figure 7B:
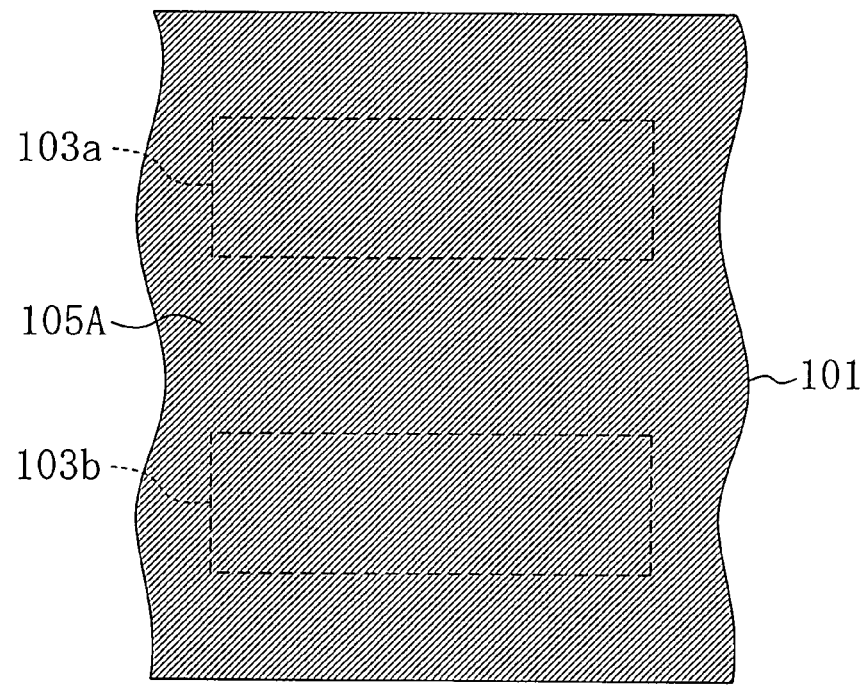

Next, as shown in FIG. 7B, a gate insulting film formation film (not shown) made of, for example, SiON is formed on each active region 103a, 103b, and then, a gate electrode formation film 105A made of, for example, polysilicon and having a film thickness Tint (for example, 150 nm, see FIG. 8B and FIG. 8C) is formed on the isolation region 102 and the gate insulating film formation film by CVD (Chemical Vapor Deposition) or the like. In general, though not shown, polysilicon of the gate electrode formation film 105A is subjected to impurity implantation and thermal treatment for activation.

Figure 8A:
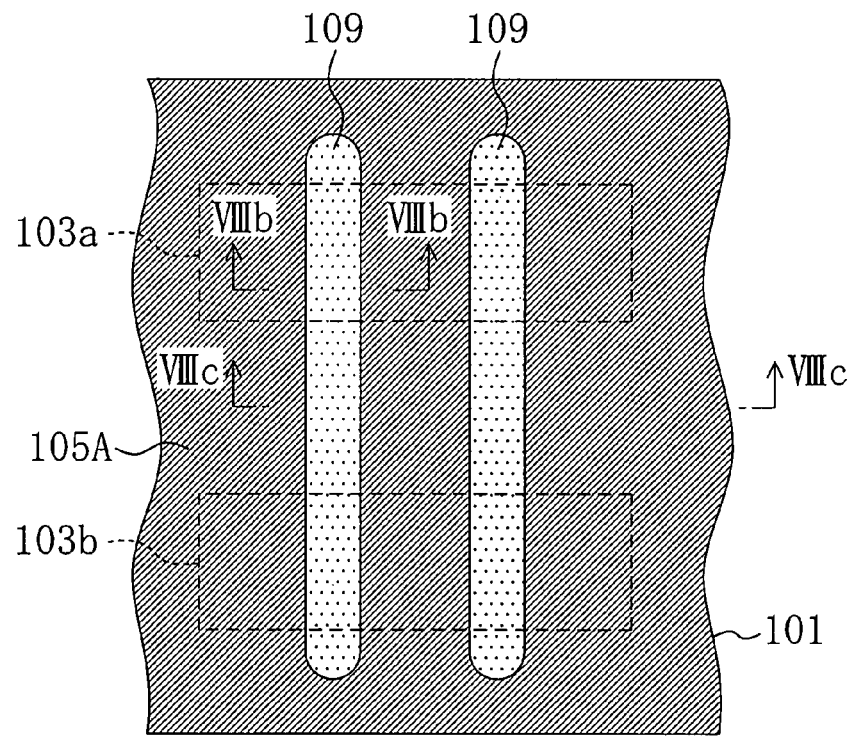
FIG. 8A is a plan view showing the semiconductor device manufacturing method in accordance with the modified example of Embodiment 1 of the present invention.
Figure 8B:
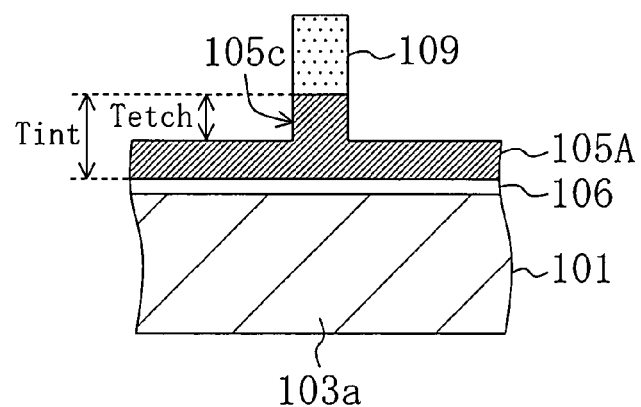
FIG. 8B is a sectional view taken along the line VIIIb-VIIIb in FIG. 8A.
Figure 8C:
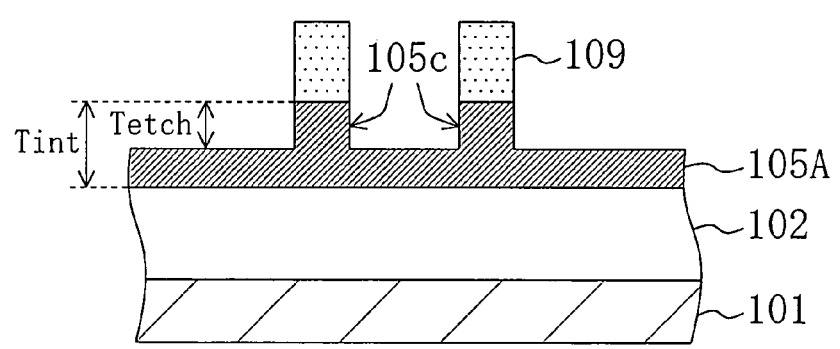
FIG. 8C is a sectional view taken along the line VIIIc-VIIIc in FIG. 8A.

Subsequently, as shown in FIG. 8A, the resist pattern 109 across the active regions 103a, 103b and the isolation region 102 (a part of the isolation region which is located between the active regions 103a and 103b) is formed on the gate electrode formation film 105A by photolithography, and then, the gate electrode formation film 105A is etched by a film thickness of Tetch, for example, 100 nm larger than a necessary film thickness Trem (Tecth>Trem) with the use of the resist pattern 109 as a mask. Etching in this time point forms a step part 105C having a step difference by the film thickness Tetch in the surface portion of the gate electrode formation film 105A, as shown in FIG. 8B (a sectional view taken along the line VIIIb-VIIIb in FIG. 8A) and FIG. 8C (a sectional view taken along the line VIIIc-VIIIc in FIG. 8A). Preferably, the pattern for forming the resist pattern 109 has a linear contour. The linear contour causes no corner rounding phenomenon. Of course, the contour is not necessarily linear if variation in dimension involves no influence of the corner rounding phenomenon on the active regions.

Figure 9A:
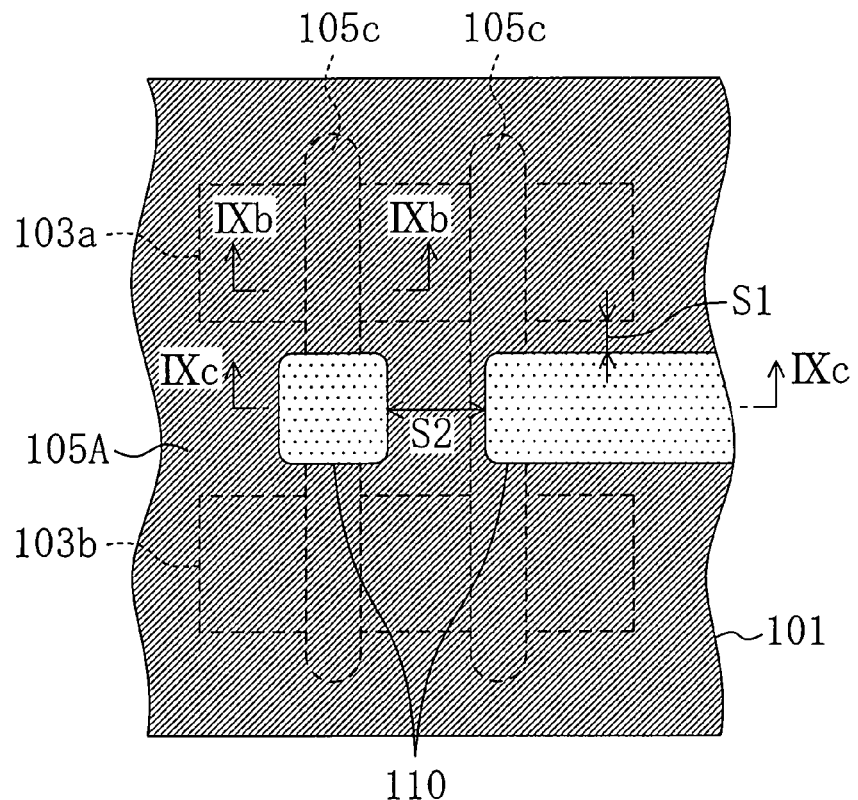
FIG. 9A is a plan view showing the semiconductor device manufacturing method in accordance with the modified example of Embodiment 1 of the present invention.
Figure 9B:
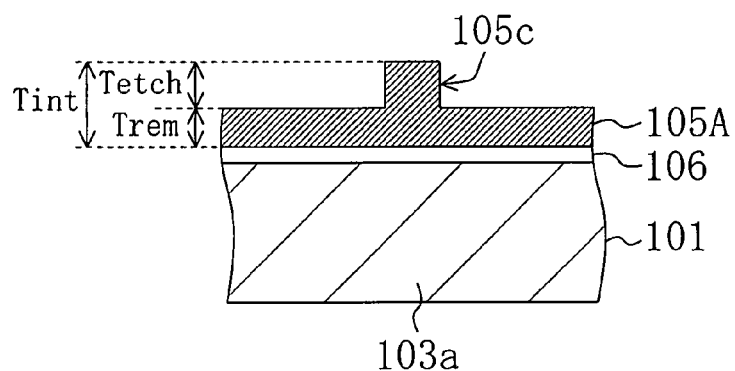
FIG. 9B is a sectional view taken along the line IXb-IXb in FIG. 9A.
Figure 9C:
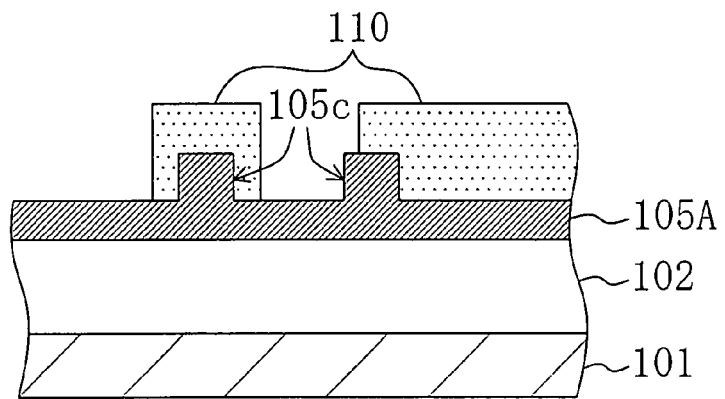
FIG. 9C is a sectional view taken along the line IXc-IXc in FIG. 9A.

Thereafter, as shown in FIG. 9A, following removal of the resist pattern 109, a resist pattern 110 for forming the gate contact region 105a and the wiring region 105b is formed on a part of the gate electrode formation film 105A which is located on the isolation region 102. The resist pattern 110 is formed so as to overlap with a part around the step part 105c of the gate electrode formation film 105A so that a combination of the resist pattern 110 and the step part 105c forms a desired gate electrode pattern. In detail, the resist pattern 110 is not formed on the active regions 103a, 103b, as shown in FIG. 9A and FIG. 9B (a sectional view taken along the line IXb-IXb in FIG. 9A), but is formed on the gate electrode formation film 105A including the step part 105c on the isolation region 102, as shown in FIG. 9A and FIG. 9C (a sectional view taken along the line IXc-IXc in FIG. 9A). This permits pattering of the resist pattern 110 without taking into consideration the region on the active regions 103a, 103b where the gate electrodes 105 are formed, and accordingly, the distance S1 between each edge of the active regions 103a, 103b and each opposed edge of the resist pattern 110 may be 0 or larger. Actually, it can be approximated to a root-mean-square of dimensional variation and alignment variation of the active regions 103a, 103b and the resist pattern 110. The pattern interval S2 of the resist pattern 110 can be set smaller up to the limit of resolution in the photolithography process for forming the resist pattern 110.

In FIG. 9A and FIG. 9C, the resist pattern 110 formed on the wiring region 105b is patterned so as to expose a part of the step part 105c, but may be patterned so as to extend beyond the step part 105c, as shown in FIG. 5.

Figure 10A:
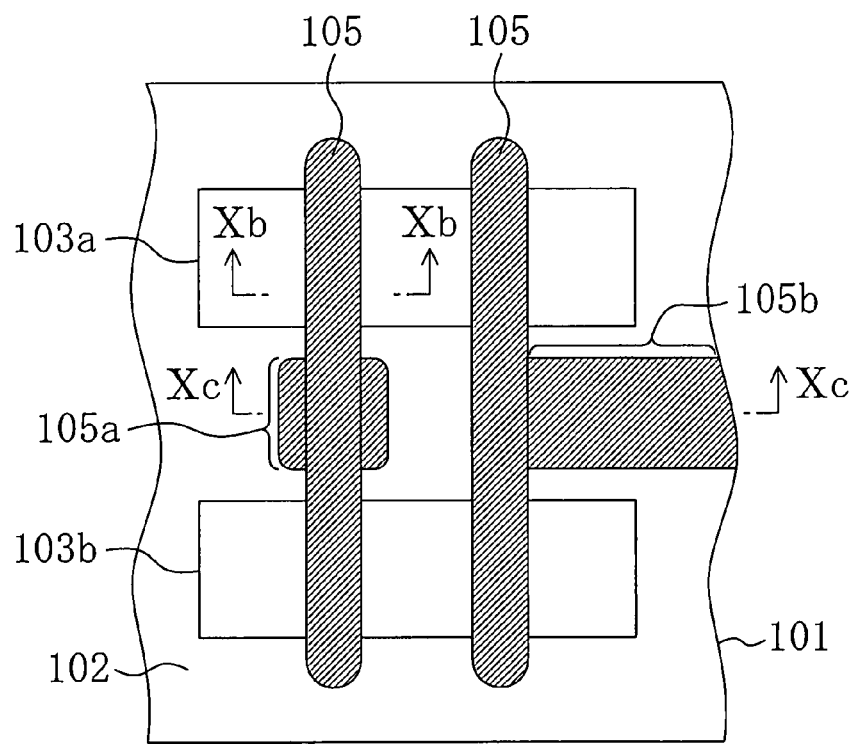
FIG. 10A is a plan view showing the semiconductor device manufacturing method in accordance with the modified example of Embodiment 1 of the present invention.
Figure 10B:
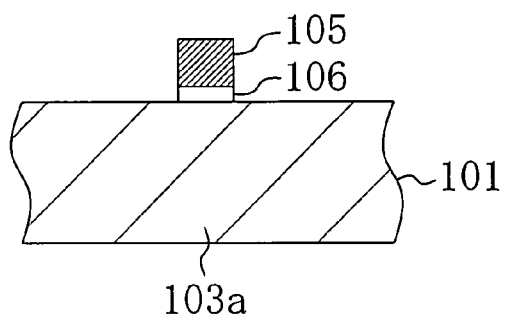
FIG. 10B is a sectional view taken along the line Xb-Xb in FIG. 10A.
Figure 10C:
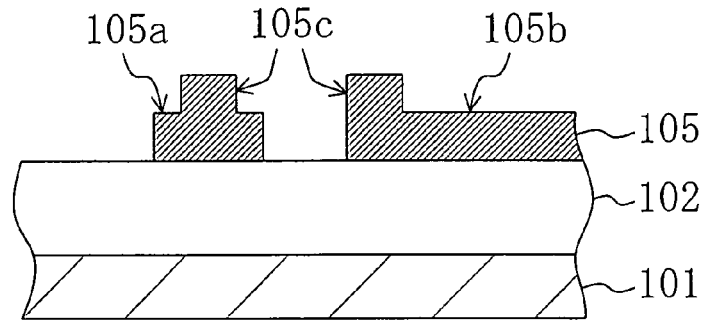
FIG. 10C is a sectional view taken along the line Xc-Xc in FIG. 10A.

Next, the gate electrode formation film 105A is etched by a film thickness of Trem (Tint-Tetch, for example, 50 nm) with the use of the resist pattern 110 as a mask, and then, the resist pattern 110 is removed. Thus, the gate electrode 105 integrally including the gate contact region 105a and the gate electrode 105 integrally including the wiring region 105b are formed, as shown in FIG. 10A. Specifically, the gate electrodes 105 are formed on the active regions 103a, 103b with the gate insulating film 106 interposed, as shown in FIG. 10A and FIG. 10B (a sectional view taken along the line Xb-Xb in FIG. 10A), and the gate contact region 105a and the wiring region 105b of the gate electrodes 105 each including the step part 105c are formed on the isolation region 102, as shown in FIG. 10A and FIG. 10C (a sectional view taken along the line Xc-Xc in FIG. 10A). FIG. 10B and FIG. 10C show the case where the resist pattern 110 is pattered so as to cover the step part 105c fully. In the case where the resist pattern 110 covers a part of the step part 105c, as shown in FIG. 9C, the exposed part of the step part 105c, which also functions as a mask (a mask part), has the film thickness Tetch as a result of removal thereof by the film thickness Trem out of the film thickness Tint.

Figure 11A:
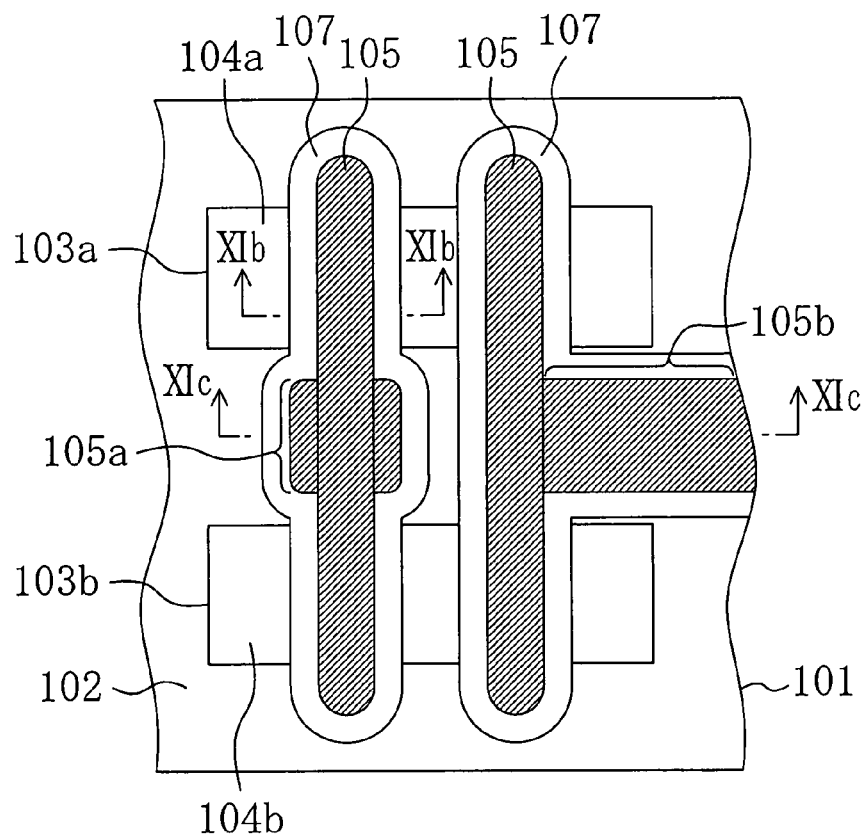
FIG. 11A is a plan view showing the semiconductor device manufacturing method in accordance with the modified example of Embodiment 1 of the present invention.
Figure 11B:
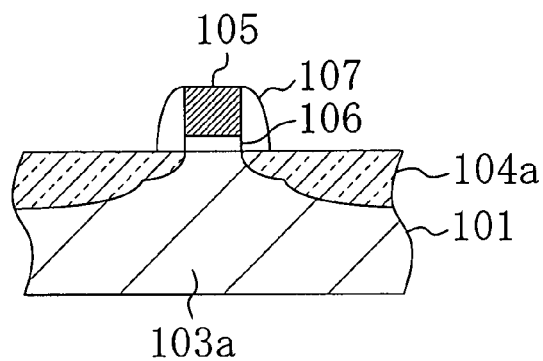
FIG. 11B is a sectional view taken along the line XIb-XIb in FIG. 11A.
Figure 11C:
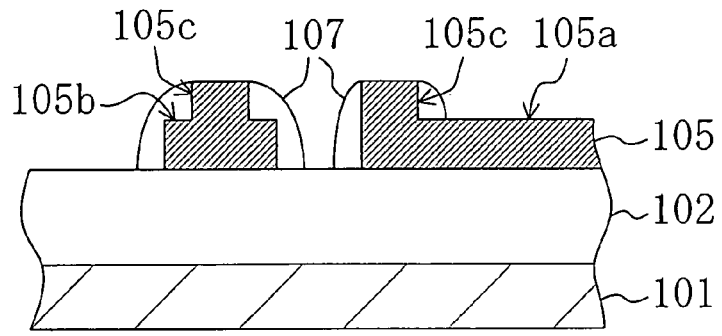
FIG. 11C is a sectional view taken along the line XIc-XIc in FIG. 11A.

Subsequently, similarly to the above description, the sidewall 107, the n-type source/drain regions 104a, and the p-type source/drain regions 104b are formed by known methods, thereby obtaining the semiconductor device shown in FIG. 11A to FIG. 11C.

Embodiment 2

A semiconductor device in accordance with Embodiment 2 of the present invention will be described below.

Figure 12A:
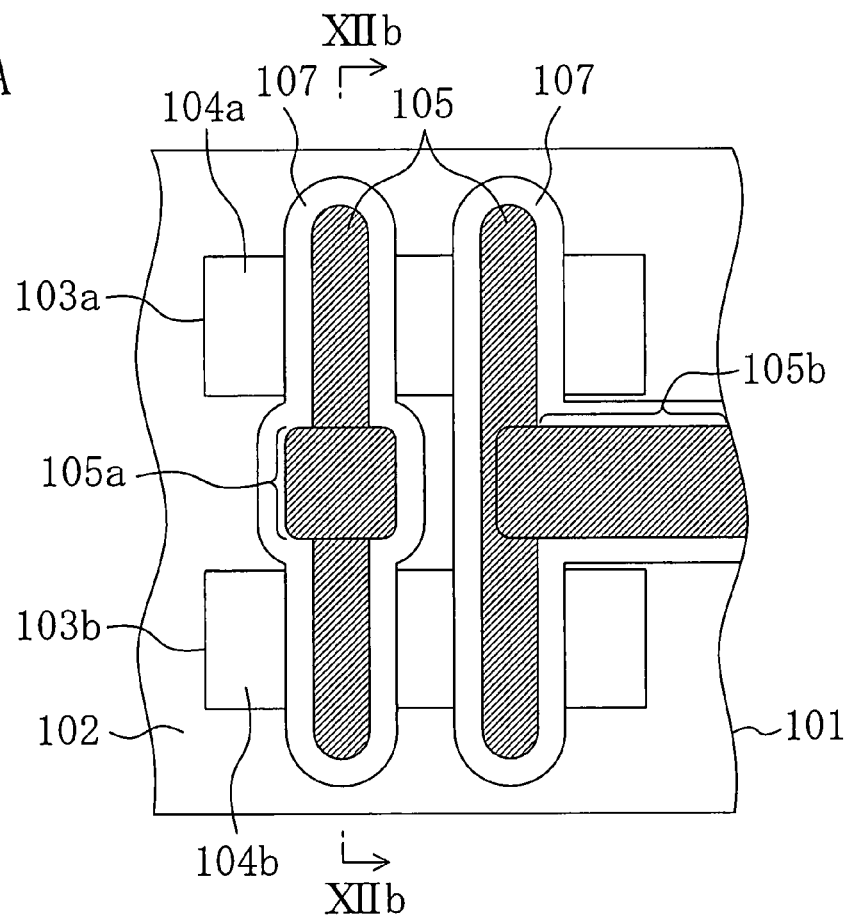
FIG. 12A is a plan view showing a structure of a semiconductor device in accordance with Embodiment 2 of the present invention.
Figure 12B:
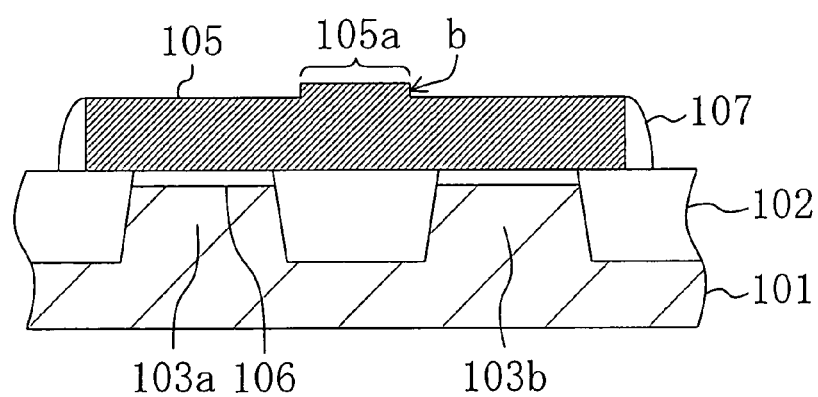
FIG. 12B is a sectional view taken along the line XIIb-XIIb in FIG. 12A.

FIG. 12A and FIG. 12B shows a structure of the semiconductor device in accordance with Embodiment 2 of the present invention, wherein FIG. 12A is a plan view, and FIG. 12B is a sectional view taken along the line XIIb-XIIb in FIG. 12A. The present embodiment refers to the case where an n-type MIS transistor is formed in an active region 103a while a p-type MIS transistor is formed in an active region 103b.

As shown in FIG. 12A, in a semiconductor substrate 101 made of, for example, silicon, there are formed an isolation region 102, the active region 103a including a p well (not shown) and surrounded by the isolation region 102, and the active region 103b including an n well (not shown) and surrounded by the isolation region 102. Further, n-type source/drain regions 104a are formed in the upper parts of the active region 103a while p-type source/drain regions 104b are formed in the upper parts of the active region 103b. Gate electrodes 105 are formed across the active region 103a and the active region 103b in the gate width direction with the isolation region 102 interposed on the semiconductor substrate 101. Each gate electrode 105 is formed of a layered film of polysilicon or metal silicide and polysilicon, a silicide film, a metal film, or the like, for example. The gate electrodes 105 include a gate contact region 105a to serve as a lead part or a wiring region 105b to serve as a lead part. A sidewall 107 made of, for example, a silicon nitride film is continuously formed on each side face of each gate electrode 105. Each n-type source/drain region 104a is composed of an n-type source/drain diffusion layer (an n-type extension region or an n-type LDD region) having a comparatively shallow junction and formed on each side of each gate electrode 105 in the active region 103a and an n-type source/drain diffusion region having a comparatively deep junction and formed on the outer side of each sidewall 107 in the active region 103a. As well, each p-type source/drain region 104b is composed of a p-type source/drain diffusion layer (a p-type extension region or a p-type LDD region) having a comparatively shallow junction and formed on each side of each gate electrode 105 in the active region 103b and a p-type source/drain diffusion region having a comparatively deep junction and formed on the outer side of each sidewall 107 in the active region 103b. The sidewall 107 may be formed of a layered film of, for example, a silicon oxide film and a silicon nitride film.

Referring to the sectional view of FIG. 12B, the gate electrodes 105 are formed across the active regions 103a, 103b in the gate width direction with the insulation region 102 interposed on the semiconductor substrate 101, and a gate insulating film 106 made of, for example, SiON is present below the gate electrodes 105 on the active regions 103a, 103b.

The gate electrode 105 including the gate contact region 105a in Embodiment 2 includes, as shown in FIG. 12B, a step part b above the isolation region 102, namely, has a film thickness in the gate contact region 105a larger than that on the active regions 103a, 103b. Though not shown, the other gate electrode 105 has a film thickness in the wiring region 105b larger than that on the active regions 103a, 103b, as well With the gate electrodes 105 having the above structures, the corner rounding phenomenon is suppressed. This allows the gate contact region 105a and the wiring region 105b to be arranged close to the active regions 103a, 103b with variation in transistor characteristics prevented and allows adjacent gate electrodes to be arranged close to each other with short-circuit of the gate electrodes 105, which is caused due to increased width of the gate contact region 105a, suppressed. Hence, higher integration is enabled.

A method for manufacturing the semiconductor device in accordance with Embodiment 2 of the present invention will be described below.

FIG. 13A, FIG. 13B, FIG. 14A to FIG. 14C, and FIG. 15A to FIG. 15C are views for explaining the semiconductor device manufacturing method in accordance with Embodiment 2 of the present invention. One of the significant features of the semiconductor device manufacturing method in accordance with Embodiment 2 lies in that the steps using the resist pattern 109 and the steps using the resist pattern 110 are exchanged in order in contrast to the semiconductor device manufacturing method in accordance with Embodiment 1.

Figure 13A:
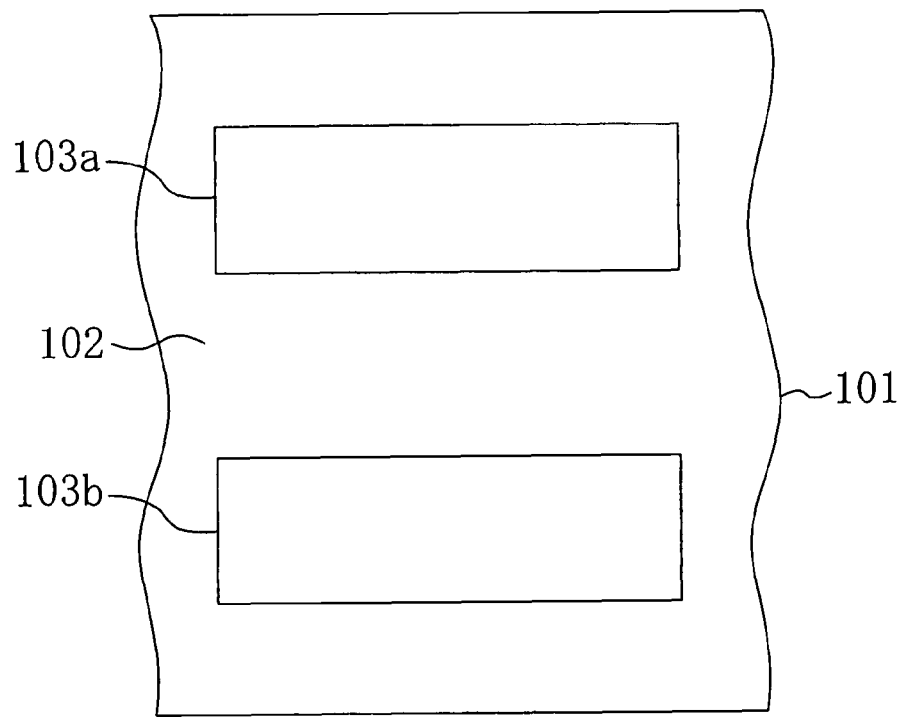
FIG. 13A and FIG. 13B are plan views showing a semiconductor device manufacturing method in accordance with Embodiment 2 of the present invention.

First, as shown in FIG. 13A, the isolation region 102 is selectively formed in the semiconductor substrate 101 made of, for example, silicon by STI (Shallow Trench Isolation) or the like. Then, ion implantation is performed to form the p well (not shown) and the n well (not shown) in the semiconductor substrate 101. This forms the active region 103a including the p well and the active region 103b including the n well which are surrounded by the isolation region 102.

Figure 13B:
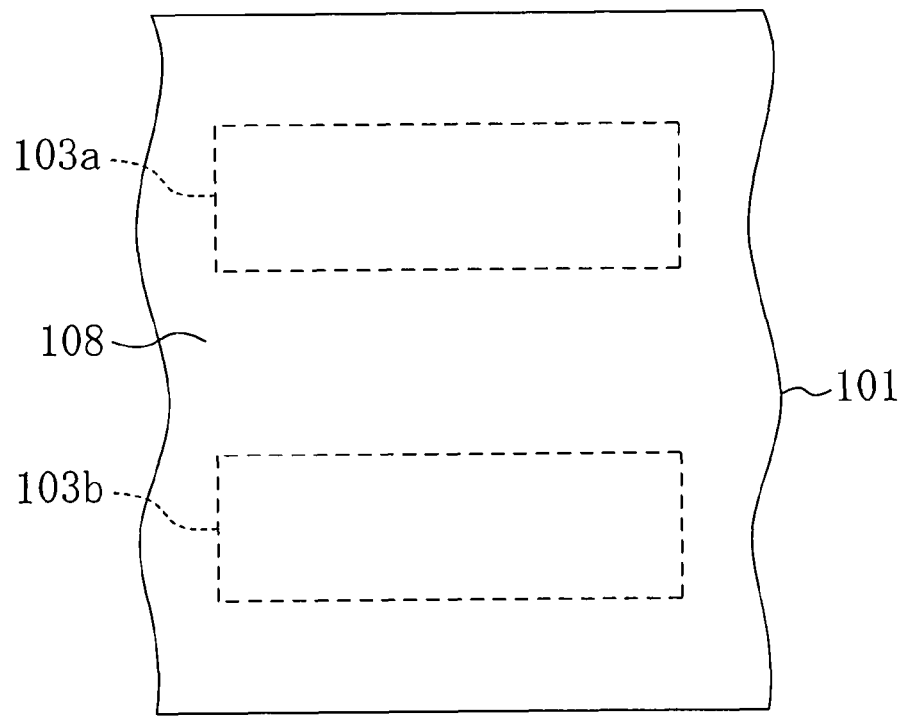

Next, as shown in FIG. 13B, a gate insulting film formation film (not shown) made of, for example, SiON is formed on each active region 103a, 103b, and then, a gate electrode formation film 105A made of, for example, polysilicon and having a film thickness of 150 nm and a mask film 108 formed of, for example, an oxide film and having a film thickness of 50 nm are formed in this order on the isolation region 102 and the gate insulating film formation film by CVD (Chemical Vapor Deposition) or the like. In general, though not shown herein, polysilicon of the gate electrode formation film 105A is subjected to ion implantation and thermal treatment for activation. The mask film 108 may be formed of a film made of any suitable material having selectivity in etching the gate electrode formation film 105A, other than the oxide film, such as a nitride film, an organic film, or the like.

Figure 14A:
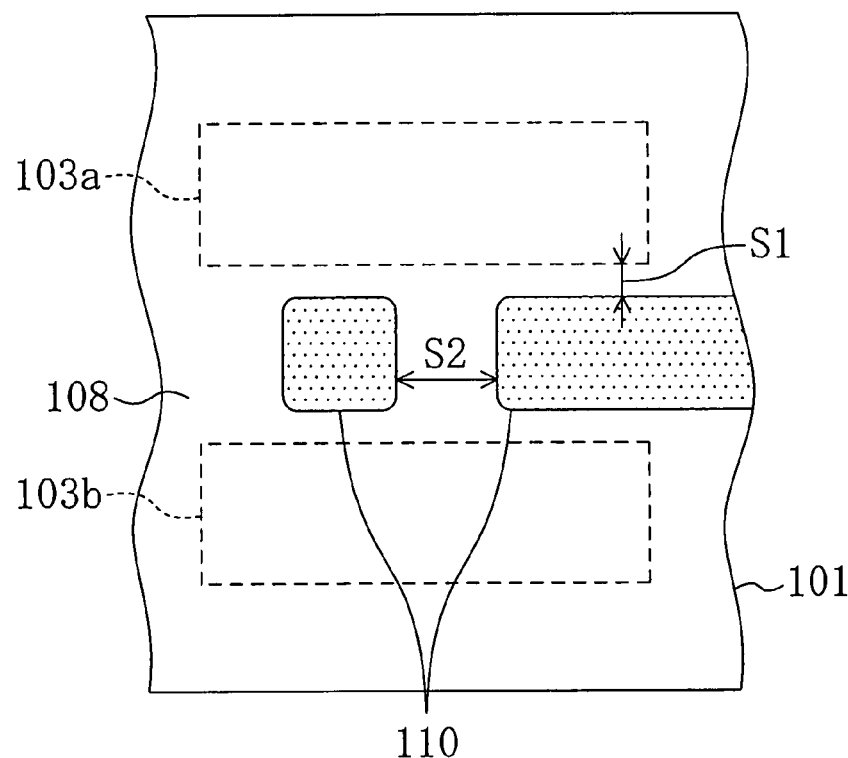
FIG. 14A and FIG. 14B are plan views showing the semiconductor device manufacturing method in accordance with Embodiment 2 of the present invention.

Subsequently, as shown in FIG. 14A, a resist pattern 110 for forming the gate contact region 105a and the wiring region 105b is formed on a part of the mask film 108 which is located on the isolation region 102. The resist pattern 110 is not formed on the active regions 103a, 103b. This permits patterning of the resist pattern 110 without taking into consideration the region on the active regions 103a, 103b where the gate electrodes 105 are formed, and accordingly, the distance S1 between each edge of the active regions 103a, 103b and each opposed edge of the resist pattern 110 may be 0 or larger. Actually, it can be approximated to a root-mean-square of dimensional variation and alignment variation of the active regions 103a, 103b and the resist pattern 110. The pattern interval S2 of the resist pattern 110 can be set smaller up to the limit of resolution in the photolithography process for forming the resist pattern 110.

Figure 14B:
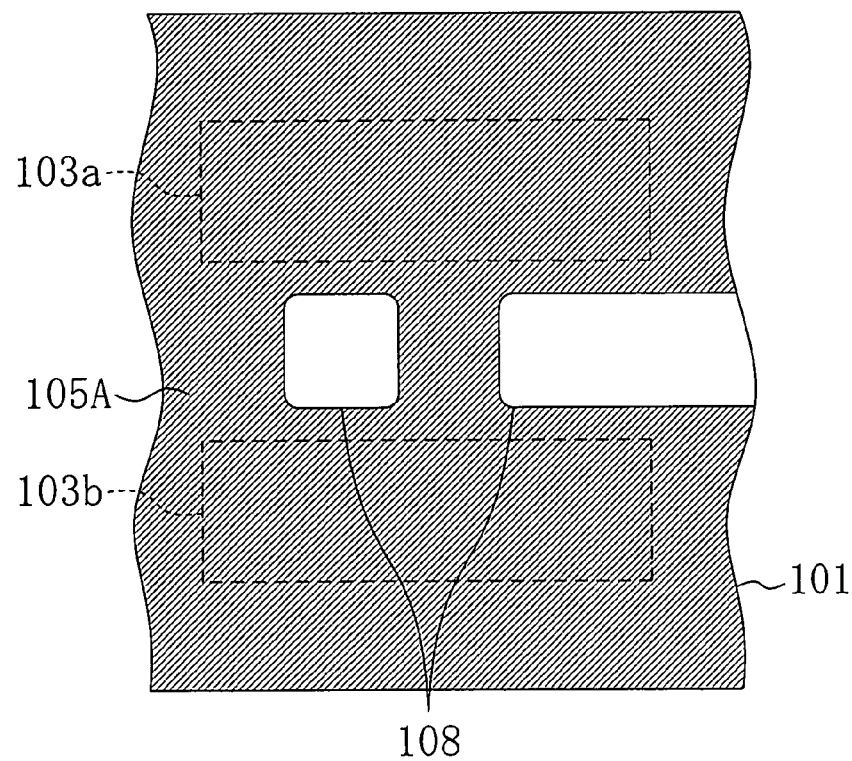

Thereafter, as shown in FIG. 14B, the mask film 108 is etched with the use of the resist pattern 110 as a mask, and then, the resist pattern 110 is removed. In etching in this time point, though not shown, the gate electrode formation film 105A is slightly etched to form the step part b (see FIG. 12B). Optimization of the conditions for etching the mask film 108 eliminates the need for formation of the step part b in the surface portion of the gate electrode formation film 105A.

Figure 15A:
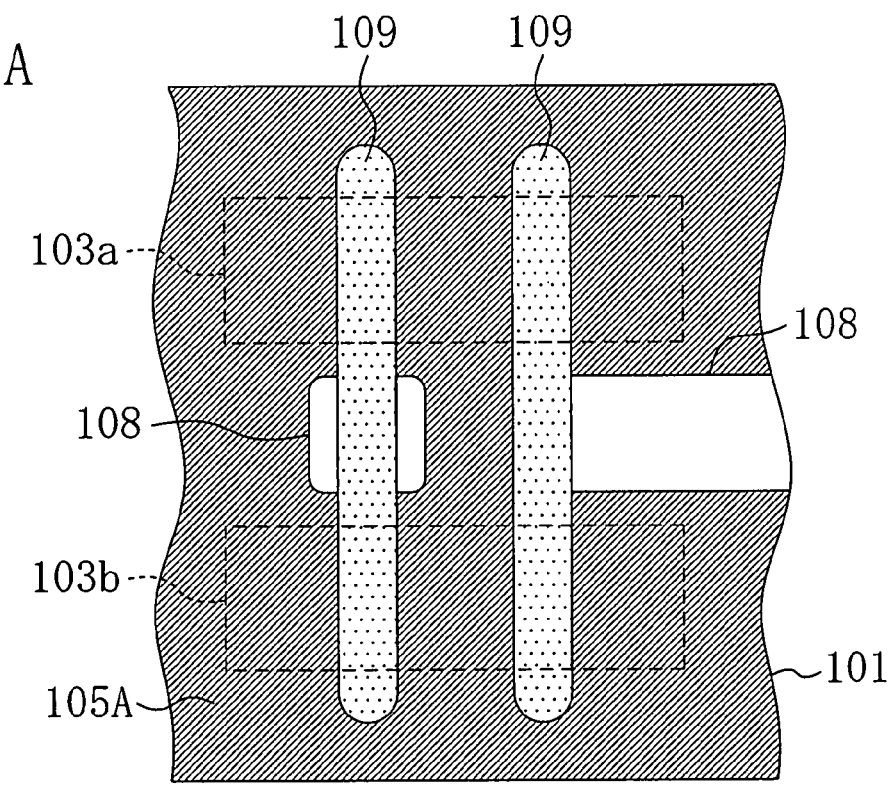
FIG. 15A and FIG. 15B are plan views showing the semiconductor device manufacturing method in accordance with Embodiment 2 of the present invention.

Next, as shown in FIG. 15A, photolithography is performed to form a resist pattern 109 across the active regions 103a, 103b and the isolation region 102 (a part of the isolation region which is located between the active regions 103a and 103b) on the gate electrode formation film 105A and the mask film 108. The resist pattern 109 is formed so as to overlap with a part of the mask film 108 so that a combination of the resist pattern 109 and the mask film 108 forms a desired gate electrode pattern. Preferably, the pattern for forming the resist pattern 109 has a linear contour. The linear contour causes no corner rounding phenomenon. Of course, the contour is not necessarily linear if variation in dimension involves no influence of the corner rounding phenomenon on the active regions.

Figure 15B:
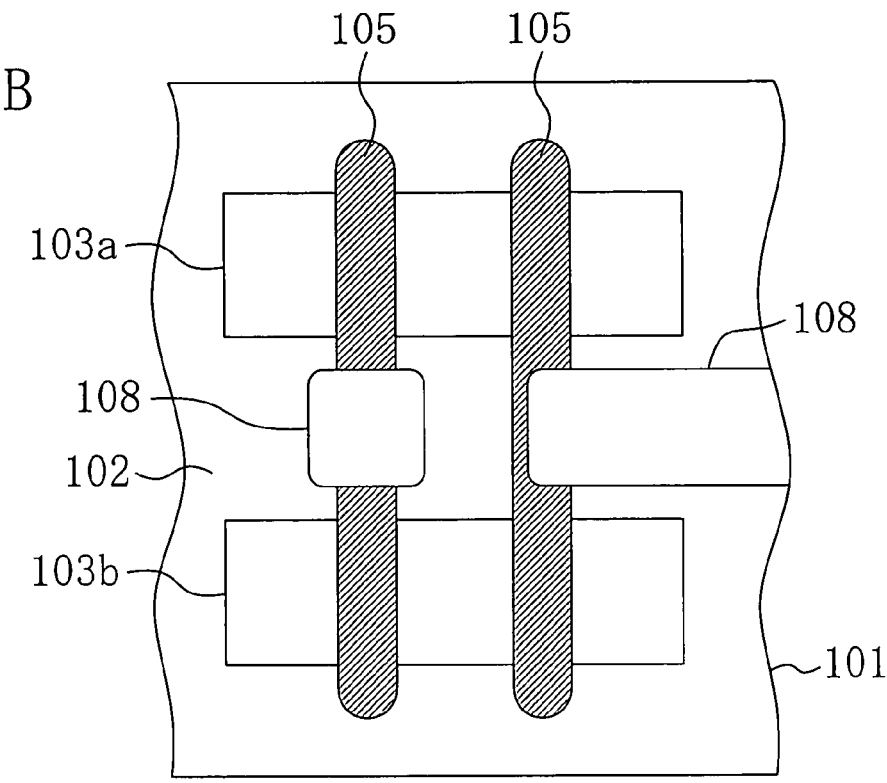

Subsequently, as shown in FIG. 15B, the gate electrode formation film 105A is etched with the use of the mask film 108 on the step part b of the gate electrode formation film 105A and the resist pattern 109 as a mask (a mask part), and then, the resist pattern 109 is removed. This forms gate electrodes 105 including the gate contact region 105a or the wiring region 105b on each of which the mask film 108 is formed.

The mask film 108 formed of an oxide film is used as a mask herein. With the use of the mask film 108 formed of an oxide film or a nitride film, impurity generation from a resist material in etching can be suppressed when compared with the case using a photoresist made of an organic material as a mask to thus increase dimension controllability.

Subsequently, similarly to the above description in Embodiment 1, the mask film 108 is remove, and the sidewall 107, the n-type source/drain regions 104a, and the p-type source/drain regions 104b are formed by known methods, thereby obtaining the semiconductor device shown in FIG. 12A to FIG. 12B. Mechanism of removal of the mask film 108 is the same as that described in Embodiment 1.

Modified Example of Embodiment 2

A semiconductor device manufacturing method in accordance with a modified example of Embodiment 2 of the present invention will be described blow.

FIG. 16A, FIG. 16B, FIG. 17A to FIG. 17C, FIG. 18A to FIG. 18C, and FIG. 19A to FIG. 19C are views for explaining the semiconductor device manufacturing method in accordance with the modified example of Embodiment 2 of the present invention. One of the significant features of the present modified example lies in that no mask film is used unlike in the semiconductor device manufacturing method in Embodiment 2.

Figure 16A:
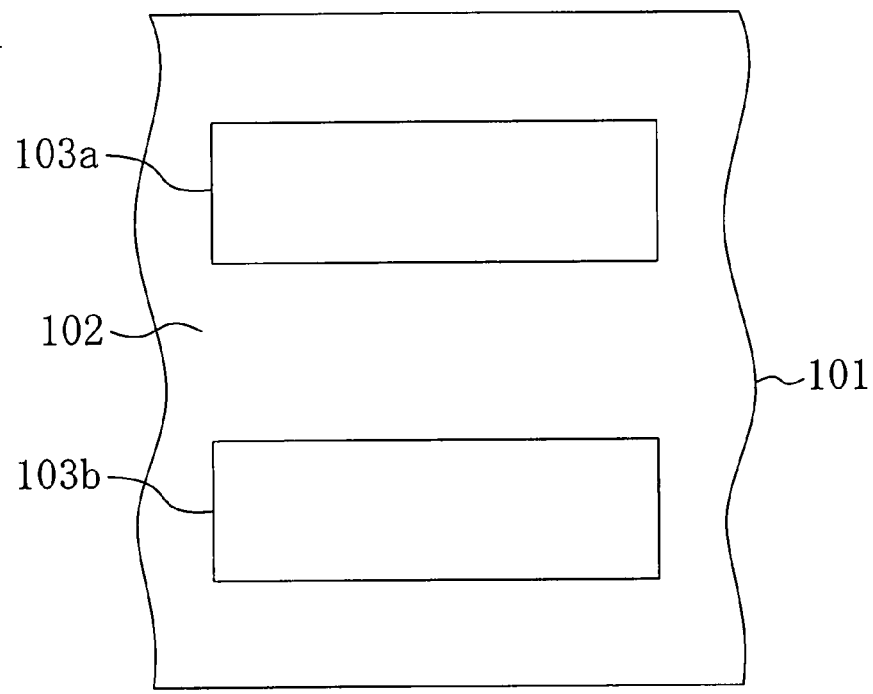
FIG. 16A and FIG. 16B are plan views showing a semiconductor device manufacturing method in accordance with a modified example of Embodiment 2 of the present invention.

First, as shown in FIG. 16A, the isolation region 102 is selectively formed in the semiconductor substrate 101 made of, for example, silicon by STI (Shallow Trench Isolation) or the like. Then, ion implantation is performed to form the p well (not shown) and the n well (not shown) in the semiconductor substrate 101. This forms the active region 103a including the p well and the active region 103b including the n well which are surrounded by the isolation region 102.

Figure 16B:
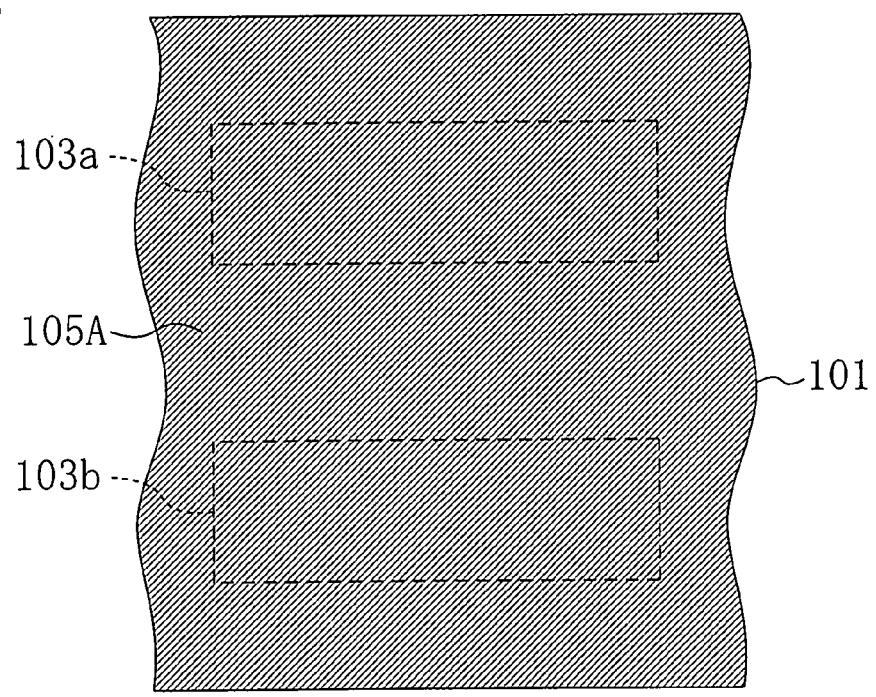

Next, as shown in FIG. 16B, a gate insulting film formation film (not shown) made of, for example, SiON is formed on each active region 103a, 103b, and then, a gate electrode formation film 105A made of, for example, polysilicon and having a film thickness Tint (for example, 150 nm) is formed on the isolation region 102 and the gate insulating film formation film by CVD (Chemical Vapor Deposition) or the like. In general, though not shown, polysilicon of the gate electrode formation film 105A is subjected to impurity implantation and thermal treatment for activation.

Figure 17A:
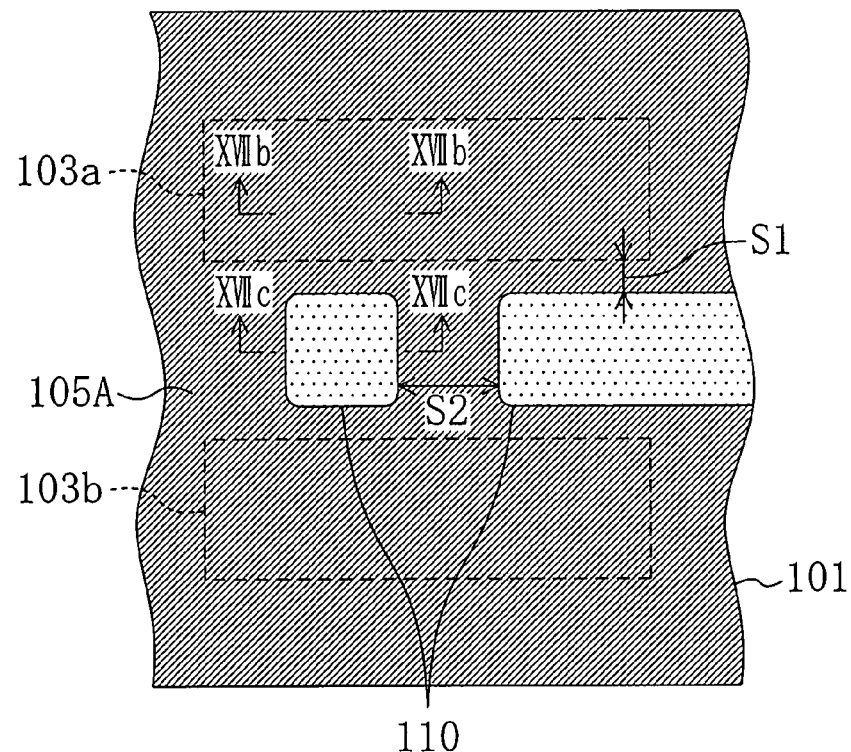
FIG. 17A is a plan view showing the semiconductor device manufacturing method in accordance with the modified example of Embodiment 2 of the present invention.
Figure 17B:
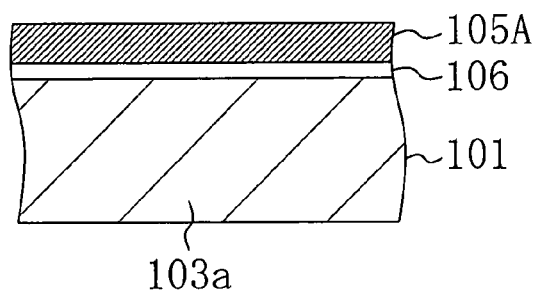
FIG. 17B is a sectional view taken along the line XVIIb-XVIIb in FIG. 17A.
Figure 17C:
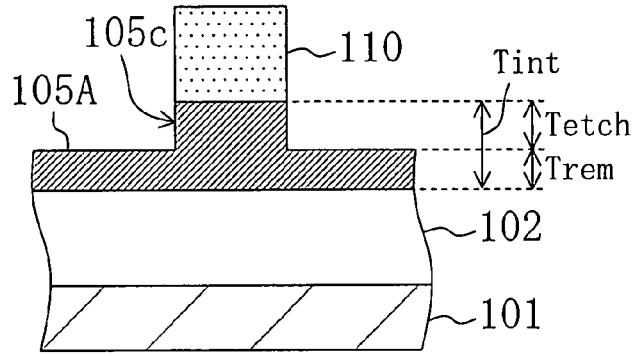
FIG. 17C is a sectional view taken along the line XVIIc-XVIIc in FIG. 17A.

Subsequently, as shown in FIG. 17A, a resist pattern 110 for forming the gate contact region 105a and the wiring region 105b is formed on a part of the gate electrode formation film 105A which is located on the isolation region 102. The resist pattern 110 is not formed on the active regions 103a, 103b. This permits patterning of the resist pattern 110 without taking into consideration the region on the active regions 103a, 103b where the gate electrodes 105 are formed, and accordingly, the distance S1 between each edge of the active regions 103a, 103b and each opposed edge of the resist pattern 110 may be 0 or larger. Actually, it can be approximated to a root-mean-square of dimensional variation and alignment variation of the active regions 103a, 103b and the resist pattern 110. The pattern interval S2 of the resist pattern 110 can be set smaller up to the limit of resolution in the photolithography process for forming the resist pattern 110.

Thereafter, photolithography is performed with the use of the resist pattern 110 as a mask to etch the gate electrode formation film 105A by a film thickness of Tetch, for example, 100 nm larger than a necessary film thickness Trem (Tecth>Trem). Etching in this time point allows the gate electrode formation film 105A to have a film thickness of Trem (for example, 50 nm), so that the step part 105c having a height as the film thickness Tetch is formed in the upper part of the gate electrode formation film 105A.

Figure 18A:
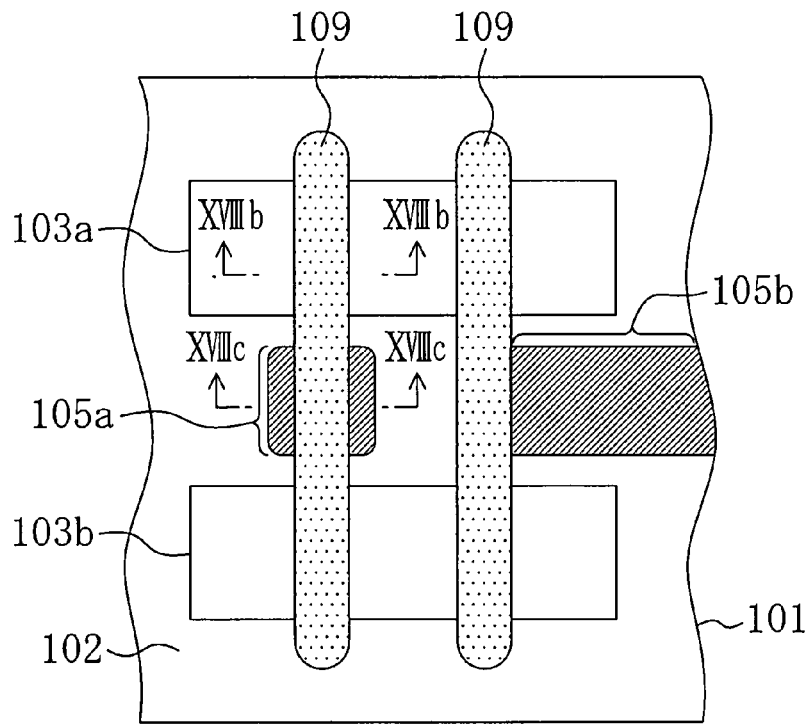
FIG. 18A is a plan view showing the semiconductor device manufacturing method in accordance with the modified example of Embodiment 2 of the present invention.
Figure 18B:
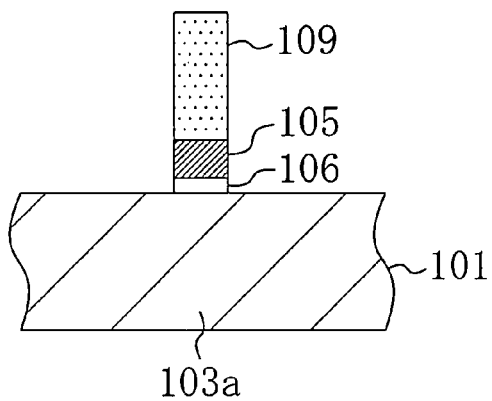
FIG. 18B is a sectional view taken along the line XVIIIb-XVIIIb in FIG. 18A.
Figure 18C:
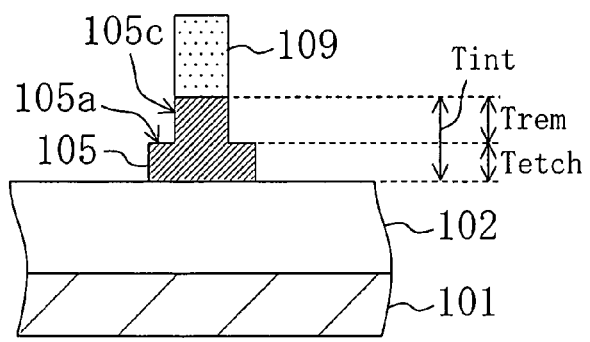
FIG. 18C is a sectional view taken along the line XVIIIc-XVIIIc in FIG. 18A.

Next, as shown in FIG. 18A, following removal of the resist pattern 110, photolithography is performed to form the resist pattern 109 across the active regions 103a, 103b and the isolation region 102 in the gate width direction on the gate electrode formation film 105A, and the gate electrode formation film 105A is etched by a film thickness Trem (=Tint−Tetch, for example, 50 nm) with the use of the thus formed resist pattern 109 as a mask, as shown in FIG. 18B (a sectional view taken along the line XVIIIb-XVIIIb in FIG. 18A) and FIG. 18C (a sectional view taken along the line XVIIIc-XVIIIc in FIG. 8A). In etching in this time point, the exposed part of the step part 105c, which also serves as a mask (a mask part), is removed by the film thickness Trem (for example, 50 nm) out of the film thickness Tint (for example, 150 nm) to have the film thickness of Tetch (for example, 100 nm). Herein, for etching the gate electrode formation film 105A by the film thickness Trem (for example, 50 nm), approximately 40% (for example, 20 nm) overetching is performed in order to eliminate etching residue, with a result that the remaining film has a film thickness Tetch of 80 nm. Preferably, the pattern for forming the resist pattern 109 has a linear contour. The linear contour causes no corner rounding phenomenon. Of course, the contour is not necessarily linear if variation in dimension involves no influence of the corner rounding phenomenon on the active regions. Then, the resist pattern 109 is removed to thus form the gate electrodes 105 including the gate contact region 105a or the wiring region 105b each including the step part 105c.

Figure 19A:
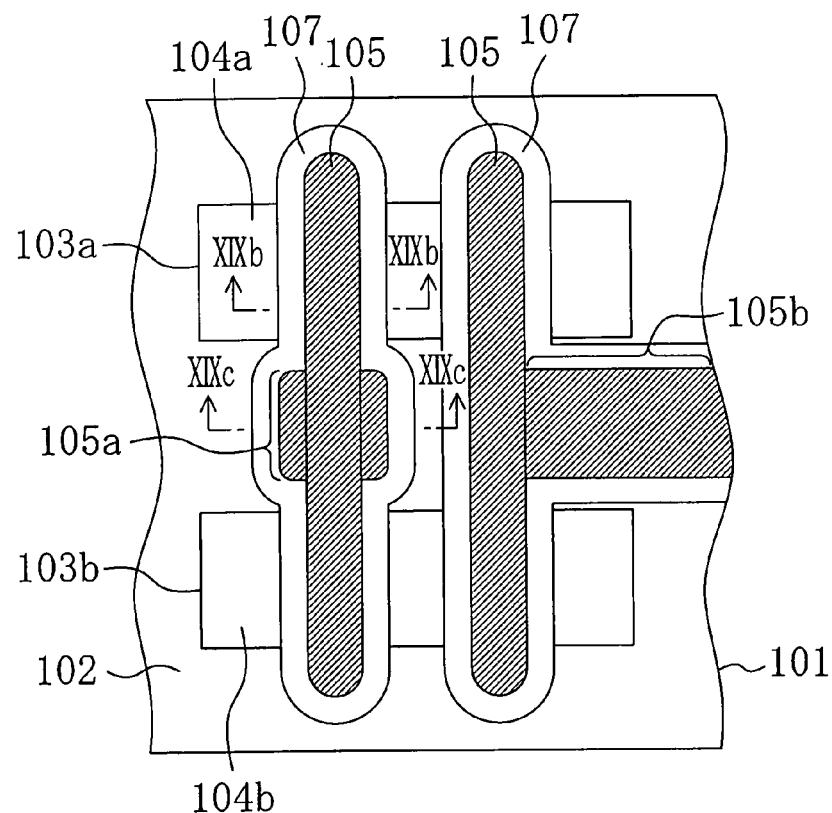
FIG. 19A is a plan view showing the semiconductor device manufacturing method in accordance with the modified example of Embodiment 2 of the present invention.
Figure 19B:
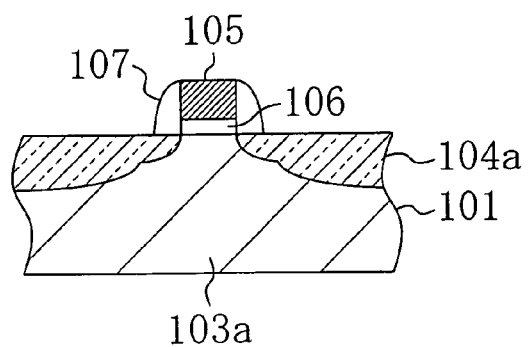
FIG. 19B is a sectional view taken along the line XIXb-XIXb in FIG. 19A.
Figure 19C:
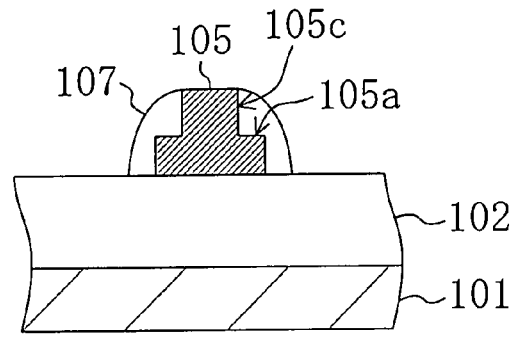
FIG. 19C is a sectional view taken along the line XIXc-XIXc in FIG. 19A.

Subsequently, similarly to the above description in Embodiment 1, the sidewall 107, the n-type source/drain regions 104a, and the p-type source/drain regions 104b are formed by known methods, thereby obtaining the semiconductor device shown in FIG. 19A to FIG. 19C. Though not shown, similarly to the structure shown in FIG. 12B, the gate electrodes 105 have a film thickness in the gate contact region 105a and the wiring region 105b on the isolation region 102 larger than a film thickness on the active regions 103a, 103b.

Embodiment 3

A semiconductor device in accordance with Embodiment 3 of the present invention will be described below.

Figure 20A:
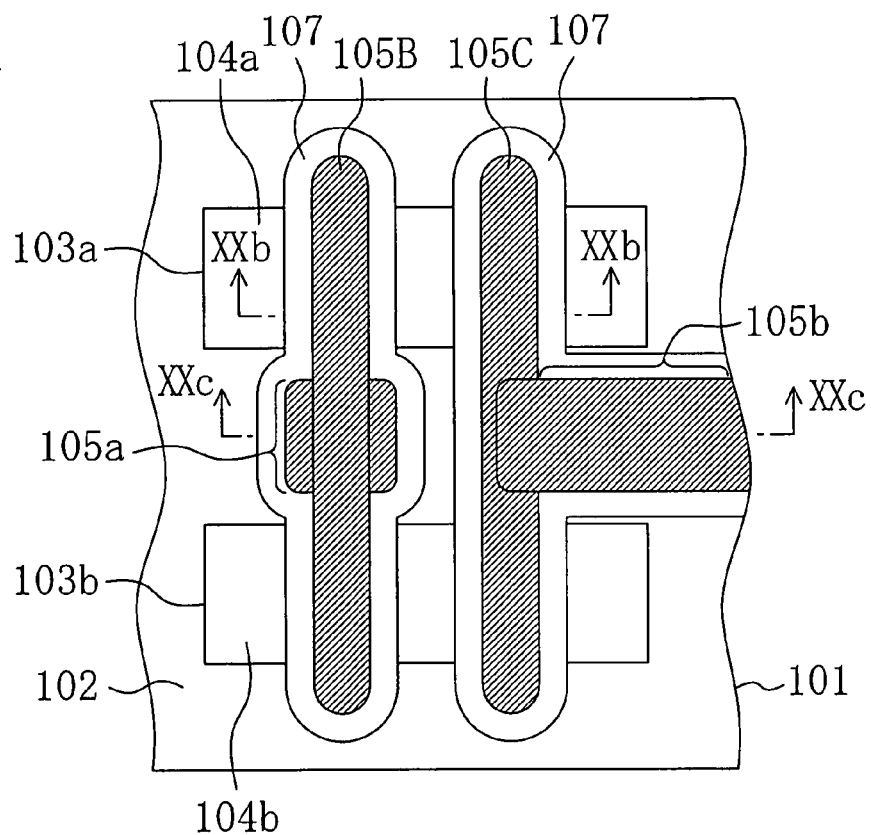
FIG. 20A is a plan view showing a structure of a semiconductor device in accordance with Embodiment 3 of the present invention.
Figure 20B:
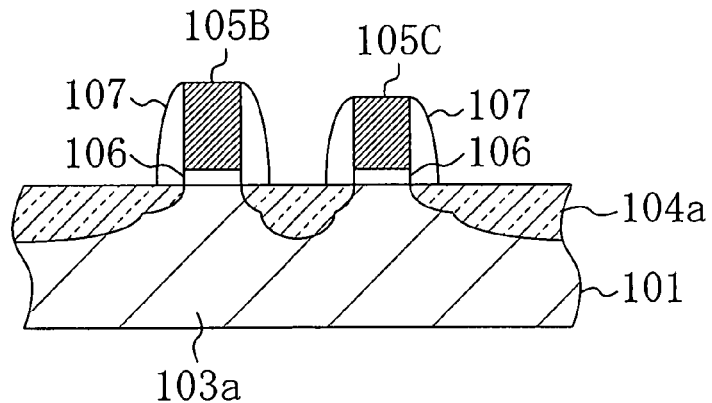
FIG. 20B is a sectional view taken along the line XXb-XXb in FIG. 20A.
Figure 20C:
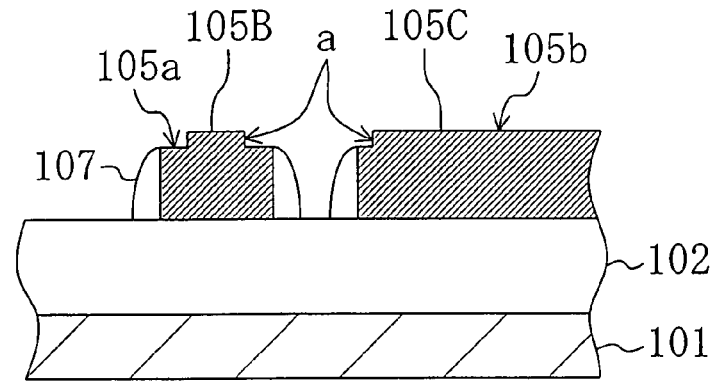
FIG. 20C is a sectional view taken along the line XXc-XXc in FIG. 20A.

FIG. 20A to FIG. 20C show a structure of the semiconductor device in accordance with Embodiment 3 of the present invention, wherein FIG. 20A is a plan view, FIG. 20B is a sectional view taken along the line XXb-XXb in FIG. 20A, and FIG. 20C is a sectional view taken along the line XXc-XXc in FIG. 20A. The present embodiment describes the case where an n-type MIS transistor is formed in an active region 103a while an p-type MIS transistor is formed in an active region 103b.

As shown in FIG. 20A, in a semiconductor substrate 101 made of, for example, silicon, there are formed an isolation region 102, the active region 103a including a p well (not shown) and surrounded by the isolation region 102, and the active region 103b including an n well (not shown) and surrounded by the isolation region 102. Further, n-type source/drain regions 104a are formed in the upper parts of the active region 103a while p-type source/drain regions 104b are formed in the upper parts of the active region 103b. Gate electrodes 105B and 105C are formed across the active region 103a and the active region 103b in the gate width direction with the isolation region 102 interposed on the semiconductor substrate 101. Each gate electrode 105B, 105C is formed of a layered film of polysilicon or metal silicide and polysilicon, a silicide film, a metal film, or the like, for example. The gate electrode 105B includes a contact region 105a to serve as a lead part while the gate electrode 105C includes a wiring region 105b to serve as a lead part. A sidewall 107 made of, for example, a silicon nitride film is continuously formed on each side face of each gate electrode 105B, 105C. Each n-type source/drain region 104a is composed of an n-type source/drain diffusion layer (an n-type extension region or an n-type LDD region) having a comparatively shallow junction and formed on each side of each gate electrode 105B, 105C in the active region 103a and an n-type source/drain diffusion region having a comparatively deep junction and formed on the outer side of each sidewall 107 in the active region 103a. As well, each p-type source/drain region 104b is composed of a p-type source/drain diffusion layer (a p-type extension region or a p-type LDD region) having a comparatively shallow junction and formed on each side of each gate electrode 105B, 105C in the active region 103b and a p-type source/ drain diffusion region having a comparatively deep junction and formed on the outer side of each sidewall 107 in the active region 103b. The sidewall 107 may be formed of a layered film of, for example, a silicon oxide film and a silicon nitride film.

Referring to the sectional view of FIG. 20B, the gate electrodes 105B, 105C are formed across the active regions 103a, 103b in the gate width direction with the insulation region 102 interposed on the semiconductor substrate 101, and a gate insulating film 106 made of, for example, SiON is present below each gate electrode 105B, 105C on the active regions 103a, 103b.

Referring to another sectional view of FIG. 20C, the isolation region 102 is formed in the upper part of the semiconductor substrate 101. On the isolation region 102, there are formed the gate electrode 105B including the gate contact region 105a and the gate electrode 105C including the wiring region 105b.

Each gate electrode 105B, 105C in Embodiment 3 includes a step part a above the isolation region 102, as shown in FIG. 20C. Specifically, the gate electrode 105B includes a part of the gate contact region 105a which has a film thickness smaller than that above the active regions 103a, 103b, and the gate electrode 105C includes a part of the wiring region 105b which has a film thickness larger than that above the active regions 103a, 103b. The film thickness of the gate electrode 105B on the active regions 103a, 103b is larger than that of the gate electrode 105C on the active regions 103a, 103b.

With the gate electrodes 105B, 105C having the above structures, the corner rounding phenomenon is suppressed. This allows the gate contact region 105a and the wiring region 105b to be arranged close to the active regions 103a, 103b with variation in transistor characteristics prevented and allows adjacent gate electrodes to be arranged close to each other with the gate electrodes, which is caused due to increased width of the gate contact region 105a, suppressed. Hence, higher integration is enabled.

A method for manufacturing the semiconductor device in accordance with Embodiment 3 of the present invention will be described below.

FIG. 21A, FIG. 21B, FIG. 22A to FIG. 22C, and FIG. 23A to FIG. 23C are views for explaining the semiconductor device manufacturing method in accordance with Embodiment 3 of the present invention. One of the significant features of the semiconductor device manufacturing method in accordance with Embodiment 3 lies in that the gate electrode 105B including the gate contact region 105a is formed by using the resist patterns in the same order as in Embodiment 1 while the gate electrode 105C including the wiring region 105b is formed by using the resist patterns in the same order as in Embodiment 2, in contrast to the semiconductor device manufacturing methods in Embodiments 1 and 2.

First, as shown in FIG. 21A, the isolation region 102 is selectively formed in the semiconductor substrate 101 made of, for example, silicon by STI (Shallow Trench Isolation) or the like. Then, ion implantation is performed to form the p well (not shown) and the n well (not shown) in the semiconductor substrate 101. This forms the active region 103a including the p well and the active region 103b including the n well which are surrounded by the isolation region 102.

Next, as shown in FIG. 21B, a gate insluting film formation film (not shown) made of, for example, SiON is formed on each active region 103a, 103b, and then, a gate electrode formation film 105A made of, for example, polysilicon and having a film thickness of 150 nm and a mask film 108 formed of, for example, an oxide film and having a film thickness of 50 nm are formed in this order on the isolation region 102 and the gate insulating film formation film by CVD (Chemical Vapor Deposition) or the like. In general, though not shown herein, polysilicon of the gate electrode formation film 105A is subjected to ion implantation and thermal treatment for activation. The mask film 108 may be formed of a film made of any suitable material having selectivity in etching the gate electrode formation film 105A, other than the oxide film, such as a nitride film, an organic film, or the like.

Figure 22A:
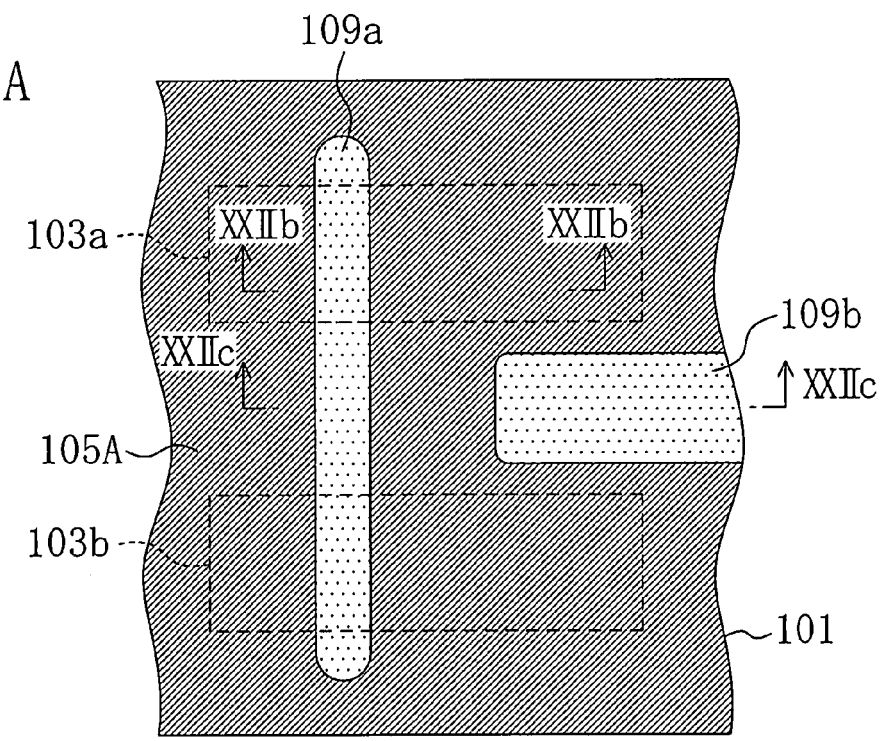
FIG. 22A is a plan view showing the semiconductor device manufacturing method in accordance with Embodiment 3 of the present invention.
Figure 22B:
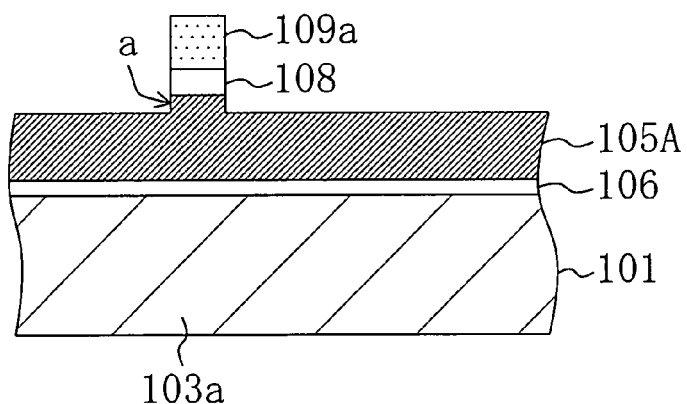
FIG. 22B is a sectional view taken along the line XXIIb-XXIIb in FIG. 22A.
Figure 22C:
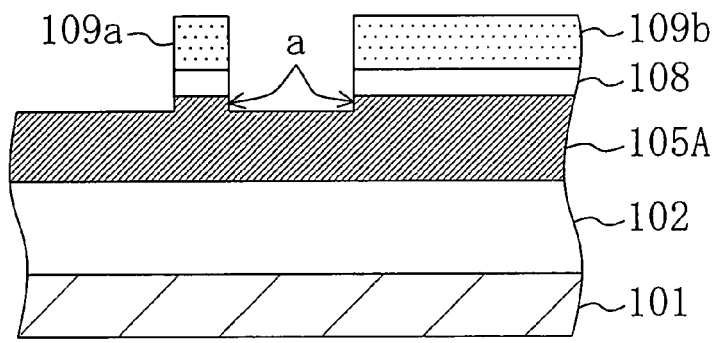
FIG. 22C is a sectional view taken along the line XXIIc-XXIIc in FIG. 22A.

Subsequently, as shown in FIG. 22A, photolithography is performed to form a resist pattern 109a across the active regions 103a, 103b and the isolation region 102 (a part of the isolation region which is located between the active regions 103a and 103b) and a resist pattern 109b for forming the wiring region 105b on a part of the mask film 108 which is located on the isolation region 102. Then, the mask film 108 is etched with the use of the resist patterns 109a, 109b as a mask. In etching in this point, as shown in FIG. 22B (a sectional view taken along the line XXIIb-XXIIb in FIG. 22A) and FIG. 22C (a sectional view taken along the line XXIIc-XXIIc in FIG. 22A), the surface portion of the gate electrode formation film 105A is slightly etched to form a step part a. Preferably, each pattern for forming the resist patterns 109a, 109b has a linear contour. The linear contour causes no corner rounding phenomenon. Of course, each contour is not necessarily linear if variation in dimension involves no influence of the corner rounding phenomenon on the active regions. The resist pattern 109b is not formed above the active region 103a, 103b. This permits patterning of the resist pattern 109b without taking into consideration the region on the active regions 103a, 103b where the gate active regions 103a, 103b are formed, and accordingly, the distance S1 between each edge of the active regions 103a, 103b and each opposed edge of the resist pattern 110 may be 0 or larger. Actually, it can be approximated to a root-mean-square of dimensional variation and alignment variation of the active regions 103a, 103b and the resist pattern 110. As well, the distance between the resist patterns 109a and 109b can be set smaller theoretically up to the limit of resolution in the photolithography process for forming the resist patterns 109a, 109b. Optimization of the conditions for etching the mask film 108 eliminates the need for formation of the step part a on the surface portion of the gate electrode formation film 105A.

Figure 23A:
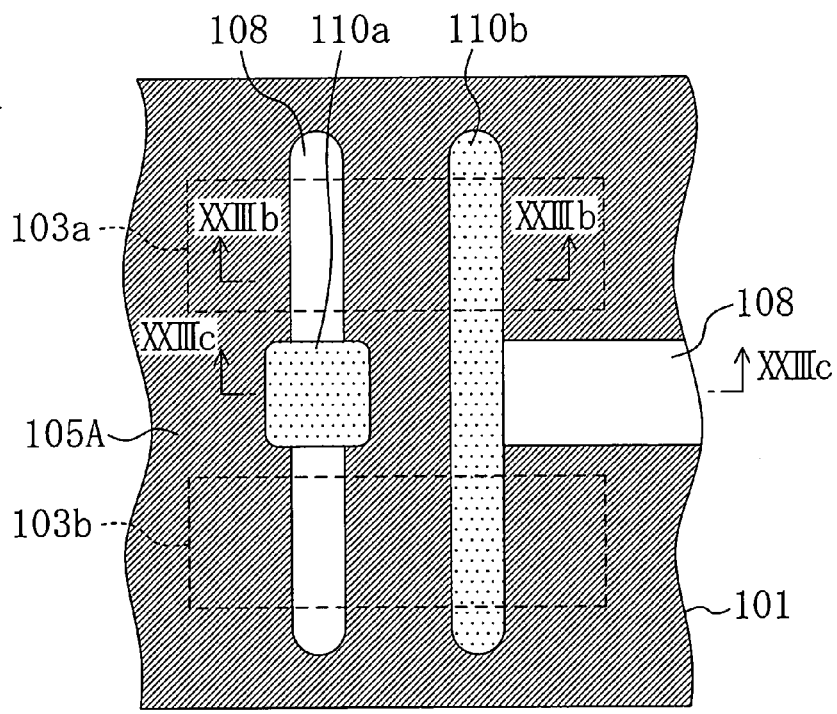
FIG. 23A is a plan view showing the semiconductor device manufacturing method in accordance with Embodiment 3 of the present invention.

Thereafter, as shown in FIG. 23A, photolithography is performed to form a resist pattern 110a for forming the gate contact region 105a on a part of the mask film 108 which is located on the isolation region 102 and a resist pattern 110b across the active regions 103a, 103b and the isolation region 102 (a part of the isolation region which is located between the active regions 103a and 103b) on the gate electrode formation film 105A and the mask film 108. The resist pattern 110a is not formed on the active regions 103a, 103b. This permits patterning of the resist pattern 110a without taking into consideration the region on the active regions 103a, 103b where the gate electrodes 105B are formed, and accordingly, the distance between each edge of the active regions 103a, 103b and each opposed edge of the resist pattern 110a may be 0 or larger, similarly to those in Embodiments 1 and 2. Actually, it can be approximated to a root-mean-square of dimensional variation and alignment variation of the active regions 103a, 103b and the resist pattern 110a. Further, the distance between the resist patterns 110a and 110b can be set smaller up to the limit of resolution in the photolithography process for forming the resist patterns 110a, 110b. The resist pattern 101b is formed so as to overlap with a part of the mask film 108 so that a combination of the resist pattern 110b and the mask film 108 forms a desired gate electrode pattern. Preferably, each pattern for forming the resist patterns 110a, 110b has a linear contour. The linear contour causes no corner rounding phenomenon. Of course, each contour is not necessarily linear if variation in dimension involves no influence of the corner rounding phenomenon on the active regions.

Figure 23B:
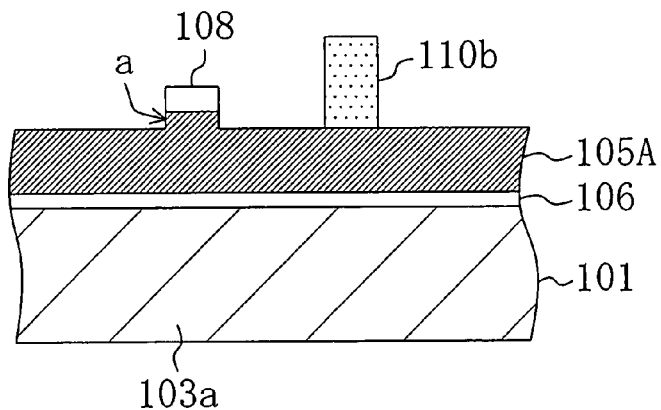
FIG. 23B is a sectional view taken along the line XXIIIb-XXIIIb in FIG. 23A.
Figure 23C:
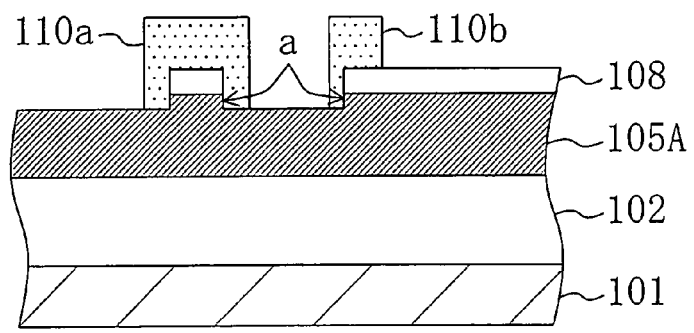
FIG. 23C is a sectional view taken along the line XXIIIc-XXIIIc in FIG. 23A.

Next, as shown in FIG. 23B, the gate electrode formation film 105A is etched with the use of the mask film 108 on the step part a of the gate electrode formation film 105A and the resist patterns 110a, 110b as a mask (a mask part), and then, the resist patterns 110a, 110b are removed. This forms the gate electrode 105B including the gate contact region 105a and the gate electrode 105C including the wiring region 105b on each of which the mask film 108 is formed.

The mask film 108 formed of an oxide film is used as a mask herein. With the use of the mask film 108 formed of an oxide film or a nitride film, impurity generation from a resist material in etching can be suppressed to thus increase dimension controllability.

Subsequently, similarly to the above description in Embodiment 1, the mask film 108 is remove, and the sidewall 107, the n-type source/drain regions 104a, and the p-type source/drain regions 104b are formed by known methods, thereby obtaining the semiconductor device shown in FIG. 20A to FIG. 20B. The mechanism of removal of the mask film 108 is the same as that described in Embodiment 1.

Modified Example 1 of Embodiment 3

A semiconductor device in accordance with Modified Example 1 of Embodiment 3 of the present invention will be described below.

Figure 24A:
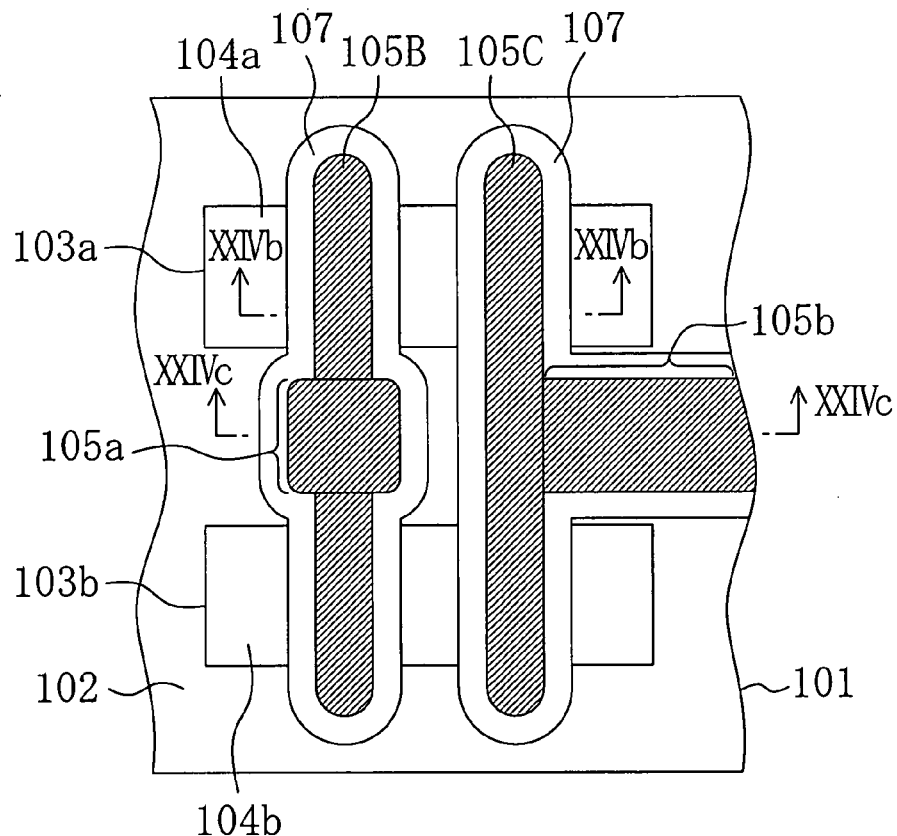
FIG. 24A is a plan view showing a structure of a semiconductor device in accordance with Modified Example 1 of Embodiment 3 of the present invention.
Figure 24B:
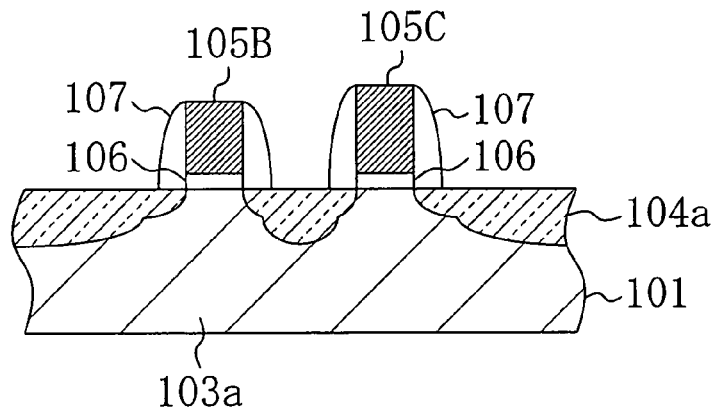
FIG. 24B is a sectional view taken along the line XXIVb-XXIVb in FIG. 24A.
Figure 24C:
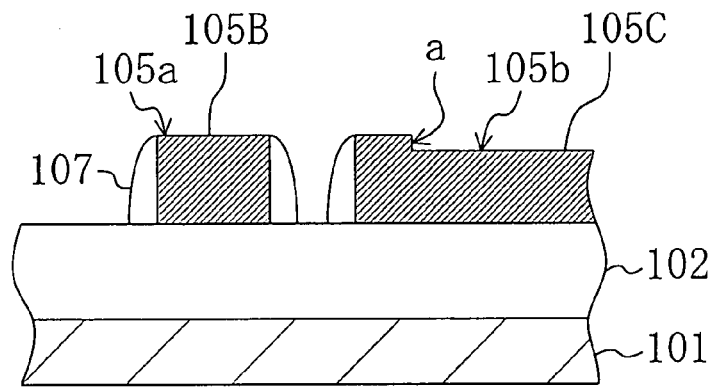
FIG. 24C is a sectional view taken along the line XXIVc-XXIVc in FIG. 24A.

FIG. 24A to FIG. 24C are views showing a structure of the semiconductor device in accordance with Modified Example 1 of Embodiment 3 of the present invention, wherein FIG. 24A is a plan view, FIG. 24B is a sectional view taken along the line XXIVb-XXIVb in FIG. 24A, and FIG. 24C is a sectional view taken along the line XXIVc-XXIVc in FIG. 24A.

The semiconductor device in accordance with Modified Example 1 of Embodiment 3 shown in FIG. 24A to FIG. 24C is different from that shown in FIG. 20A to FIG. 20C in that: the film thickness of a gate contact region 105a of a gate electrode 105B is larger than that of the gate electrode 105B on the active regions 103a, 103b while the film thickness of the wiring region 105b of a gate electrode 105C is smaller than that of the gate electrode 105C on the active regions 103a, 103b (see FIG. 24A and FIG. 24C); and the film thickness of the gate electrode 105B on the active regions 103a, 103b is smaller than that of the gate electrode 105C thereon (see FIG. 24B). The other part of the structure of the semiconductor device in Modified Example 1 is the same as that shown in FIG. 20A to FIG. 20C.

A method for manufacturing the semiconductor device in accordance with Modified Example 1 of Embodiment 3 of the present invention will be described below.

Figure 25A:
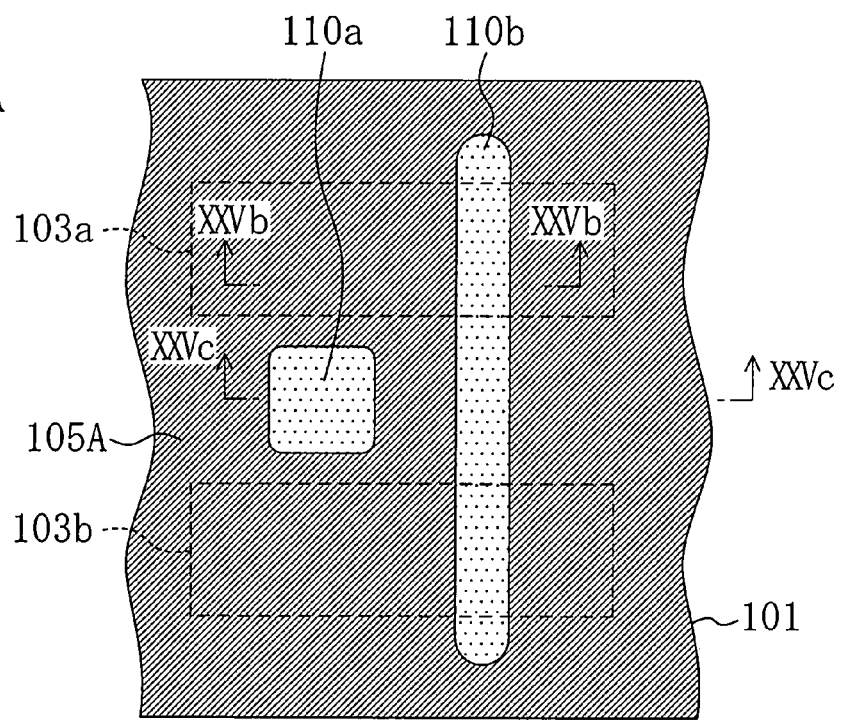
FIG. 25A is a plan view showing a semiconductor device manufacturing method in accordance with Modified Example 1 of Embodiment 3 of the present invention.
Figure 25B:
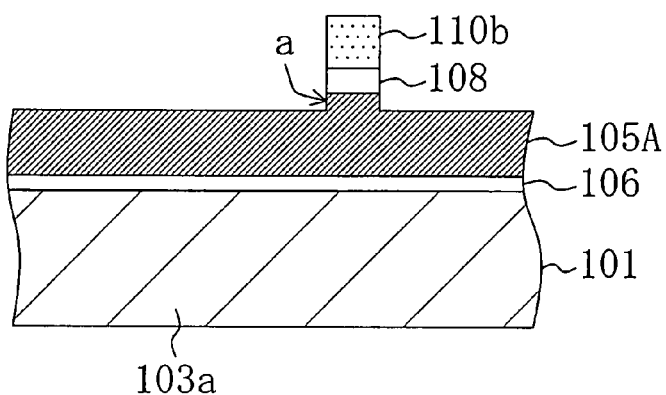
FIG. 25B is a sectional view taken along the line XXVb-XXVb in FIG. 25A.
Figure 25C:
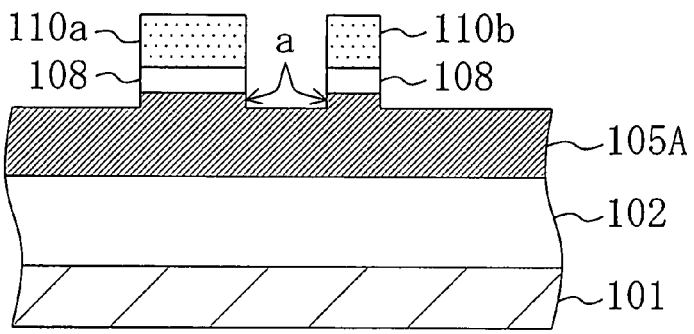
FIG. 25C is a sectional view taken along the line XXVc-XXVc in FIG. 25A.
Figure 26A:
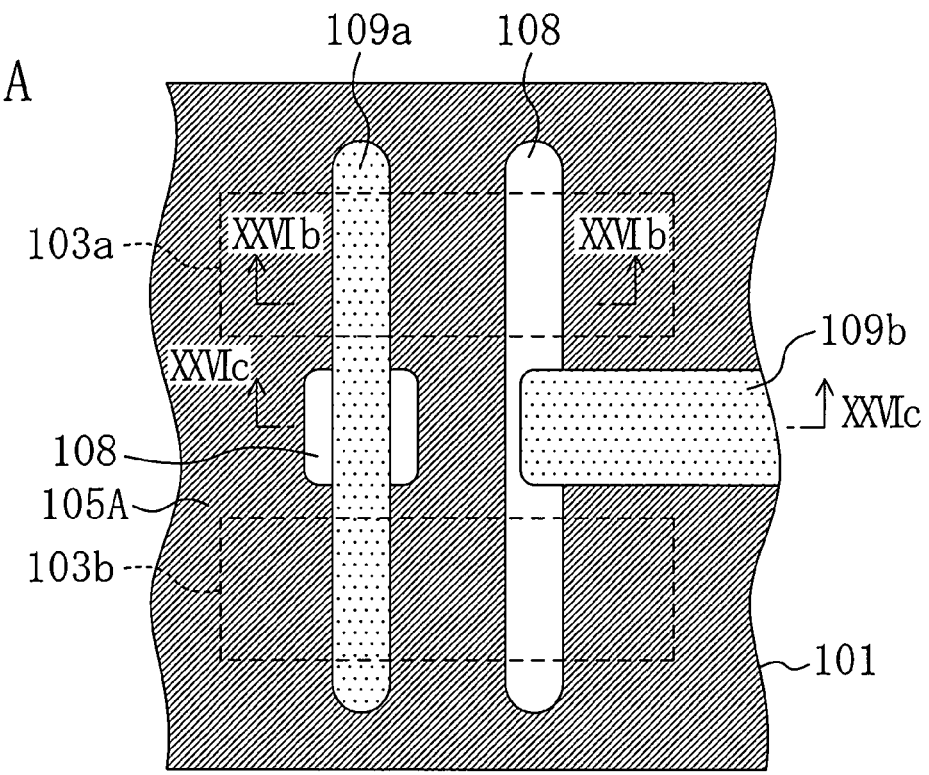
FIG. 26A is a plan view showing the semiconductor device manufacturing method in accordance with Modified Example 1 of Embodiment 3 of the present invention.
Figure 26B:
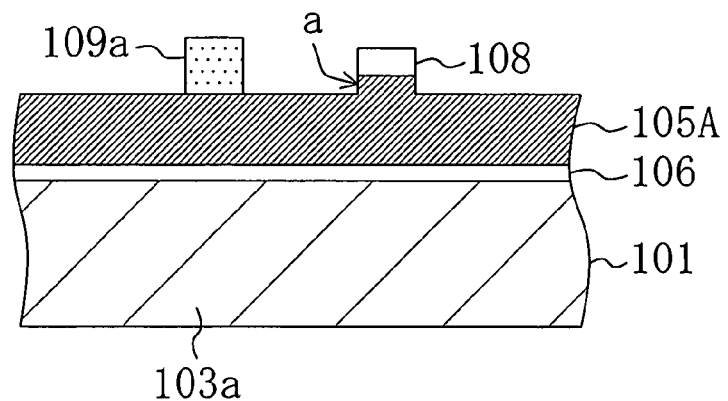
FIG. 26B is a sectional view taken along the line XXVIb-XXVIb in FIG. 26A.
Figure 26C:
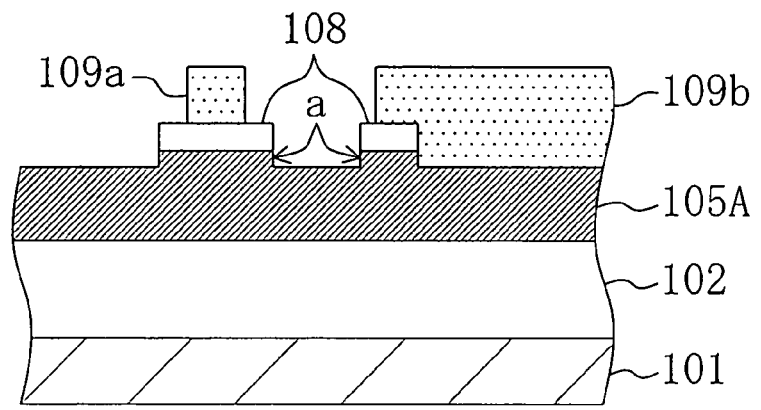
FIG. 26C is a sectional view taken along the line XXVIc-XXVIc in FIG. 26A.

FIG. 25A to FIG. 25C and FIG. 26A to FIG. 26C are views for explaining the semiconductor device manufacturing method in accordance with Modified Example 1 of Embodiment 3 of the present invention. Wherein, FIG. 25A and FIG. 26A are plan views, FIG. 25B is a sectional view taken along the line XXVb-XXVb in FIG. 25A, FIG. 25C is a sectional view taken along the line XXVc-XXVc in FIG. 25A, FIG. 26B is a sectional view taken along the line XXVIb-XXVIb in FIG. 26A, and FIG. 26C is a sectional view taken along the line XXVIc-XXVIc in FIG. 26A.

The semiconductor device manufacturing method in Modified Example 1 has a significant feature that: the gate electrode 105B including the gate contact region 105a is formed by using the resist patterns in the same order as in Embodiment 2 while the gate electrode 105C including the wiring region 105b is formed by using the same resist patterns in the same order as in Embodiment 1, in contrast to the semiconductor device manufacturing methods in Embodiments 1 and 2.

Specifically, in the semiconductor device manufacturing method in Modified Example 1, as shown in FIG. 25A to FIG. 25C and FIG. 26A to FIG. 26C, the patterning using the resist patterns 110a, 110b and patterning using the resist patterns 109a, 109b are performed in the reversed order of that in the semiconductor device manufacturing methods shown in FIG. 21A, FIG. 21B, FIG. 22A to FIG. 22C, and FIG. 23A to FIG. 23C, and the other steps are the same. Through these steps, the semiconductor device having the structure shown in FIG. 24A to FIG. 24C can be obtained.

Modified Example 2 of Embodiment 3

Semiconductor devices in accordance with Modified Example 2 of Embodiment 3 of the present invention will be described below.

Figure 27A:
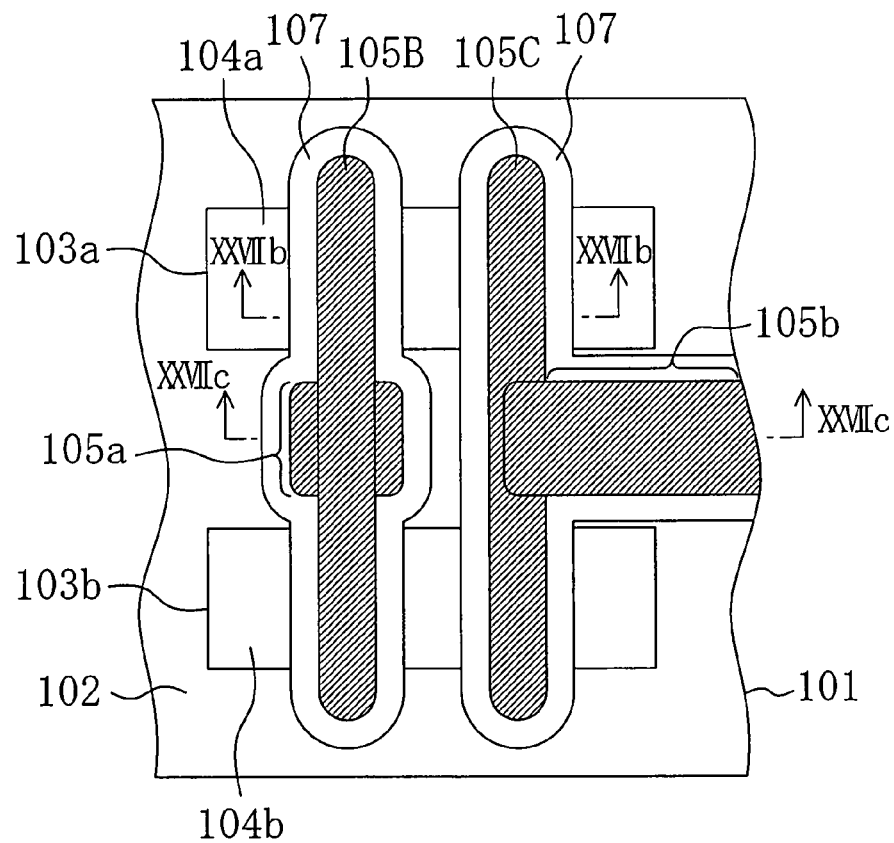
FIG. 27A is a plan view showing a semiconductor device manufacturing method in accordance with Modified Example 2 of Embodiment 3 of the present invention.
Figure 27B:
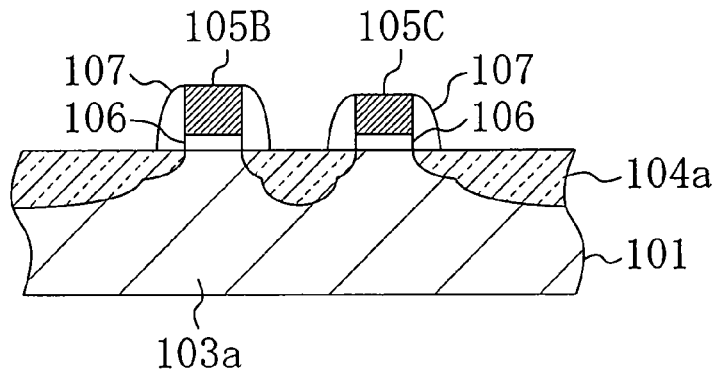
FIG. 27B is a sectional view taken along the line XXVIIb-XXVIIb in FIG. 27A.
Figure 27C:
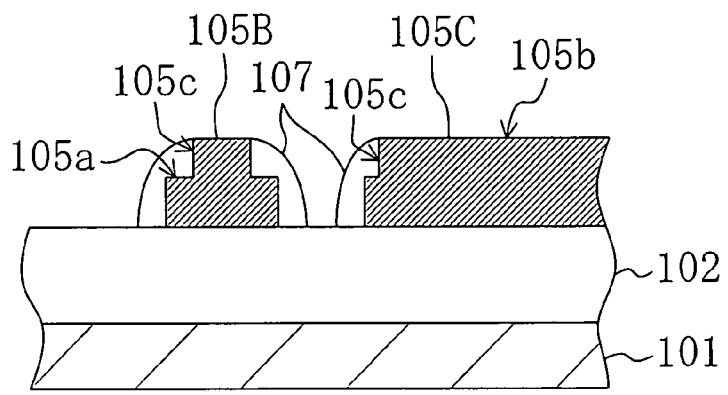
FIG. 27C is a sectional view taken along the line XXVIIc-XXVIIc in FIG. 27A.
Figure 28A:
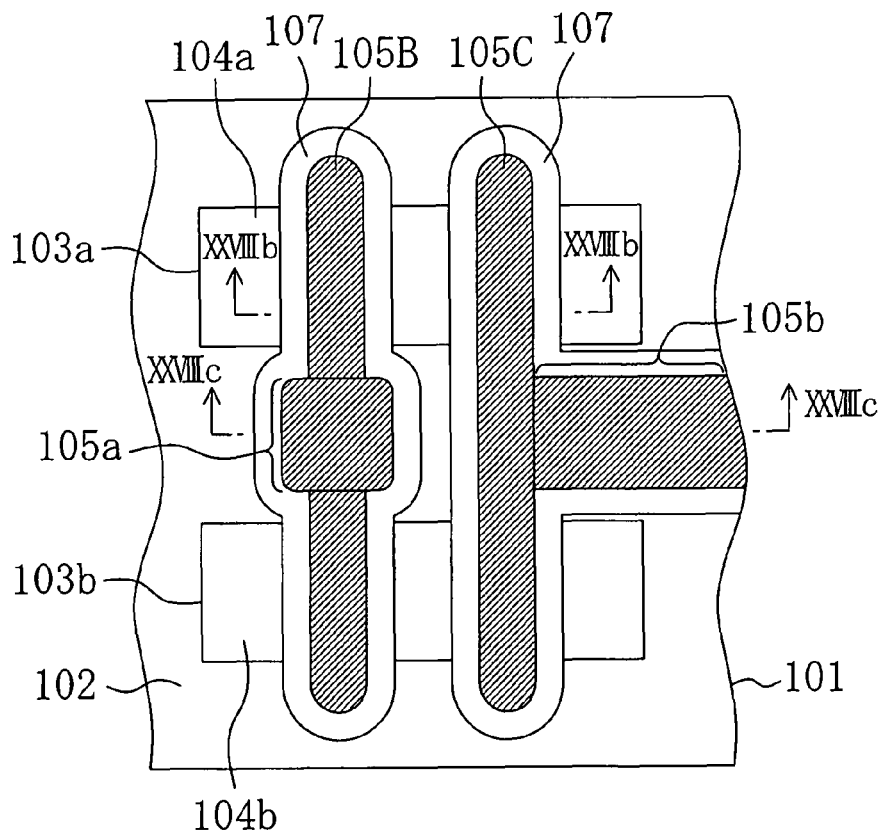
FIG. 28A is a plan view showing the semiconductor device manufacturing method in accordance with Modified Example 2 of Embodiment 3 of the present invention.
Figure 28B:
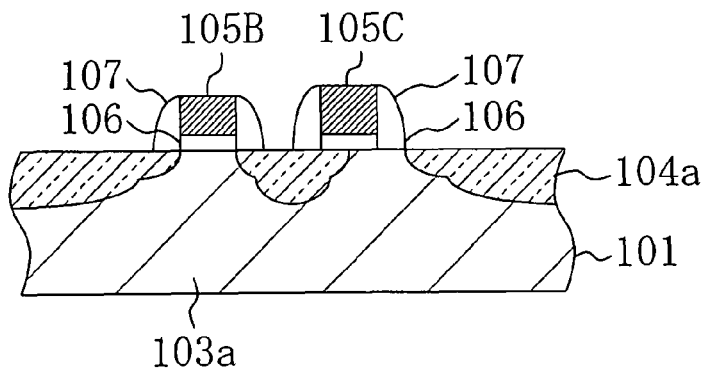
FIG. 28B is a sectional view taken along the line XXVIIIb-XXVIIIb in FIG. 28A.
Figure 28C:
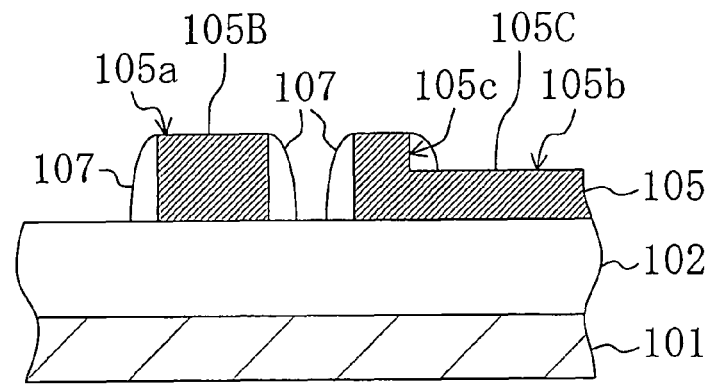
FIG. 28C is a sectional view taken along the line XXVIIIc-XXVIIIc in FIG. 28A.

FIG. 27A to FIG. 27C and FIG. 28A to FIG. 28C are views showing structures of the semiconductor devices in accordance with Modified Example 2 of Embodiment 3 of the present invention. Wherein, FIG. 27A and FIG. 28A are plan views, FIG. 27B is a sectional view taken along the line XXVIIb-XXVIIb in FIG. 27A, FIG. 27C is a sectional view taken along the line XXVIIc-XXVIIc in FIG. 27A, FIG. 28B is a sectional view taken along the line XXVIIIb-XXVIIIb in FIG. 28A, and FIG. 28C is a sectional view taken along the line XXVIIIc-XXVIIIc in FIG. 28A.

The structure of the semiconductor device shown in FIG. 27A to FIG. 27C can be obtained by the semiconductor device manufacturing method shown in FIG. 21A, FIG. 21B, FIG. 22A to FIG. 22C, and FIG. 23A to FIG. 23C in the present embodiment in which no mask film is used, similarly to each modified example of Embodiments 1 and 2. A specific method for manufacturing the semiconductor device shown in FIG. 27A to FIG. 27C can be inferred easily from the description with reference to FIG. 21A, FIG. 21B, FIG. 22A to FIG. 22C, and FIG. 23A to FIG. 23C in the present embodiment and the description in each modified example of Embodiments 1 and 2, and therefore, the description thereof is omitted.

As well, the structure of the semiconductor device shown in FIG. 28A to FIG. 28C can be obtained by the semiconductor device manufacturing method shown in FIG. 25A to FIG. 25C and FIG. 26A to FIG. 26C in Modified Example 1 of the present embodiment in which no mask film is used, similarly to each modified example of Embodiments 1 and 2. A specific method for manufacturing the semiconductor device shown in FIG. 28A to FIG. 28C can be inferred easily from the description with reference to FIG. 25A to 25C and FIG. 26A to FIG. 26C in Modified Example 1 of the present embodiment and the description in each modified example of Embodiments 1 and 2, and therefore, the description thereof is omitted.

Embodiment 4

A semiconductor device in accordance with Embodiment 4 of the present invention will be described below.

Figure 29A:
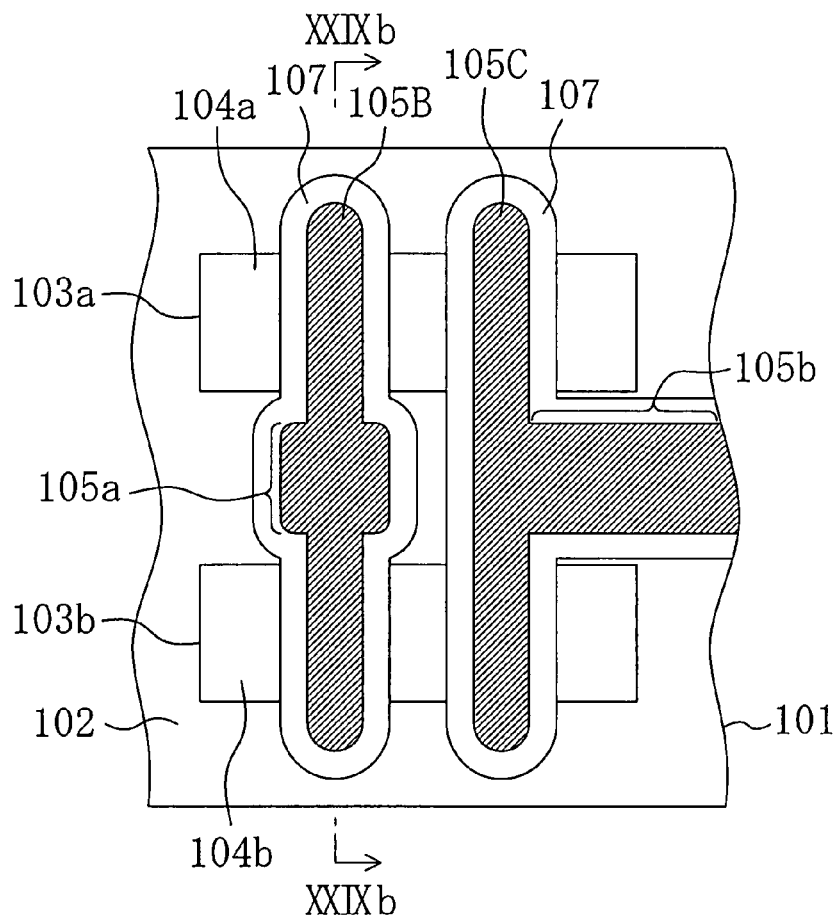
FIG. 29A is a plan view showing a structure of a semiconductor device in accordance with Embodiment 4 of the present invention and FIG. 29B is a sectional view taken along the line XXIXb-XXIXb in FIG. 29A.
Figure 29B:
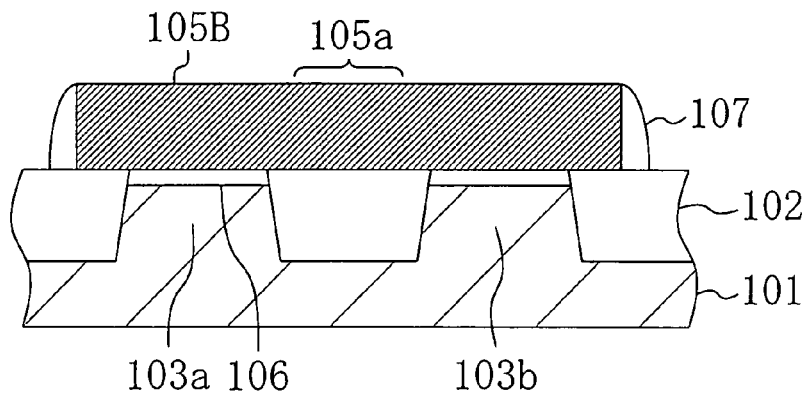

FIG. 29A and FIG. 29B show a structure of the semiconductor device in accordance with Embodiment 4 of the present invention, wherein FIG. 29A is a plan view, and FIG. 9B is a sectional view taken along the line XXIXb-XXIXb in FIG. 29A. The present embodiment refers to the case where an n-type MIS transistor is formed in an active region 103a while an p-type MIS transistor is formed in an active region 103b.

As shown in FIG. 29A, in a semiconductor substrate 101 made of, for example, silicon, there are formed an isolation region 102, the active region 103a including a p well (not shown) and surrounded by the isolation region 102, and the active region 103b including an n well (not shown) and surrounded by the isolation region 102. Further, n-type source/drain regions 104a are formed in the upper parts of the active region 103a while p-type source/drain regions 104b are formed in the upper parts of the active region 103b. Gate electrodes 105B, 105C are formed across the active region 103a and the active region 103b in the gate width direction with the isolation region 102 interposed on the semiconductor substrate 101. Each gate electrode 105B, 105C is formed of a layered film of polysilicon or metal silicide and polysilicon, a silicide film, a metal film, or the like, for example. The gate electrode 105B includes a contact region 105a to serve as a lead part while the gate electrode 105C includes a wiring region 105b to serve as a lead part. A sidewall 107 made of, for example, a silicon nitride film is continuously formed on each side face of each gate electrode 105B, 105C. Each n-type source/drain region 104a is composed of an n-type source/drain diffusion layer (an n-type extension region or an n-type LDD region) having a comparatively shallow junction and formed on each side of each gate electrode 105B, 105C in the active region 103a and an n-type source/drain diffusion region having a comparatively deep junction and formed on the outer side of each sidewall 107 in the active region 103b. As well, each p-type source/drain regions 104b is composed of a p-type source/drain diffusion layer (a p-type extension region or a p-type LDD region) having a comparatively shallow junction and formed on each side of each gate electrode 105B, 105C in the active region 103b and a p-type source/drain diffusion region having a comparatively deep junction and formed on the outer side of each sidewall 107 in the active region 103b. The sidewall 107 may be formed of a layered film of, for example, a silicon oxide film and a silicon nitride film.

Referring to FIG. 29B, the gate electrode 105B is formed across the active regions 103a, 103b in the gate width direction with the insulation region 102 interposed on the semiconductor substrate 101, and a gate insulating film 106 made of, for example, SiON is present below the gate electrode 105B on the active regions 103a, 103b.

With the gate electrodes 105B, 105C having the above structures, the corner rounding phenomenon is suppressed. This allows the gate contact region 105a and the wiring region 105b to be arranged close to the active regions 103a, 103b with variation in transistor characteristics suppressed and allows adjacent gate electrodes to be arranged close to each other with short-circuit of the gate electrodes, which is caused due to increased width of the gate contact region 105a, suppressed. Hence, higher integration is enabled. Further, in the semiconductor in the present embodiment, the gate electrodes 105B, 105C have no step part unlike those in Embodiments 1 to 3, thereby preventing disconnection of a silicide layer in forming the silicide layer on each gate electrode 105B, 105C.

A method for manufacturing the semiconductor device in accordance with Embodiment 4 of the present invention will be described below.

Figure 32A:
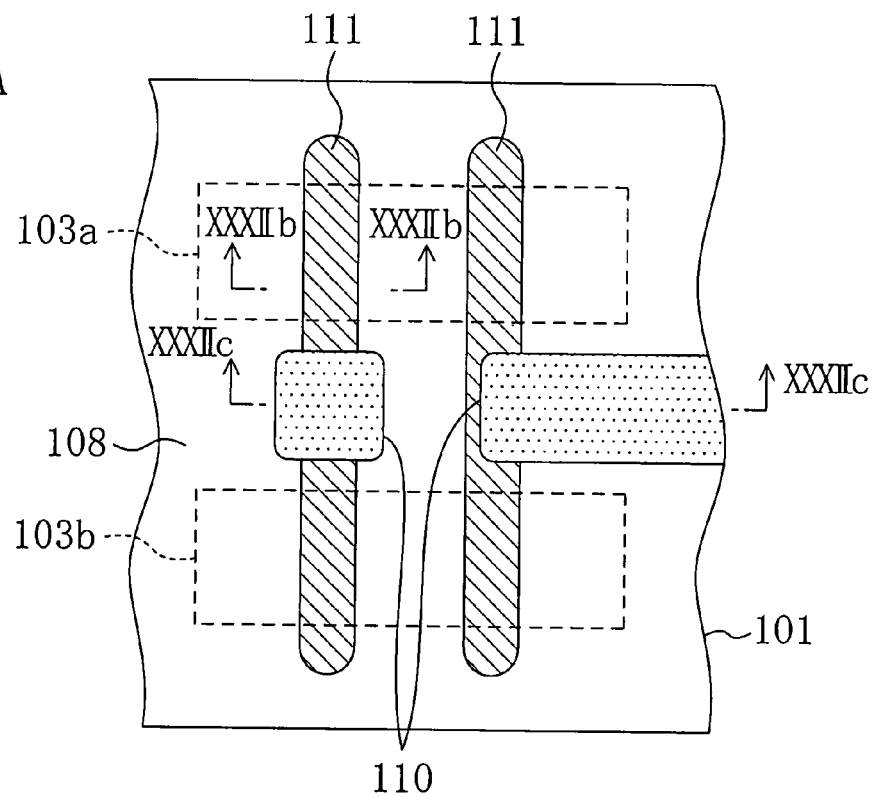
FIG. 32A is a plan view showing the semiconductor device manufacturing method in accordance with Embodiment 4 of the present invention.
Figure 32B:
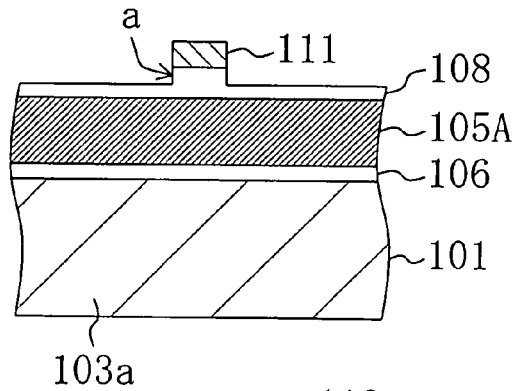
FIG. 32B is a sectional view taken along the line XXXIIb-XXXIIb in FIG. 32A.
Figure 32C:
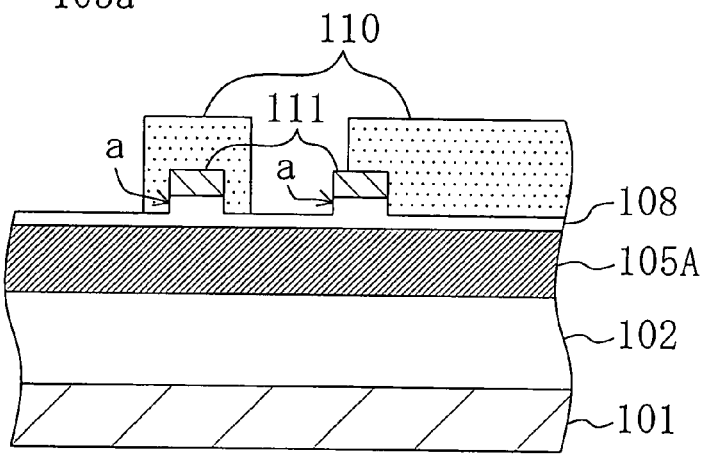
FIG. 32C is a sectional view taken along the line XXXIIc-XXXIIc in FIG. 32A.
Figure 33A:
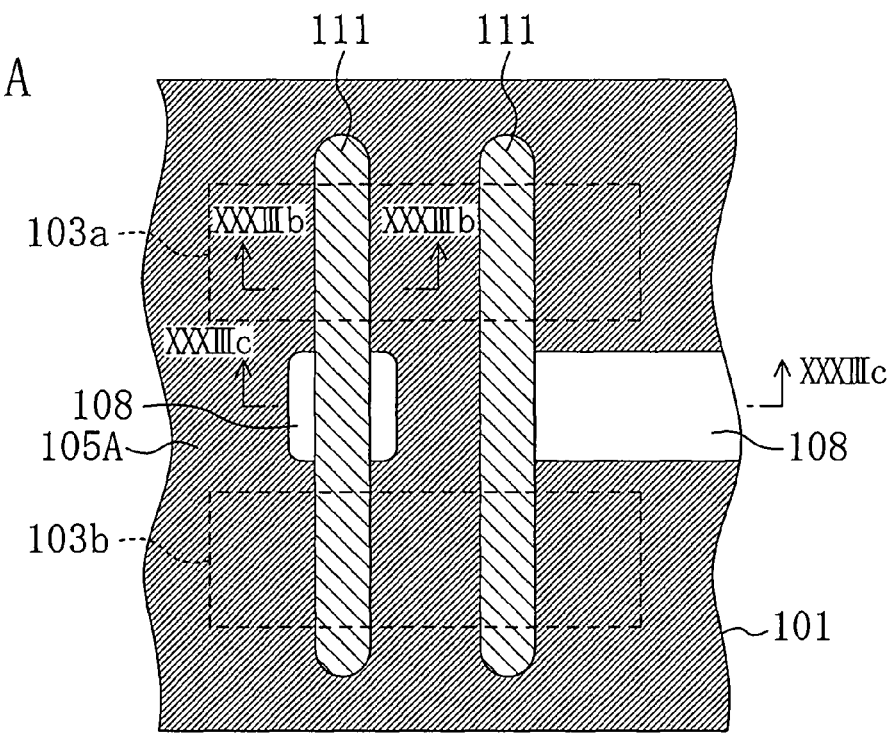
FIG. 33A is a plan view showing the semiconductor device manufacturing method in accordance with Embodiment 4 of the present invention.
Figure 33B:
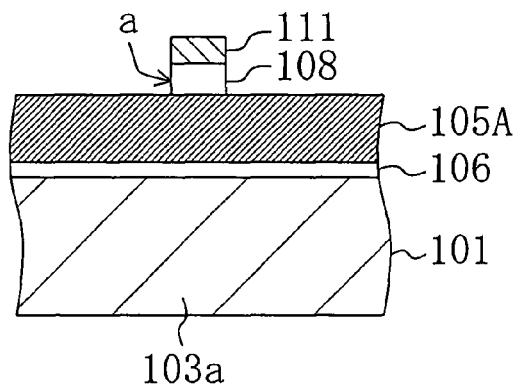
FIG. 33B is a sectional view taken along the line XXXIIIb-XXXIIIb in FIG. 33A.
Figure 33C:
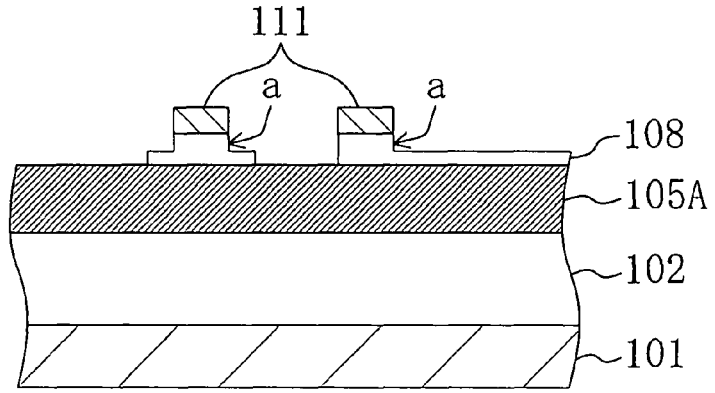
FIG. 33C is a sectional view taken along the line XXXIIIc-XXXIIIc in FIG. 33A.
Figure 34A:
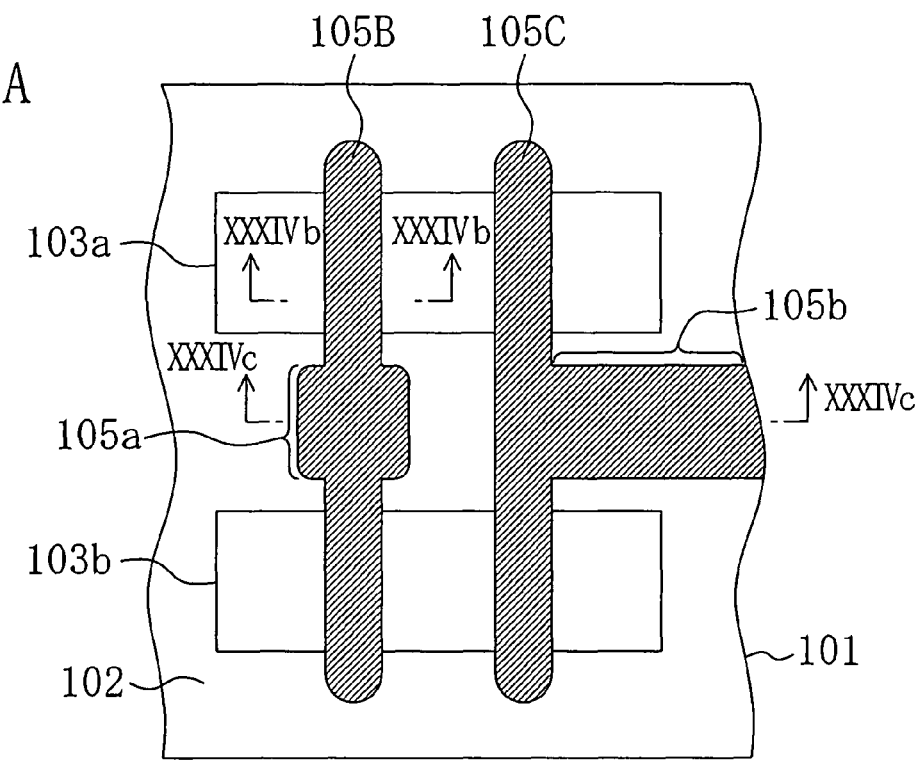
FIG. 34A is a plan view showing the semiconductor device manufacturing method in accordance with Embodiment 4 of the present invention.
Figure 34B:
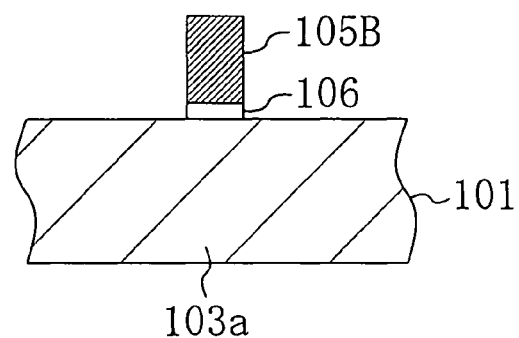
FIG. 34B is a sectional view taken along the line XXXIVb-XXXIVb in FIG. 34A.
Figure 34C:
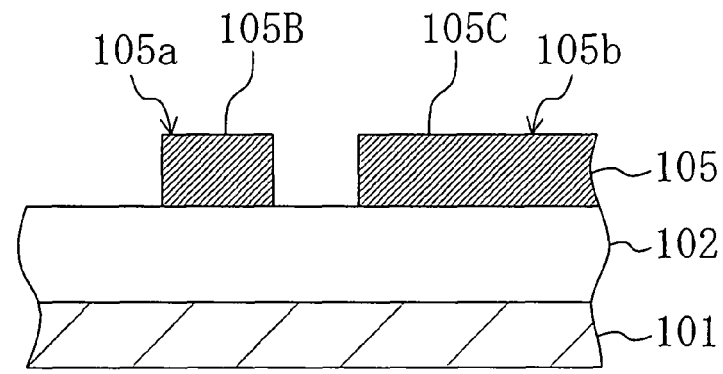
FIG. 34C is a sectional view taken along the line XXXIVc-XXXIVc in FIG. 34A.
Figure 35:
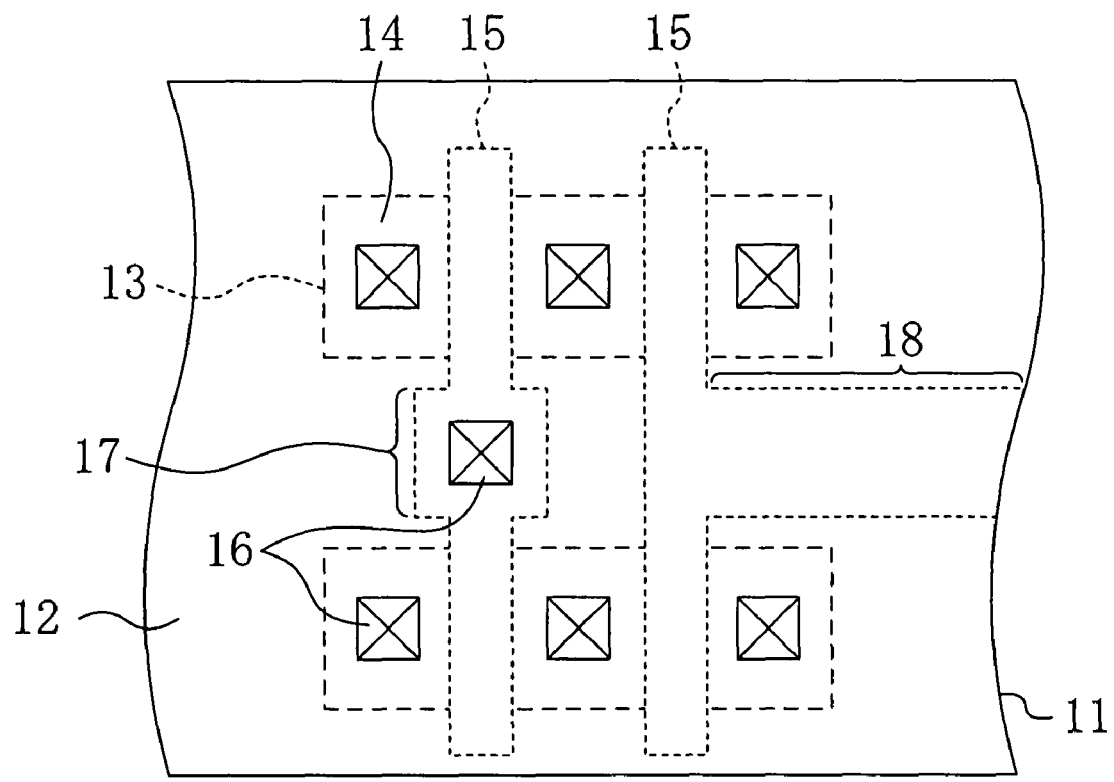
FIG. 35 is a layout diagram of a conventional semiconductor device.
Figure 36A:
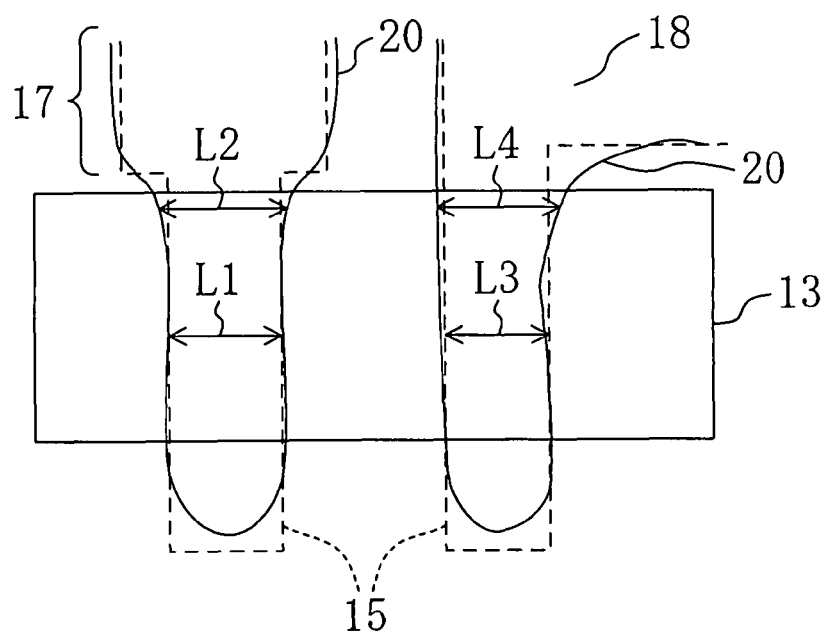
FIG. 36A and FIG. 36B are plan view for explaining a corner rounding phenomenon occurring in the conventional semiconductor device.
Figure 36B:
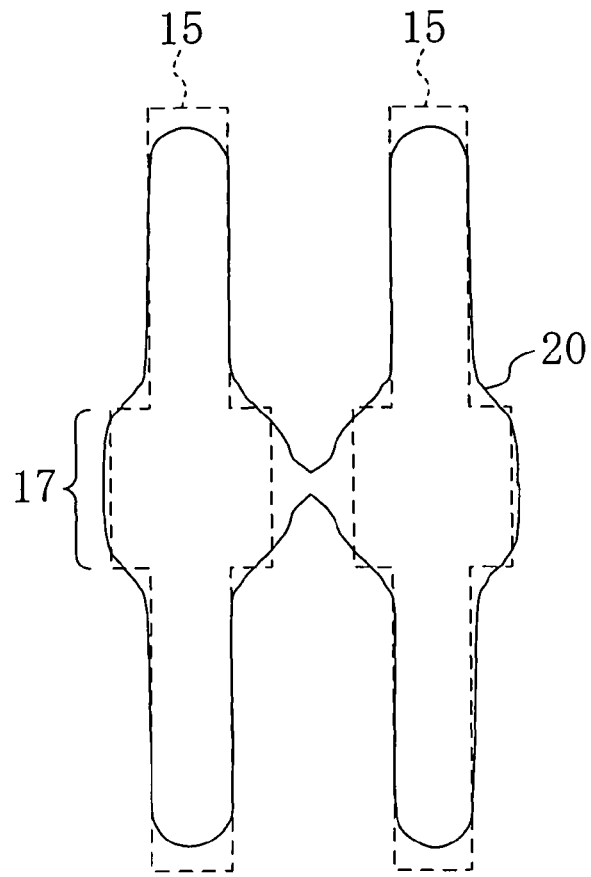

FIG. 30A, FIG. 30B, FIG. 31A to FIG. 31C, FIG. 33A to FIG. 33C, and FIG. 34A to FIG. 34C are views for explaining the semiconductor device manufacturing method in accordance with Embodiment 4 of the present invention. Wherein, FIG. 30A, FIG. 30B, FIG. 31A, FIG. 32A, FIG. 33A, and FIG. 34A are plan views, FIG. 31B, FIG. 31C, FIG. 32B, FIG. 32C, FIG. 33B, FIG. FIG. 34B, and FIG. 34C are sectional views.

Figure 30A:
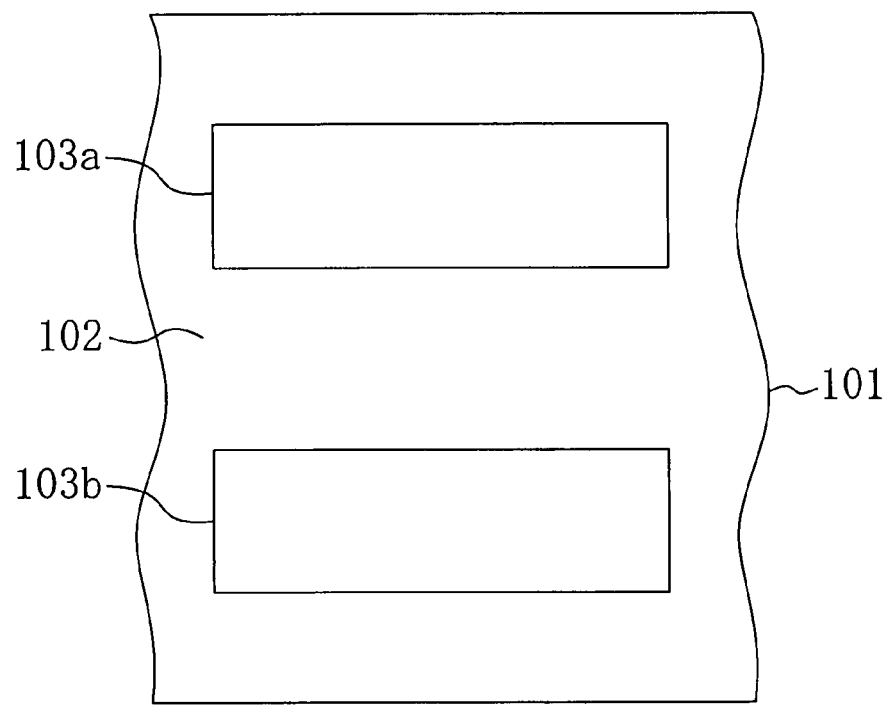
FIG. 30A and FIG. 30B are plan views showing a semiconductor device manufacturing method in accordance with Embodiment 4 of the present invention.

First, as shown in FIG. 30A, the isolation region 102 is selectively formed in the semiconductor substrate 101 made of, for example, silicon by STI (Shallow Trench Isolation) or the like. Then, ion implantation is performed to form the p well (not shown) and the n well (not shown) in the semiconductor substrate 101. This forms the active region 103a including the p well and the active region 103b including the n well which are surrounded by the isolation region 102.

Figure 30B:
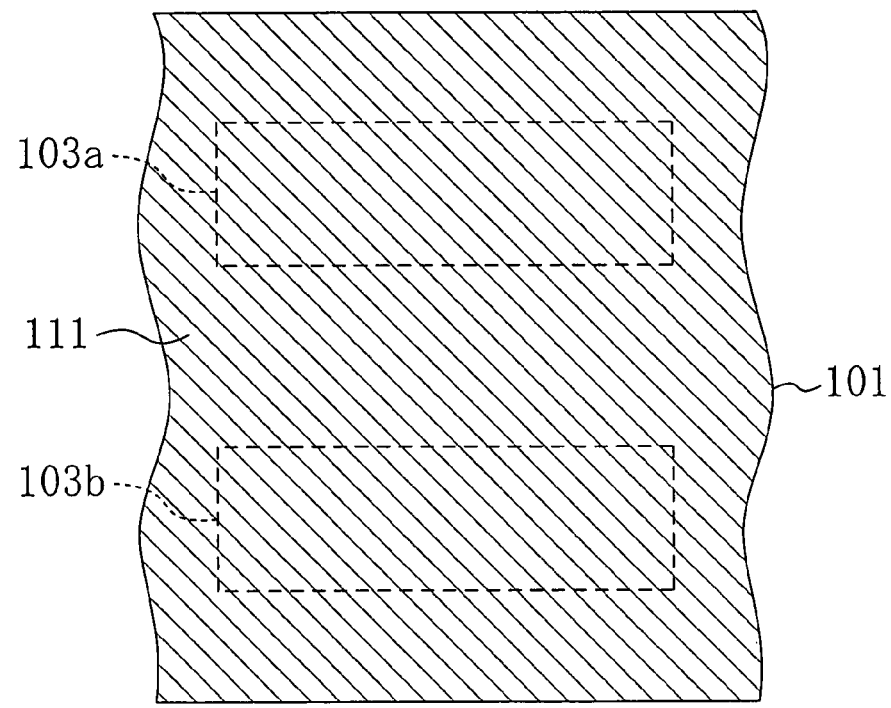

Next, as shown in FIG. 30B, a gate insulting film formation film (not shown) made of, for example, SiON is formed on each active region 103a, 103b, and then, a gate electrode formation film 105A made of, for example, polysilicon and having a film thickness of 150 nm and a mask film 108 formed of, for example, an oxide film and having a film thickness of 50 nm are formed in this order on the isolation region 102 and the gate insulating film formation film by CVD (Chemical Vapor Deposition) or the like. Additionally, an amorphous silicon film 111 (a second mask film) having a film thickness of, for example, 30 nm is deposited on the mask film 108 by CVD or the like. In general, though not shown herein, polysilicon of the gate electrode formation film 105A is subjected to ion implantation and thermal treatment for activation. The mask film 108 may be formed of a film made of any suitable material having selectivity in etching the gate electrode formation film 105A, other than the oxide film, such as a nitride film, an organic film, or the like. As well, the amorphous silicon film 111 may be replaced by a film having selectivity in etching the mask film 108, such as an oxide film, an oxinitride film, an NSG film, or the like.

Figure 31A:
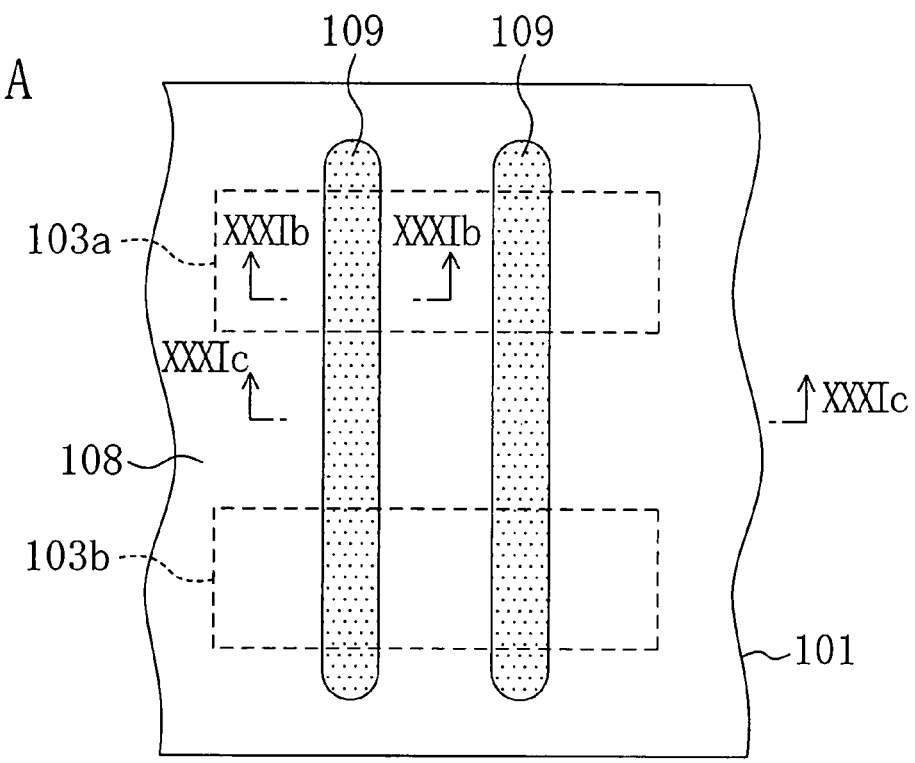
FIG. 31A is a plan view showing the semiconductor device manufacturing method in accordance with Embodiment 4 of the present invention.
Figure 31B:
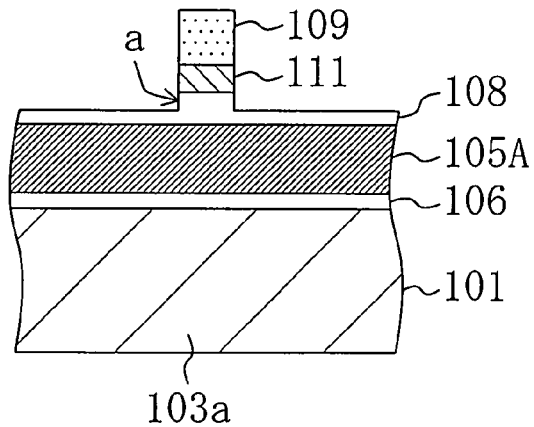
FIG. 31B is a sectional view taken along the line XXXIb-XXXIb in FIG. 31A.
Figure 31C:
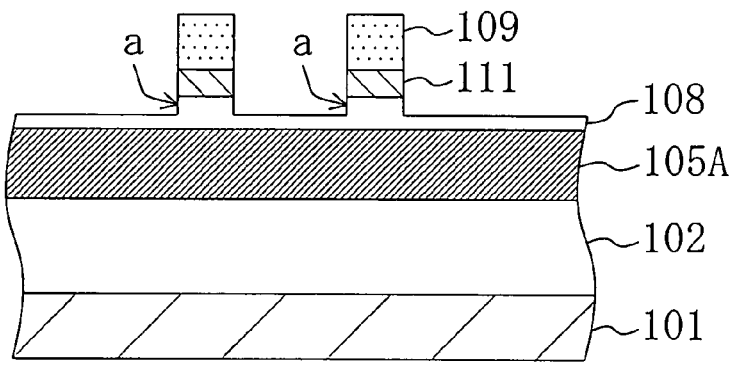
FIG. 31C is a sectional view taken along the line XXXIc-XXXIc in FIG. 31A.

Next, as shown in FIG. 31A, a resist pattern 109 across the active regions 103a, 103b and the isolation region 102 (a part of the isolation region which is located between the active regions 103a and 103b) is formed by photolithography, and then, the amorphous silicon film 111 is etched with the use of the thus formed resist pattern 109 as a mask. In etching in this point, as shown in FIG. 31B (a sectional view taken along the line XXXIb-XXXIb in FIG. 31A) and FIG. 31C (a sectional view taken along the line XXXIc-XXXIc in FIG. 31A), the surface portion of the mask film 108 is slightly etched to form a step part a. Preferably, the pattern for forming the resist pattern 109 has a linear contour. The linear contour causes no corner rounding phenomenon. Of course, the contour is not necessarily linear if variation in dimension involves no influence of the corner rounding phenomenon on the active regions.

Subsequently, as shown in FIG. 32A, following removal of the resist pattern 109, a resist pattern 110 for forming a gate contact region 105a and a wiring region 105b is formed on a part of the gate electrode formation film 105A which is located on the isolation region 102 (a part of the mask film 108 and a part of the amorphous silicon film 111 which are located on the isolation region 102). The resist pattern 110 is formed so as to overlap with a part of the amorphous silicon film 111 so that a combination of the resist pattern 110 and the amorphous silicon film 111 forms a desired gate electrode pattern. In detail, the resist pattern 110 is not formed above the active regions 103a, 103b, as shown in FIG. 32A and FIG. 32B (a sectional view taken along the line XXXIIb-XXXIIb in FIG. 32A), but is formed on the mask film 108 including the step part a and the amorphous silicon film 111 above the isolation region 102, as shown in FIG. 31A and FIG. 32C (a sectional view taken along the line XXXIIc-XXXIIc in FIG. 32A). This permits patterning of the resist pattern 110 without taking into consideration the region where the gate electrodes 105B, 105C on the active regions 103a, 103b are formed, and accordingly, the distance between each edge of the active regions 103a, 103b and each opposed edge of the resist pattern 110 may be 0 or larger, similarly to those in Embodiments 1 to 3. Actually, it can be approximated to a root-mean-square of dimensional variation and alignment variation of the active regions 103a, 103b and the resist pattern 110. The pattern interval of the resist pattern 110 can be set smaller up to the limit of resolution in the photolithography process for forming the resist pattern 110.

In FIG. 32A and FIG. 32C, the resist pattern 110 is patterned so as to expose a part of the amorphous silicon film 111 on a region to be the wiring region 105b, but may be patterned as a resist pattern 110a formed so as to extend beyond the amorphous silicon film 111 on the region to be the wiring region 105b, as shown in FIG. 5.

Thereafter, as shown in FIG. 33A, FIG. 33B (a sectional view taken along the line XXXIIIb-XXXIIIb in FIG. 33A), and FIG. 33C (a sectional view taken along the line XXXIIIc-XXXIIIbc in FIG. 33A), the mask film 108 is etched with the use of the amorphous silicon film 111 and the resist pattern 110 as a mask (a first mask part), and then, the resist pattern 110 is removed. Thus, a mask covering the gate electrode 105B including the gate contact region 105a and the gate electrode 105C including the wiring region 105b is formed of the amorphous silicon film 111 and the mask film 108.

Next, as shown in FIG. 34A to FIG. 34C, the gate electrode formation film 105A is etched with the use of the amorphous silicon film 111 and the mask film 108 as a mask (a second mask part), and then, the amorphous silicon film 111 and the mask film 08 are removed. This forms the gate electrode 105B integrally including the gate contact region 105a and the gate electrode 105C integrally including the wiring region 105b, as shown in FIG. 34A. Specifically, the gate electrodes 105B, 105C are formed across the active regions 103a, 103b with the gate insulating film 106 interposed, as shown in FIG. 34A and FIG. 34B (a sectional view taken along the line XXXIVb-XXXIVb in FIG. 34A), and the gate contact region 105a of the gate electrode 105B and the wiring region 105b of the gate electrodes 105C are formed on the isolation region 102, as shown in FIG. 34A and FIG. 34C (a sectional view taken along the line XXXIVc-XXXIVc in FIG. 34A).

The mask film 108 formed of an oxide film is used as a mask herein. With the use of the mask film 108 formed of an oxide film or a nitride film, impurity generation from a resist material in etching can be suppressed to thus increase dimension controllability.

Subsequently, the sidewall 107 is formed on each side face of each gate electrode 105B, 105C including the gate contact region 105a or the wiring region 105b by a known method, and the n-type source/drain regions 104a and the p-type source/drain regions 104b are formed by a known method, thereby obtaining the semiconductor device shown in FIG. 29A to FIG. 29B. Then, an interlayer insulating film and a contact (not shown) in the gate contact region 105a and the like are formed in general. Specifically, after formation of the gate electrodes 105B, 105C, the n-type source/drain diffusion layer (the n-type extension region or the n-type LDD region) having a shallow junction is formed in each region on each side of each gate electrode 105B; 105C in the active region 103a by implanting an n-type impurity ion to the active region 103a with the use of the gate electrodes 105B, 105C as a mask. As well, the p-type source/drain diffusion layer (the p-type extension region or the p-type LDD region) having a shallow junction is formed in each region on each side of the gate electrodes 105B, 105C in the active region 103b by implanting a p-type impurity ion to the active region 103b with the use of the gate electrodes 105B, 105C as a mask.

Thereafter, CVD or the like is performed for depositing a silicon nitride film on the entirety of the semiconductor substrate 101, and anisotropic etching is performed to form the sidewall 107 on each side face of each gate electrode 105B, 105C. The sidewall 107 may be formed of a layered film of a silicon oxide film and a silicon nitride film, for example. Then, with the use of the sidewall 107 as a mask, implantation of an n-type impurity ion and implantation of a p-type impurity ion are performed on the active region 103a and the active region 103b, respectively. Then, thermal treatment is performed on the semiconductor substrate 101, with a result that the n-type source/drain diffusion layer having a comparatively deep junction is formed in each region on the outer side of each sidewall 107 in the active region 103a while the p-type source/drain diffusion layer having a comparatively deep junction is formed in each region on the outer side of each sidewall 107 in the active region 103b. In this way, the n-type source/drain regions 104a composed of the n-type source/drain diffusion layers having comparatively shallow junctions and the n-type source/drain diffusion layers having comparatively deep junctions are formed in the active region 103a while the p-type source/drain diffusion regions 104b composed of the p-type source/drain diffusion layers having comparatively shallow junctions and the p-type source/drain diffusion layers having comparatively deep junctions are formed in the active region 103b. Then, CVD or the like is performed on the entirety of the semiconductor substrate 101 to form an interlayer insulating film formed of, for example, a silicon oxide film, and a contact plug is formed, for example, in such a manner that tungsten is filled in a contact hole formed by, for example, etching and CMP (Chemical Mechanical Polishing) or the like is performed. Then, formation of metal wirings and the like is performed. It is noted that a step of siliciding each surface of the n-type source/drain regions 104a, the p-type source/drain regions 104b, and the gate electrodes 105B, 105C and/or a step of fully siliciding the gate electrodes 105B, 105C may be performed.

It is also noted that the mask film 108 and the amorphous silicon film 111 may be eliminated at the same time as formation of the gate electrode formation film 150A or may be removed by overetching at the same time as formation of the sidewall 107. Nevertheless, no variation in film thickness of the gate electrodes 105B, 105C on the active regions 103a, 103b is involved also in the present embodiment, thereby achieving stable transistor characteristics. As well, no variation in film thickness of the gate contact region 105a and the wiring region 105b is involved, involving no increase in variation and no influence on the contact resistance and the wiring resistance.

Through the above steps, in the present embodiment, similarly to those in Embodiments 1 to 3, the corner rounding phenomenon is suppressed to allow the gate contact region 105a and the wiring region 105b to be arranged close to the active regions 103a, 103b with variation in transistor characteristics prevented and to allow adjacent gate electrodes to be arranged close to each other with short-circuit of the gate electrodes, which is caused due to increased width of the gate contact region, suppressed. Hence, higher integration is enabled. Particularly in the present embodiment, for forming the gate electrodes 105B, 105C by patterning the gate electrode formation film 105A, only hard masks (the amorphous silicon film 111 and the mask film 108) are used rather than a combination of the resist pattern and the hard mask in Embodiments 1 to 3, which involves no dependency on the pattern rate of the resist pattern. This can allow the gate contact region 105a and the wiring region 105b to be arranged further close to the active regions 103a, 103b and can allow the adjacent gate electrodes 105B, 105C to be arranged further close to each other, enabling higher integration through stable processes. Moreover, the gate electrodes 105B, 105C includes no step part unlike those in Embodiments 1 to 3, thereby preventing disconnection of a silicide layer in forming the silicide layer on the gate electrodes 105B, 105C to contemplate stable process performance.

Though patterning using the resist pattern 110 is performed after patterning using the resist pattern 109 in the present embodiment, patterning using the resist pattern 109 may be performed after patterning using the resist pattern 110, similarly to the method described in Embodiment 2. Alternatively, similarly to the methods described in Embodiment 3 and Modified Example 1 thereof, patterning using the resist patterns 110a and 110b may be performed after patterning using the resist patterns 109a and 109b, or vise versa. Since semiconductor device manufacturing methods including such step parts and the structures of semiconductor devices obtained by such the methods can be inferred easily from the corresponding description in the above embodiments, and therefore, the specific description thereof is omitted.

The gate electrodes 105, 105B, 105C are made of polysilicon in Embodiments 1 to 4 and the modified examples thereof, but may be formed of an amorphous silicon film, a layered film of metal silicide and polysilicon, a silicide film, a metal film, or the like.

The gate insulting film 109 is made of SiON in Embodiments 1 to 4 and the modified examples thereof, but it is obvious that the gate insulating film 109 may be made of any other suitable material, such as $SiO_2$, HfSiON, or the like.

In Embodiments 1 to 4 and the modified examples thereof, the resist pattern for forming the gate electrode 105 or 105B will not increase in dimension in the gate contact region 105a. Accordingly, in the case where gate electrodes including the gate contact region 105a should be arranged close to each other, the pattern interval can be set smaller up to the resolution limit while a sufficient contact area is secured.

The semiconductor device and the manufacturing methods thereof in accordance with the present invention are useful for semiconductor devices including a field effect transistor including a gate electrode with rectangular part and manufacturing methods thereof.

What is claimed is:

1. A semiconductor device comprising:
   an isolation region formed in a semiconductor substrate;
   a first active region surrounded by the isolation region and formed in the semiconductor substrate; and
   a first gate electrode formed on the isolation region and the first active region and including a first region on the isolation region, the first region having a bottom surface with a pattern width larger than a pattern width of the first gate electrode on the first active region, and the first region including a part having a surface level different from a surface level of the first gate electrode on the first active region, and
   the first region including a lower region formed on the isolation region and an upper region formed on the lower region, a pattern width in a gate length direction of the lower region being larger than that of the upper region.

2. The semiconductor device of claim 1, wherein the first region of the first gate electrode is a gate contact region or a wiring region.

3. The semiconductor device of claim 1, wherein the first region of the first gate electrode includes a rectangular part having a rectangular shape in plane in the vicinity of the first active region.

4. The semiconductor device of claim 1, wherein the first region of the first gate electrode includes a part having a surface level lower than the surface level of the first gate electrode on the first active region.

5. The semiconductor device of claim 1, wherein the first region of the first gate electrode includes a part having a surface level higher than the surface level of the first gate electrode on the first active region.

6. The semiconductor device of claim 1, further comprising:
   a second gate electrode formed beside the first gate electrode on the isolation region and the first active region and including a second region on the isolation region, the second region having a pattern width larger than a pattern width of the second gate electrode on the first active region,
   wherein the first gate electrode on the first active region has a surface level different from the second gate electrode on the first active region.

7. The semiconductor device of claim 6, wherein the second region of the second electrode includes, in the vicinity of the first active region, a rectangular part in a rectangular shape in plane.

8. The semiconductor device of claim 6,
   wherein the first region of the first gate electrode includes a part having a surface level lower than the surface level of the first gate electrode on the first active region, and
   the second region of the second gate electrode includes a part having a surface level higher than the surface level of the second gate electrode on the first active region.

9. The semiconductor device of claim 8, wherein the second region of the second electrode includes a rectangular part having a rectangular shape in plane in the vicinity of the first active region.

10. The semiconductor device of claim 1, further comprising:
    a gate insulating film formed between the first gate electrode on the first active region and the first active region; and
    first source/drain regions formed on respective sides of the first gate electrode in the first active region.

11. The semiconductor device of claim 10, further comprising:
    an insulating sidewall formed on each side face of the first gate electrode; and
    second source/drain regions formed on an outer side of the insulating sidewall in the first active region.

12. The semiconductor device of claim 1, wherein the first gate electrode includes a polysilicon film, an amorphous silicon film, a layered film of metal silicide and polysilicon, a silicide film, or a metal film.

13. The semiconductor device of claim 1, further comprising:
    a second active region surrounded by the isolation region and formed of the semiconductor substrate, wherein
    the second active region is arranged in a gate width direction with respect to the first active region with the isolation region interposed therebetween, and
    the first gate electrode is formed across the first and the second active regions in the gate width direction with the isolation region interposed between the first and the second active regions.

14. The semiconductor device of claim 13, wherein a pattern width of the first gate electrode on the second active region is the same as the pattern width of the first gate electrode on the first active region.

15. The semiconductor device of claim 13, wherein the first region of the first gate electrode is formed between the first and second active regions, and on the isolation region.

16. The semiconductor device of claim 13, wherein a surface level of the first gate electrode on the second active region is the same as the surface level of the first gate electrode on the first active region.

17. The semiconductor device of claim 13, wherein
an n-type MIS transistor is formed in the first active region, and
a p-type MIS transistor is formed in the second active region.

18. The semiconductor device of claim 13, wherein
an n-type source/drain region is formed in an upper part of the first active region, and
a p-type source/drain region is formed in an upper part of the second active region.

19. The semiconductor device of claim 18, further comprising:
an insulating sidewall formed on each side face of the first gate electrode, wherein the n-type source/drain region includes:
a first n-type source/drain diffusion layer formed in a region of the first active region under each side of the first gate electrode, and
a second n-type source/drain diffusion layer formed in a region of the first active region on an outer side of the insulating sidewall, and having a deeper junction than the first n-type source/drain diffusion layer; and
the p-type source/drain region includes:
a first p-type source/drain diffusion layer formed in a region of the second active region under each side of the first gate electrode, and
a second p-type source/drain diffusion layer formed in a region of the second active region on outer side of the insulating sidewall, and having a deeper junction than the first p-type source/drain diffusion layer.

20. The semiconductor device of claim 1, wherein a gate insulating film containing hafnium is formed between the first active region and the first gate electrode on the first active region.

* * * * *